(12) United States Patent
Eto et al.

(10) Patent No.: US 6,229,363 B1
(45) Date of Patent: May 8, 2001

(54) SEMICONDUCTOR DEVICE

(75) Inventors: Satoshi Eto; Masato Matsumiya; Masato Takita; Toshikazu Nakamura; Ayako Kitamoto; Kuninori Kawabata; Hideki Kanou; Masatomo Hasegawa; Toru Koga; Yuki Ishii, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/224,354

(22) Filed: Jan. 4, 1999

(30) Foreign Application Priority Data

May 6, 1998 (JP) .................................................. 10-123532

(51) Int. Cl.[7] ...................................................... H03L 7/08
(52) U.S. Cl. ............................................ 327/158; 327/163
(58) Field of Search .............................. 327/72, 144–159, 327/161–163, 292; 375/373–376

(56) References Cited

U.S. PATENT DOCUMENTS

| | | | |
|---|---|---|---|
| 5,675,274 | * 10/1997 | Kobayashi et al. | 327/158 |
| 5,936,912 | * 8/1999 | Kawabata et al. | 365/233 |
| 5,939,913 | * 8/1999 | Tomita | 327/159 |
| 5,969,551 | * 10/1999 | Fujioka | 327/156 |
| 5,969,552 | * 10/1999 | Lee et al. | 327/158 |
| 6,049,239 | * 4/2000 | Eto et al. | 327/158 |

* cited by examiner

Primary Examiner—My-Trang Nu Ton
(74) Attorney, Agent, or Firm—Arent Fox Kintner Plotkin & Kahn, PLLC

(57) ABSTRACT

A semiconductor device having the function of generating an internal clock signal delayed by a predetermined phase by adjusting the phase of an external clock signal, includes a first clock phase circuit for roughly adjusting the phase of the external clock signal; and a second clock phase adjusting circuit for controlling the phase of the internal clock signal with higher accuracy than the first clock phase adjusting circuit. The semiconductor device having such a construction executes phase comparisons by the first and second clock phase adjusting circuits independently of each other, and when a phase control operation by the second clock phase adjusting circuit is made subordinate to that of the first clock phase adjusting circuit, the delay time of each of a plurality of delay elements inside the first clock phase adjusting circuit is set to a value larger than a power source jitter resulting from a noise of a power source and a jitter of the external clock signal.

66 Claims, 32 Drawing Sheets

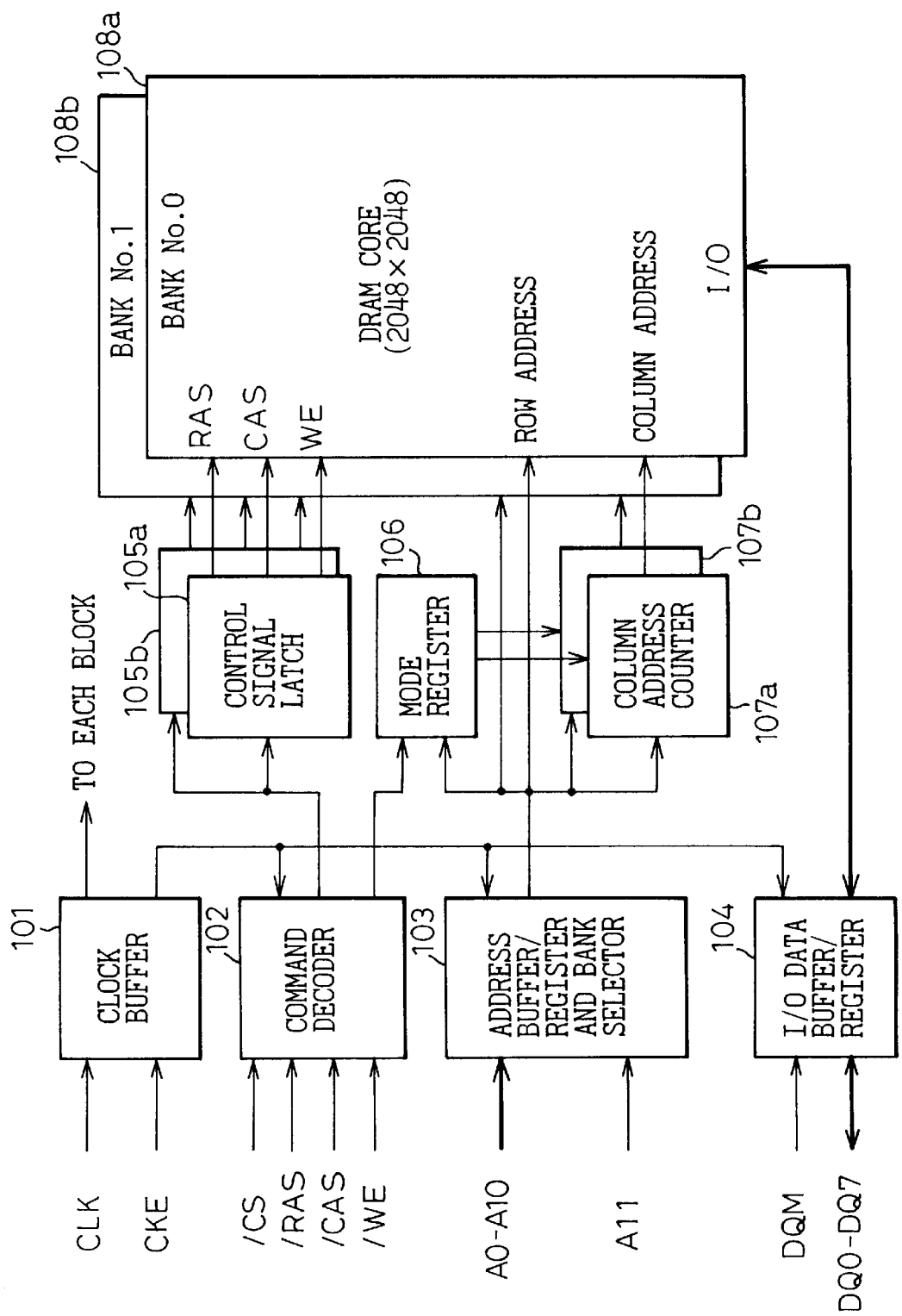

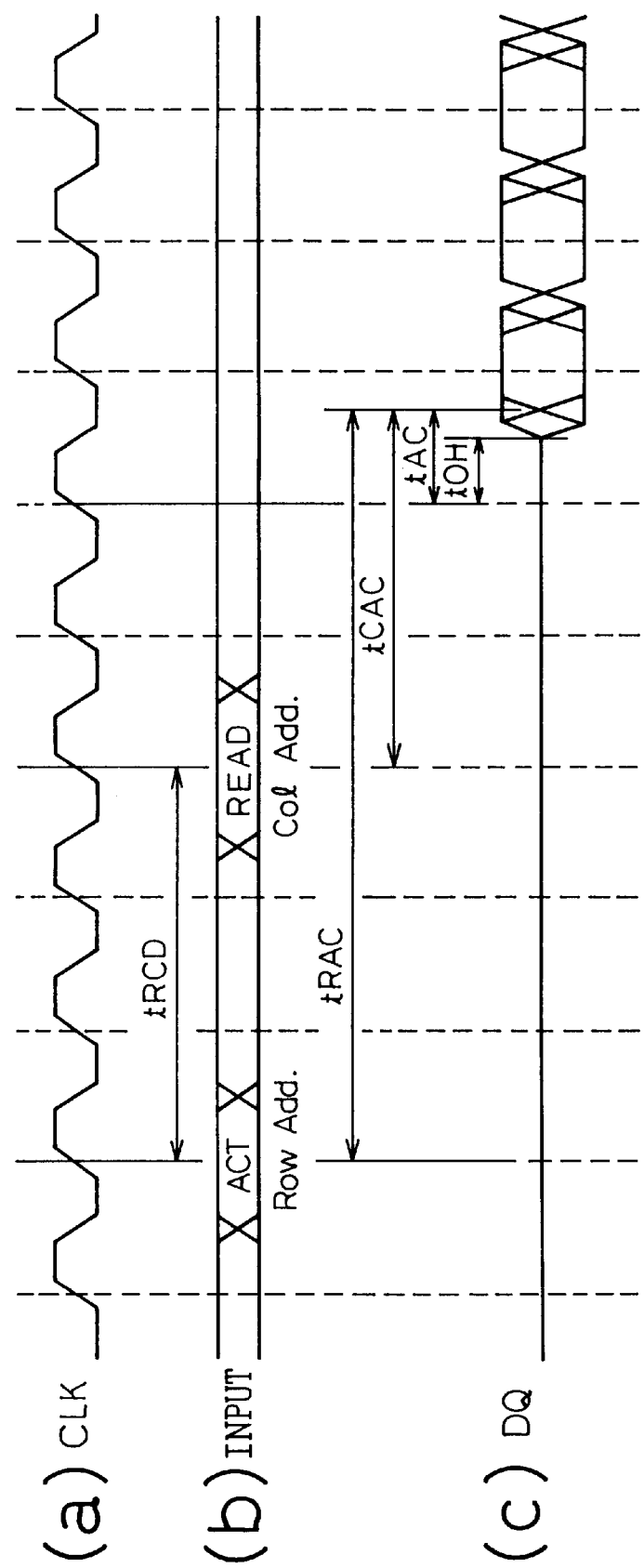

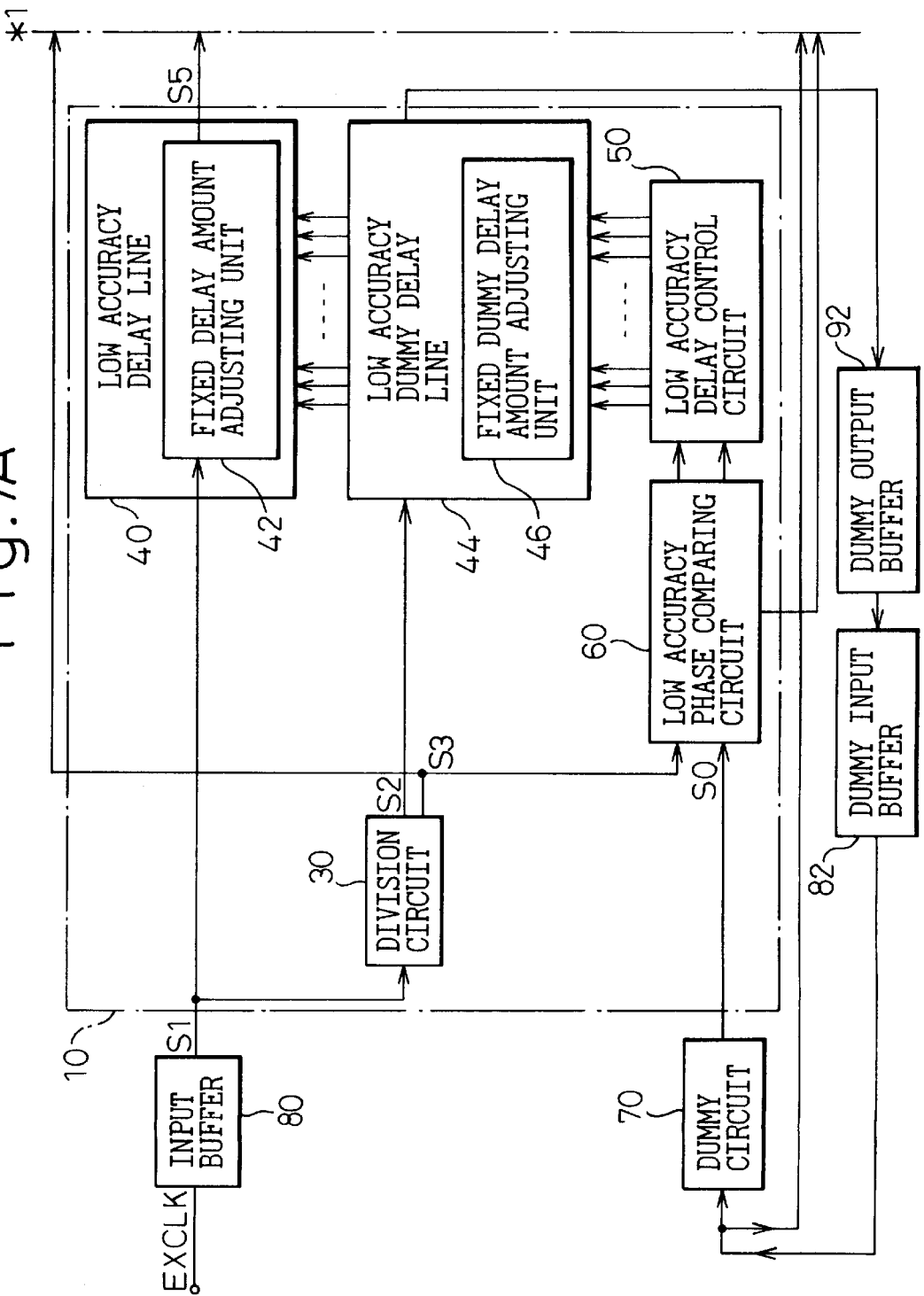

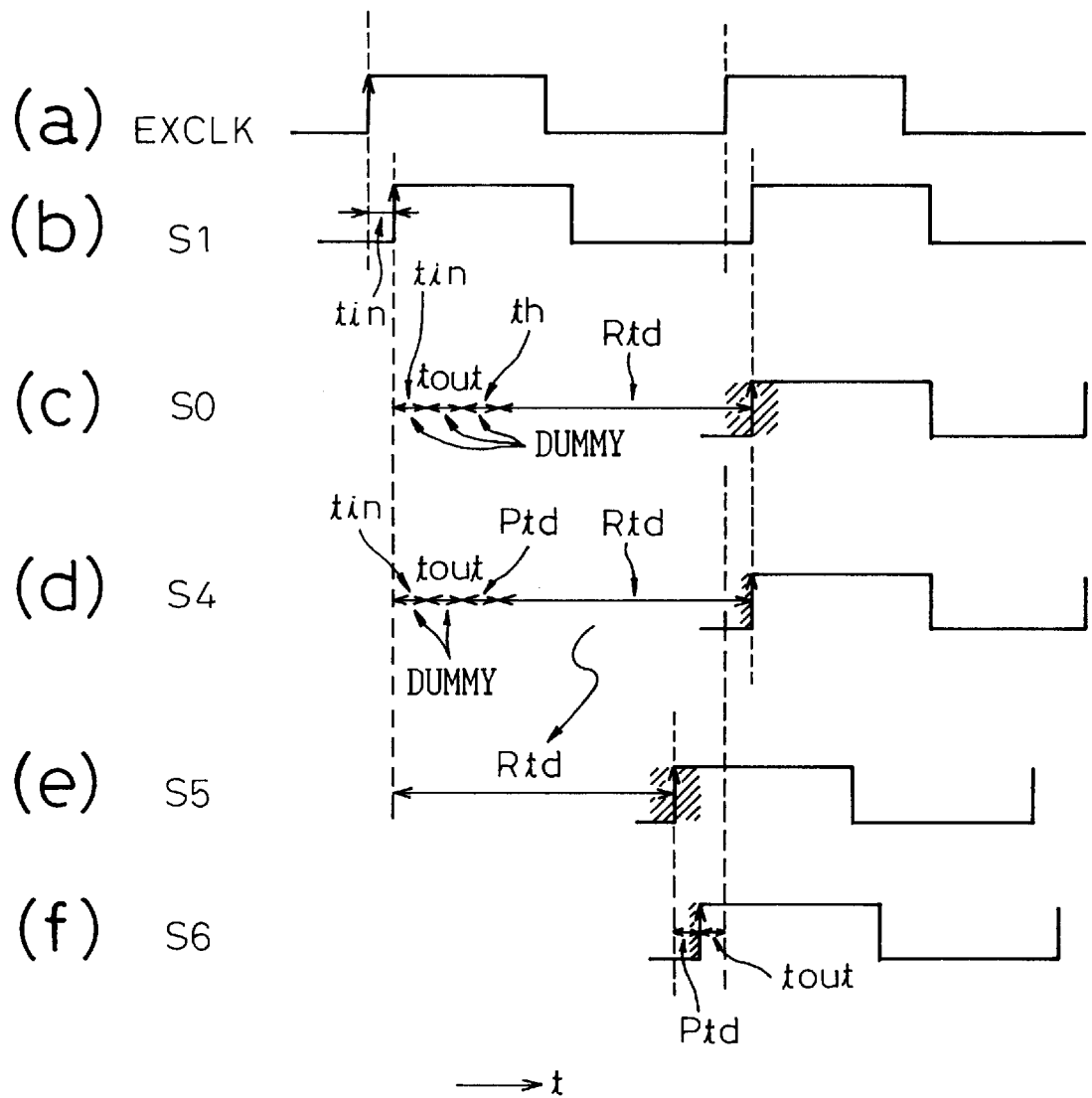

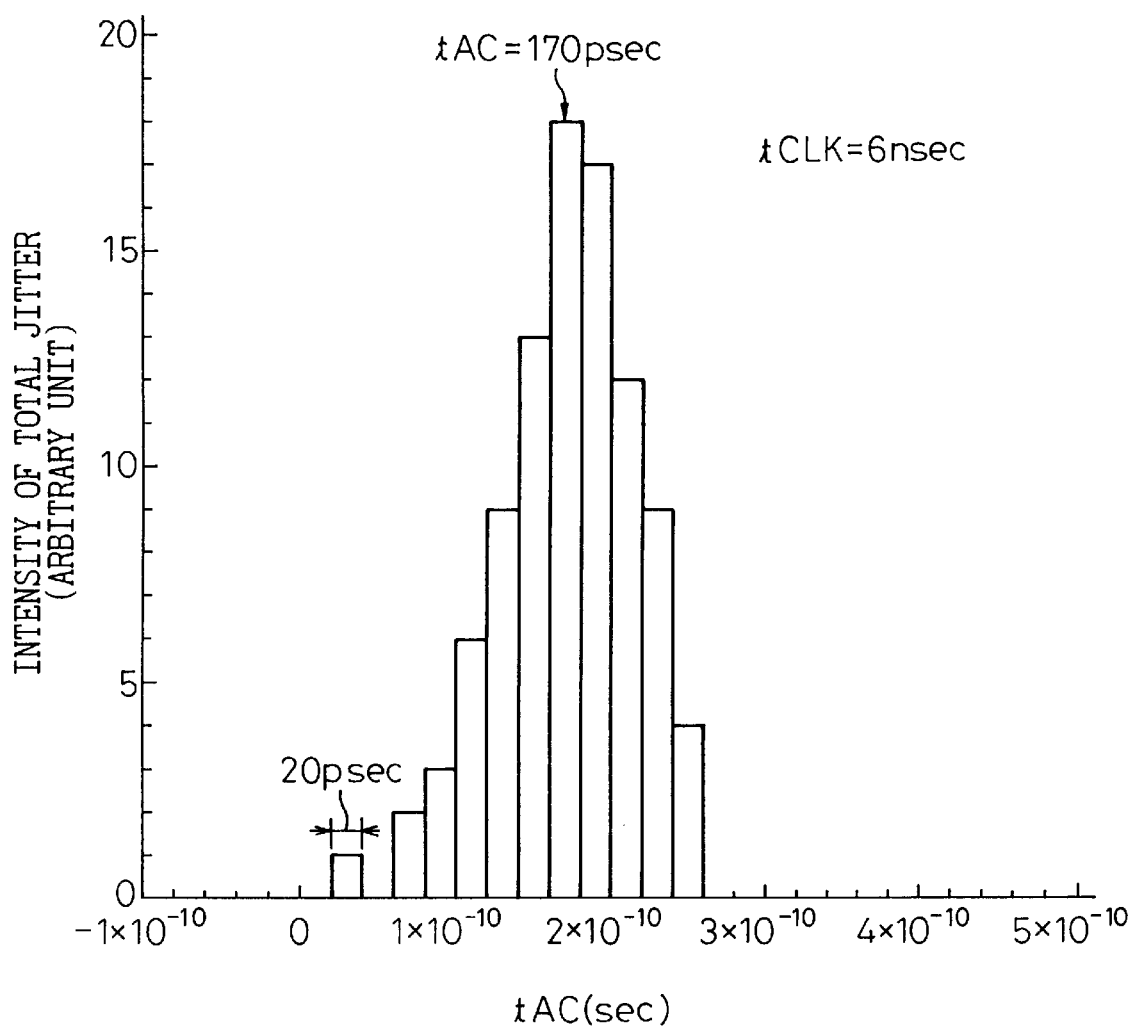

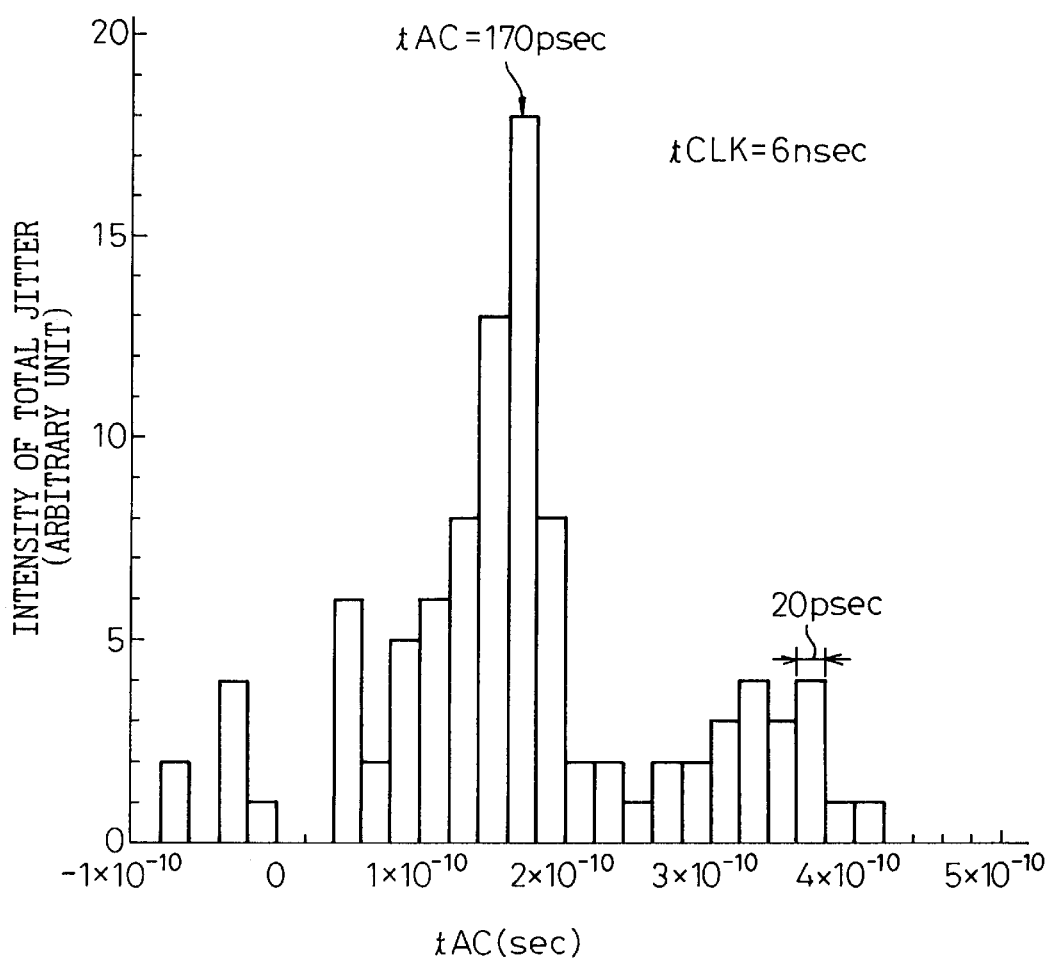

TO HIGH ACCURACY DELAY
CONTROL CIRCUIT 35

SEMICONDUCTOR DEVICE

BACKGROUND OF THE INVENTION

1. Field of the Invention

This invention relates to a semiconductor device equipped with a clock phase adjusting circuit, such as a DLL (Delay Locked Loop) circuit, for generating an internal clock signal delayed by a predetermined phase, by adjusting the phase of an external clock signal supplied from outside. More particularly, this invention relates to a semiconductor device having the function of assuredly storing data in a predetermined correct phase with respect to an external clock signal, and outputting the data irrespective of variance of device characteristics and changes of an ambient temperature, a power source voltage, etc., by generating an internal clock signal delayed by a predetermined cycle, such as one cycle, from the external clock signal and synchronizing the phase of the data inputted to a dynamic random access memory (hereinafter called the "DRAM"), etc., with the phase of the internal clock signal.

2. Description of the Related Art

To begin with, a construction of a semiconductor device equipped with the clock phase adjusting circuit according to the prior art, and its operation, will be explained with reference to FIGS. 1 to 3 that will be mentioned later in "BRIEF DESCRIPTION OF THE DRAWINGS" in order to make the problems, which are encountered when clock phase adjustment is carried out by conventional techniques, more easily understood.

Recent CPUs (Central Processing Units) operate in synchronism with a high-speed external clock signal of 100 MHz or more than 100 MHz. In other words, the ability of the CPUs for processing data has become extremely high. In contrast, the operation speed of general-purpose DRAMs is so low that these DRAMs have difficulty in inputting and outputting the data required by the CPUS. To cope with this situation, various novel DRAMs, such as synchronous DRAMs (generally abbreviated to the "SDRAMs") which are operating in synchronism with a high-speed external clock signal of 100 MHz or more than 100 MHz, and which are capable of inputting and outputting the data required by the CPUs, have been proposed.

When the data input/output operation is executed, however, a data indeterminate period occurs due to a change of an ambient temperature, a fluctuation of a power source voltage, and so forth. Therefore, a data determinate period (data window) is the value obtained by subtracting the data indeterminate period from tCLK (time corresponding to one cycle of the external clock signal). In this case, as the external clock signal becomes more high-speed, tCLK becomes shorter and the setting of the timing of the data input/output operation becomes more difficult. Conversely, an increase of the data indeterminate period resulting from the changes of the ambient temperature and the power source voltage must be minimized, in order to execute without error the data input/output operation under a relatively high-speed external clock signal.

To minimize the increase of such a data indeterminate period, a clock phase adjusting circuit, such as a DLL, capable of securing a data window having a sufficiently wide period even with a relatively high-speed external clock signal, becomes effective.

In FIG. 1, a block circuit diagram showing the construction of a semiconductor device having an ordinary clock phase adjusting circuit, is illustrated. The clock phase adjusting circuit in the semiconductor device shown in FIG. 1, such as a digital DLL circuit 100, includes a delay circuit 450 comprising a plurality of delay lines 400 and dummy delay lines 440 for generating an internal clock signal INCLK delayed by a predetermined phase, by changing a delay time (i.e., delay amount) of an external clock signal EXCLK inputted from the outside through an input buffer 800; a phase comparing circuit 660 for comparing the phase of the signals obtained by dividing a frequency of the external clock signal EXCLK with the phase of the signal inputted from the dummy delay line 440 through a dummy output buffer 990 and a dummy input buffer 880; and a delay control circuit 550 for selecting the delay time of the delay line 400 and the dummy delay line 440, on the basis of a phase comparison result by this phase comparing circuit 660.

The explanation will be given in further detail. The external clock signal EXCLK is amplified to a predetermined level by the input buffer 800 and after the frequency of the amplified external clock signal is divided by a division circuit 300, this clock signal is supplied to the delay circuit 450 and is also supplied as a first input signal to the phase comparing circuit 660.

In this case, the dummy input buffer 880 is disposed in order to compensate for the phase delay of the external clock signal CLK due to the input buffer 800 on the input side of the phase comparing circuit 660. Further, the dummy output buffer 990 is disposed so as to compensate for the phase delay of the internal clock signal due to the output buffer 900 which outputs the data DATA in synchronism with the internal clock signal INCLK generated by the delay line 400. Therefore, the external clock signal EXCLK inputted to the dummy delay line 440 through the division circuit 300 is supplied as the second input signal to the phase comparing circuit 660, through the dummy output buffer 990 and the dummy input buffer 880.

This phase comparing circuit 660 compares the phase of the first input signal with that of the second input signal, and inputs a result of the phase comparison of these two input signals to the delay control circuit 550. This delay control circuit 550 selects and adjusts the delay time of the delay line 400 and the dummy delay line 440 so that the phase difference between the external clock signal EXCLK and the internal clock signal INCLK attains predetermined cycle or cycles (i.e., at least one clock cycle), such as one cycle (360 degrees). As a result, the external clock signal EXCLK inputted to the delay line 400 is provided with the delay time adjusted by the delay control circuit 550 and is then supplied to the output buffer 900. This output buffer 900 outputs the data DATA to the outside of the semiconductor device in synchronism with the internal clock signal INCLK supplied from the delay line 400 (DOUT).

When an operation frequency of the SDRAM is relatively low, the digital DLL circuit having the ordinary construction described above can fully exert the function of adjusting the phase of the external clock signal. In other words, the digital DLL circuit generates the internal output clock signal INCLK whose phase is in synchronism with the external clock signal on the basis of this external clock signal EXCLK, eliminates an influence of the delay resulting from wiring for transmitting the clock signal, etc., inside the SDRAM and can output the data outside the SDRAM in synchronism with the external input clock signal. However, the digital DLL circuit mounted to an DRAM having a high operation speed of 100 MHz or more than 100 MHz must be able to execute the delay control with extremely high accuracy.

The digital DLL circuit includes a delay line formed by connecting, in series with each other, a plurality of unit delay elements each comprising the combination of a plurality of logic gates such as NAND gates and inverters. Generally, the delay time (i.e., delay amount) of the unit delay element is about 200 psec ($200 \times 10^{-12}$ sec) at minimum. To cope with a relatively high operation speed exceeding 100 MHz, however, a high accuracy digital DLL circuit capable of controlling the delay time of not larger than 200 psec becomes necessary. The accuracy of the delay time control can be improved, in principle, by using a unit delay device having the delay time of not larger than 200 psec. However, in order to secure the delay time of a certain accuracy only by using the unit delay elements having the delay time of not larger than 200 psec, a large number of unit delay devices are necessary, and the circuit construction for constituting the semiconductor device becomes large in the circuit scale thereof. From the aspect of the practical application, therefore, a digital DLL circuit having a relatively high accuracy must be accomplished without increasing the circuit scale of the semiconductor device.

Therefore, it has been customary in the prior art to dispose a digital DLL circuit for fine control, having a delay line for higher accuracy adjustment of the delay time (that is, a high accuracy adjustment delay line), in addition to a digital DLL circuit for rough control (see FIG. 1), having a delay line for rough adjustment of the delay time (that is, low accuracy adjustment delay line), and to provide these two kinds of DLL circuits with a hierarchical structure. In the digital DLL circuits having such a hierarchical structure, the hierarchical control of the phase of the internal clock signal is smoothly executed by changing smoothly the delay time at the time of digit shift operation (e.g., carry operation) of the delay lines into a higher digit position or lower digit position.

However, in the semiconductor device including the digital DLL circuits having the hierarchical structure that is proposed to cope with an operation speed exceeding 100 MHz, influences of jitter of the internal clock signal, resulting from jitter of the external clock signal and from the fluctuation of the internal power source voltage, can never be neglected.

Among the jitters of this internal clock signal, the jitter resulting from the quantization error of the DLL circuits is referred to as the "DLL jitter". Assuming herein the case in which the delay time of one stage of the low accuracy adjustment delay line for rough control (that is, unit delay time of unit delay element of low accuracy adjustment delay line) is trd and the delay time of one stage of high accuracy adjustment delay line of fine control (that is, unit delay time of the unit delay element of high accuracy delay adjustment line) is tfd which is smaller than trd (such as 1/10 trd), the quantization error of the DLL circuit for rough control corresponds to the unit delay time of the unit delay element of the high accuracy adjustment delay line.

On the other hand, the jitter resulting from a noise of the power source (i.e., power supply), the external clock signal, etc., is referred to as the "power source jitter". The influences of this power source jitter on the operation of the DLL circuits cannot be neglected in SDRAMs having an operation speed exceeding 100 MHz. Next, the problems encountered when the clock phase adjustment is executed by the digital DLL circuits having the hierarchical structure in the case in which the power source jitter described above has occurred will be explained with reference to FIGS. 2 and 3.

In FIG. 2, the case in which the clock phase adjustment is executed by conventional techniques when the power source jitter exists within the range of ±trd, is illustrated. On the other hand, in FIG. 3, the case in which the clock phase adjustment is executed by conventional techniques when the power source jitter deviates from the range of ±trd.

In the semiconductor device having the digital DLL circuits having the hierarchical structure, the phase comparing circuit inside the rough control DLL circuit judges whether the DLL circuit for rough control operates or the DLL circuit for fine control operates, and the reference for carrying out such a judgement depends on whether or not the phase of the internal clock signal exists within the range of ±trd with respect to the phase of the reference clock, such as the external clock signal (condition 1).

More particularly, when the delay line executes digit shift operation during the operation of the DLL circuit for fine control, the phase difference detected by the phase comparing circuit inside the DLL circuit for rough control is larger than the range of ±trd, but the operation of the DLL circuit for fine control is maintained as the whole system (condition 2).

However, when the phase difference detected by the phase comparing circuit inside the DLL circuit for rough control is larger than the range of ±trd continuously twice as a result of sampling operation, the operation of the DLL circuit for rough control is executed as the whole system (condition 3).

First, in the case in which the clock phase adjustment is carried out when the power source jitter exists within the range of ±trd, in FIG. 2, a jitter histogram of the power source is shown like a normal distribution on the left side. The abscissa represents the time (or the phase) and the ordinate represents the frequency, and the diagram represents a probability of the shift of the phase of the internal clock signal at a certain time (where the peak of the histogram represents the center time of the phase transition of the internal clock signal). In this case, the DLL circuit for rough control controls the internal clock signal with respect to the reference clock so that the internal clock signal falls within the range of ±trd (that is, 2trd). Therefore, even when the internal clock signal deviates from the range of ±trd at a certain sampling time (T=0), it falls within the range of ±trd, inclusive of the power source jitter, at the next sampling time. Therefore, the operation of the DLL circuit for fine control is executed always after a lock-on of the DLL circuit is carried out because the state represented by the condition 3 described above is never established. Here, the total jitter inclusive of the power source jitter and the DLL jitter is the sum of the power source jitter and tfd (power source jitter+tfd) as represented by the right-hand jitter histogram in FIG. 2.

Next, let's consider the case in which the clock phase adjustment is executed when the power source jitter does not fall within the range of ±trd. In this case, the total jitter inclusive of the power source jitter does not fall within the range of ±trd even at the next sampling time, as shown in the left-hand jitter histogram in FIG. 3. Therefore, there is the case from time to time in which the operation of the DLL circuit for rough control cannot shift to the operation of the DLL circuit for fine control (for example, at portions larger than ±trd). In this case, the DLL circuit for rough control operates at the further next sampling time so as to adjust the phase of the internal clock signal. However, because the total jitter exceeds the range of ±trd even at this sampling time (the portion encircled by a white circle ○), there occurs the case in which the operation of the DLL circuit for rough control once shifts to the operation of the DLL circuit for fine control and again shifts to the operation of the DLL circuit for rough control. In other words, this case corresponds to the condition 3 described above. Therefore, the operation of the DLL circuit for rough control can occur with a certain probability even after a lock-on of the DLL circuit is carried out. Here, the total jitter inclusive of the power source jitter and the DLL jitter is the sum of the power source jitter and trd (power source jitter+trd), as shown in the right-hand jitter histogram in FIG. 3. Further, the gap between one peak and another peak in this histogram corresponds to trd.

As described above, in the conventional digital DLL circuits having the hierarchical structure that are proposed to cope with the operation speed exceeding 100 MHz, the total jitter inclusive of the power source jitter sometimes exceeds the range of ±trd that is set only on the basis of the DLL jitter. Therefore, a possibility of the transition from the operation of the DLL circuit for fine control to the operation of the DLL circuit for rough control occurs even after a lock-on of the DLL circuits is carried out, and a stability of the overall operation of the above two kinds of DLL circuits is not sufficiently ensured.

SUMMARY OF THE INVENTION

In view of the problems described above, the object of the present invention is to provide a semiconductor device which is capable of ensuring the stable operation of a clock phase adjusting circuit, such as DLL circuits, etc., without being affected by a power source jitter even when the power source jitter is generated due to a noise of a power source (i.e., power supply), an external clock signal, and so forth.

A semiconductor device according to the present invention for solving the problems described above comprises a first clock phase adjusting circuit for adjusting the phase of an external clock signal and generating an internal clock signal delayed by a predetermined phase with respect to the external clock signal; and a second clock phase adjusting circuit for controlling the phase of the internal clock signal with higher accuracy than the first clock phase adjusting circuit. In the semiconductor device having such a construction, the first clock phase adjusting circuit includes a plurality of delay elements and a delay time (i.e., delay amount) generated by each of the plurality of delay elements in the first clock phase adjusting circuit can be set to a value larger than a predetermined value.

Preferably, in the semiconductor device according to the present invention, the first clock phase adjusting circuit includes delay amount adjusting means for setting the delay time generated by each of the plurality of delay elements in the first clock phase adjusting circuit to a value larger than a value of the jitter of the internal clock signal which is generated by at least one of a noise of a power source and the jitter of the external clock signal.

Preferably, in the semiconductor device according to the present invention, each of the plurality of delay elements in the first clock phase adjusting circuit includes at least one logic gate, and a CR delay circuit having a resistor and a capacitor is connected to a node on the output side of the logic gate so that the delay time generated by each of the plurality of delay elements can be set to a value larger than a predetermined value.

Preferably, further, in the semiconductor device according to the present invention, each of the plurality of delay elements in the first clock phase adjusting circuit includes at least one logic gate, and a capacitance load having a predetermined capacitance value is connected to a node on the output side of the logic gate so that the delay time generated by each of the plurality of delay elements can be adjusted to a value larger than a predetermined value.

Preferably, further, in the semiconductor device according to the present invention, each of the plurality of delay elements in the first clock phase adjusting circuit includes at least one logic gate, and the delay time generated by each of the plurality of delay elements is adjusted to a value larger than a predetermined value by increasing a channel length of the logic gate.

Preferably, further, in the semiconductor device according to the present invention, the delay time generated by each of the plurality of delay elements is adjusted to a value larger than a predetermined value by increasing the number of stages of the plurality of delay elements in the first clock phase adjusting circuit.

Preferably, further, in the semiconductor device according to the present invention, each of the plurality of delay elements in the first clock phase adjusting circuit includes at least one logic gate, the delay amount adjusting means in the first clock phase adjusting circuit includes a CR delay circuit having a resistor and a capacitor, and this CR delay circuit is connected to a node on the output side of the logic gate so that the delay time generated by each of the plurality of delay elements is adjusted to a value larger than the value of the jitter of the internal clock signal.

Preferably, further, in the semiconductor device according to the present invention, each of the plurality of delay elements in the first clock phase adjusting circuit includes at least one logic gate, the delay amount adjusting means in the first clock phase adjusting circuit has a capacitance load having a predetermined capacitance value, and this capacitance load is connected to a node on the output side of the logic gate so that the delay time generated by each of a plurality of delay elements is adjusted to a value larger than the value of the jitter of the internal clock signal.

Preferably, further, in the semiconductor device according to the present invention, the second clock phase adjusting circuit receives a reset signal from the first clock phase adjusting circuit and is reset when the first clock phase adjusting circuit controls the delay time, and when the phase of the external clock signal, which is the object of a phase comparison in the first clock phase adjusting circuit, conforms with the phase of the internal clock signal, the second clock phase adjusting circuit can control the delay time.

Preferably, further, in the semiconductor device according to the present invention, each of the first and second clock phase adjusting circuits includes a first route through which the external clock signal passes and a second route for executing the phase comparison with this first route, and this second route includes a dummy circuit portion having the same delay time as the delay time generated when the second clock phase adjusting circuit is reset.

Preferably, further, in the semiconductor device according to the present invention, when an accuracy determined by the delay time of each of the plurality of delay elements in the first clock phase adjusting circuit is td, the second clock phase adjusting circuit can control the delay time within the range of ±trd, and when a result of the phase comparison by the first clock phase adjusting circuit deviates from the range of ±td, the first clock phase adjusting circuit supplies the reset signal to the second clock phase adjusting circuit and set the delay time of the second clock phase adjusting circuit to a predetermined value.

Preferably, further, in the semiconductor device according to the present invention, each of the first and second clock phase adjusting circuits includes a first route through which the external clock signal passes and a second route for executing the phase comparison with the first route, and the second route includes a dummy circuit having the same delay time as the delay time generated when the second clock phase adjusting circuit is reset.

Preferably, further, in the semiconductor device according to the present invention, the second clock phase adjusting circuit includes a delay line comprising a plurality of delay elements described above, and a predetermined value set by the plurality of delay elements in the second clock phase adjusting circuit corresponds to the center of the range of the delay time that can be controlled by the delay line.

Preferably, further, in the semiconductor device according to the present invention, the second clock phase adjusting circuit includes first and second delay elements each having delay time mutually different, the second delay element has a larger delay time than the first delay element, and the difference of the delay time between the first delay element and the second delay element is used as an accuracy of the second clock phase adjusting circuit.

Preferably, further, in the semiconductor device according to the present invention, the first clock phase adjusting circuit executes the phase comparison between the signal obtained by delaying the first signal obtained from the external clock signal by the third delay element and the second clock signal obtained from the internal clock signal, executes further the phase comparison between the first clock signal and the signal obtained by delaying the second clock signal by the fourth delay element, and outputs a result of the phase comparison between the external clock signal and the internal clock signal.

Preferably, further, in the semiconductor device according to the present invention, the first clock phase adjusting circuit includes first and second flip-flops, the first flip-flop inputs the signal obtained by delaying the first clock signal by the third delay element, and the second clock signal, to a set terminal and to a reset terminal, respectively, the second flip-flop inputs the signal obtained by delaying the second clock signal by the fourth delay element, and the first clock signal, to a set terminal and to a reset terminal, respectively, and a result of the phase comparison between the external clock signal and the internal clock signal is outputted by the combination of the first and second flip-flops.

Preferably, further, in the semiconductor device according to the present invention, each of the first and second flip-flops includes first and second NAND gates, the first input of the first NAND gate is the set terminal, the second input of the first NAND gate is connected to the output of the second NAND gate and becomes a non-inversion output, the first input of the second NAND gate is the reset terminal, and the second input of the second NAND gate is connected to the output of the first NAND gate and becomes an inversion output.

Preferably, further, in the semiconductor device according to the present invention, each of the first and second flip-flops includes first and second NAND gates, the second input of the first NAND gate is the set terminal, the first input of the first NAND gate is connected to the output of the second NAND gate and becomes a non-inversion output, the second input of the second NAND gate is the reset terminal, and the first input of the second NAND gate is connected to the output of the first NAND gate and becomes an inversion output.

Preferably, further, in the semiconductor device according to the present invention, the second clock phase adjusting circuit includes third and fourth flip-flops, fifth and sixth delay elements are interposed between the third and fourth flip-flops, the third flip-flop inputs the first clock signal obtained from the external clock signal, and the second clock signal obtained from the internal clock signal, to the set terminal and to the reset terminal, respectively, the fourth flip-flop inputs the signal obtained by delaying the second clock signal by the sixth delay element, and the signal obtained by delaying the first clock signal by the fifth delay element, to the set terminal and to the reset terminal, respectively, and a result of the phase comparison between the external clock signal and the internal clock signal is outputted by the combination of the third and fourth flip-flops.

Preferably, further, in the semiconductor device according to the present invention, the fifth delay element comprises a third NAND gate and a first inverter, the sixth delay element comprises a fourth NAND gate and a second inverter, a fifth NAND gate is interposed between the fifth and sixth delay elements, and the output of the second inverter in the sixth delay element is connected to the input of the third NAND gate inside the fifth delay element, through the fifth NAND gate.

On the other hand, in the present invention, a DLL circuit is disclosed which receives an external clock for providing an internal clock synchronized with the external clock, and which comprises a plurality of first delay elements, each having a first delay time and being provided with a power supply, connected in series for delaying the external clock; a plurality of second delay elements, each having a second delay time smaller than the first delay time connected in series with said plurality of first delay elements, for ouputting the internal clock; and a control circuit receiving the external clock for selecting the number of the first delay elements and the number of the second delay elements, wherein the first delay time is smaller than a change in a delay time in the DLL circuit caused by a fluctuation of a potential of the power supply.

According to the present invention, the delay time of one stage of a plurality of delay elements can be set to a value larger than a value of the jitter of the internal clock signal resulting from the noise of the power source and the jitter of the external clock signal, by connecting the CR delay device or the capacitance load to the node on the output side of the logic gates constituting a plurality of delay elements contained in the DLL circuit for rough adjustment of the delay time, etc., or by increasing the channel length of the logic gates. Therefore, a stable operation of the semiconductor device having the DLL circuits, etc., having a hierarchical structure can be ensured without being affected by the jitter of the internal clock signal.

BRIEF DESCRIPTION OF THE DRAWINGS

The above object and features of the present invention will be more apparent from the following description of the preferred embodiments with reference to the accompanying drawings, wherein:

FIG. 5 is a block diagram showing a schematic construction of a synchronous DRAM to which the semiconductor device of the present invention is applied;

FIG. 6 is a timing chart useful for explaining the operation of the synchronous DRAM shown in FIG. 5;

FIGS. 7A and 7B are block circuit diagrams each showing a construction of a preferred embodiment of the present invention;

FIG. 8 is a timing chart useful for explaining the schematic operation of the embodiment shown in FIGS. 7A and 7B;

FIG. 9 is a jitter histogram showing the result of simulation conducted on the premise that the power source jitter exists within the range of ±trd;

FIG. 10 is a jitter histogram showing the result of simulation conducted on the premise that the power source jitter does not exist within the range of ±trd;

DESCRIPTION OF THE PREFERRED EMBODIMENTS

Next, a basic embodiment and preferred embodiments of the present invention will be explained with reference to the accompanying drawings (FIGS. 4 to 32).

Figure 4:
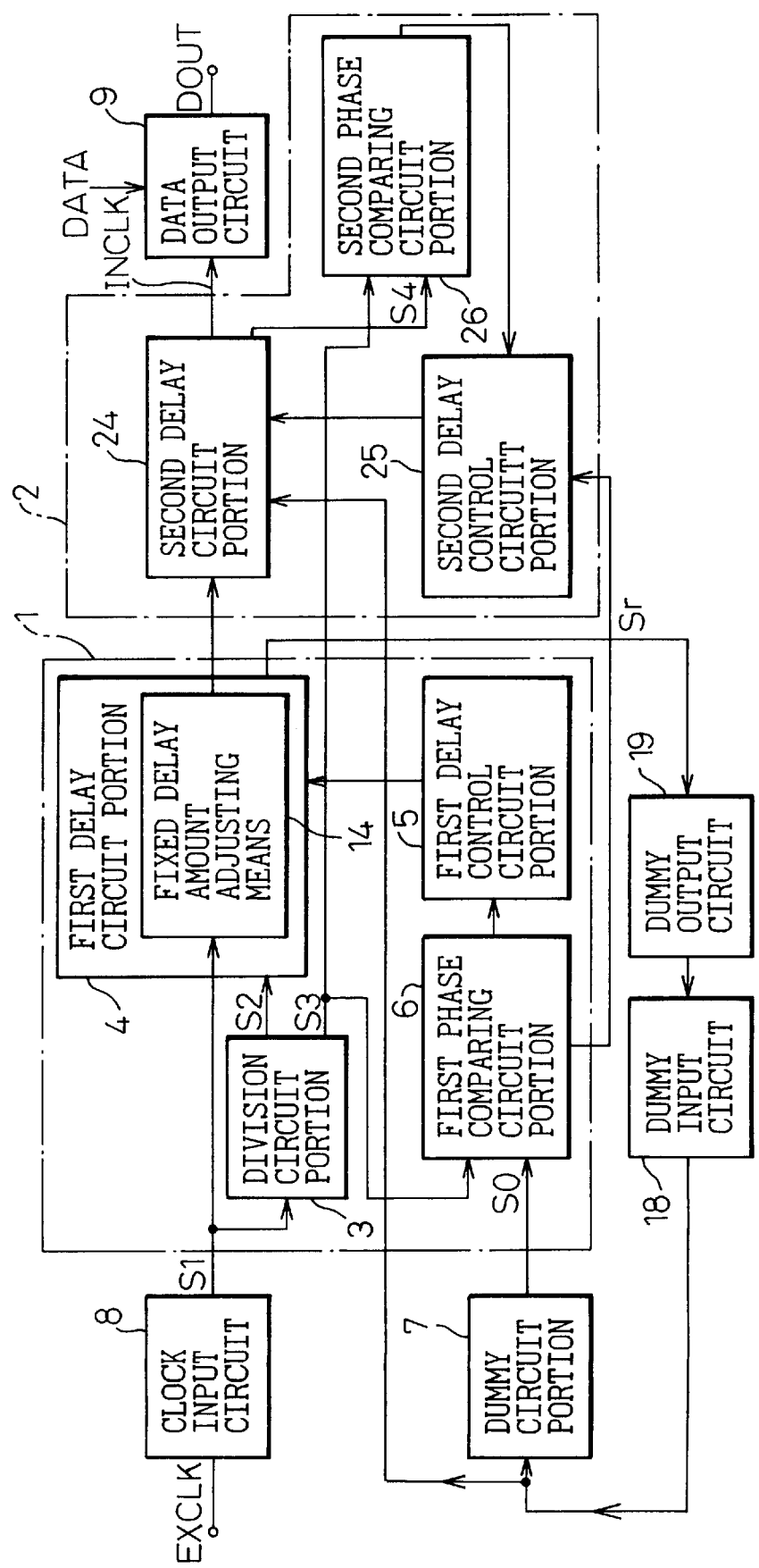
FIG. 4 is a block diagram showing a construction of a basic embodiment based on the principle of the present invention.

FIG. 4 is a block diagram showing the construction of the basic embodiment based on the principle of the present invention. The drawing shows in a simplified form the construction of a semiconductor device having two clock phase adjusting circuits.

As shown in FIG. 4, the semiconductor device according to the basic embodiment of the present invention includes a first clock phase adjusting circuit 1 for adjusting the phase of an external clock signal EXCLK and generating an internal clock signal INCLK having the phase delayed by a predetermined phase from the external clock signal; and a second clock phase adjusting circuit 2 for controlling the phase of the internal clock signal with higher accuracy than the first clock phase adjusting circuit 1.

In the semiconductor device according to the basic embodiment of the present invention shown in FIG. 4, phase comparisons between the external clock signal and the internal clock signal in the first and second clock phase adjusting circuits 1 and 2 are carried out mutually independently, and the phase control operation of the internal clock signal of the second clock phase adjusting circuit 2 is made subordinate to the operation of the first clock phase comparing circuit 1 so as to provide a delay time (i.e., delay amount) by a plurality of delay devices in the first and second clock phase adjusting circuits 1 and 2, so that the internal clock signal having a predetermined phase relationship with the external clock signal can be outputted, and the delay time generated by each of a plurality of delay elements in the first clock phase adjusting circuit is larger than a predetermined value (for example, a jitter value of the internal clock signal).

Preferably, the first clock phase adjusting circuit 1 shown in FIG. 4 is accomplished by a DLL circuit, or the like, for rough control, and the second clock phase adjusting circuit 2 is accomplished by a DLL circuit, or the like, for fine control.

Here, the first clock phase adjusting circuit 1 comprises a first delay circuit portion 4 which is capable of selecting the delay time of the external clock signal EXCLK (or a signal S1), delaying the external clock signal by the delay time thus selected, and outputting the same as an input signal (a clock signal by rough control) to the second clock phase adjusting circuit 2; a first phase comparing circuit 6 for comparing the phase of the signal S3, which is obtained by dividing a frequency of the external clock signal, with the phase of the signal S0 inputted from the first delay circuit portion 4, through a dummy output circuit 19, a dummy input circuit 18 and a dummy circuit portion 7; and a first delay control circuit portion 5 for selecting the delay time of the first delay circuit portion 4 on the basis of a result of the phase comparison by the first phase comparing circuit portion 6.

On the other hand, the second clock phase adjusting circuit 2 comprises a second delay circuit portion 24 which is capable of selecting the delay time of the clock signal of rough control supplied from the first clock phase adjusting circuit 1, delaying this clock signal by the delay time thus selected, and outputting the same as an internal clock signal INCLK by fine control; a second phase comparing circuit 26 for comparing the phase of the signal S3, which is obtained by dividing the frequency of the second delay circuit portion 24, with the phase of the signal S4 outputted from the second delay circuit portion 24; and a second delay control circuit portion 25 for selecting the delay time of the second delay circuit portion on the basis of a result of the phase comparison by the second phase comparing circuit portion 6. Further, a data output circuit 9 having substantially the same function as that of the conventional output buffer 900 (see FIG. 1) is provided on the output side of the second clock phase adjusting circuit 2. This data output circuit 9 outputs data DATA (DOUT) in synchronism with the internal lock signal generated by the second delay circuit portion 24.

In FIG. 4, further, the external clock signal EXCLK is amplified by a clock input circuit 8 having substantially the same function as the conventional input buffer 800 (see FIG. 30) to a predetermined level, and after a frequency of the external clock signal is divided by a division circuit portion 3 having substantially the same function as the conventional frequency division circuit 300, this external clock signal EXCLK is supplied as the signal S2 to the first delay circuit portion 4 and as the signal S3 to the first phase comparing circuit portion 6.

Referring now to FIG. 4, further, a dummy input circuit 18 is disposed on the input side of the first phase comparing circuit portion 3 in order to compensate for the phase delay of the external clock signal EXCLK. Similarly, a dummy output circuit portion 19 is disposed to compensate for the phase delay of the internal clock signal INCLK due to the data output circuit 9. Further, a dummy circuit portion 7 is disposed on the input side of the first phase comparing circuit portion 3 to compensate for the phase delay of the external clock signal due to the second delay circuit portion 24. Therefore, the signal S1 inputted to the first delay circuit portion 4 is supplied as the signal S0 to the first phase comparing circuit portion 3, through the dummy output circuit portion 19, the dummy input circuit 18 and the dummy circuit portion 7 as described already.

Preferably, further, in the semiconductor device according to the basic embodiment of the present invention, the first clock phase adjusting circuit 1 includes fixed delay amount adjusting means 14 for setting the delay time generated by each of a plurality of delay elements in the first clock phase adjusting circuit 1 to a value larger than a value of the jitter generated by either one or both of the noise of the power source and the jitter of the external clock signal. This fixed delay amount adjusting means 14 is disposed typically in the first delay circuit portion 4.

Preferably, further, in the semiconductor device according to the basic embodiment of the present invention, each of a plurality delay elements constituting the first delay circuit portion 4 in the first clock phase adjusting circuit 1 includes at least one logic gate, the fixed delay amount adjusting means 14 has a CR delay circuit comprising a resistor and a capacitor, and this CR delay circuit is connected to the node of the logic gate on the output side so that the delay time generated by each of these delay devices is adjusted to a value larger than a predetermined value.

Preferably, further, in the semiconductor device according to the basic embodiment of the present invention, each of a plurality of delay elements constituting the first delay circuit portion 4 in the first clock phase adjusting circuit 1 includes at least one logic gate, the fixed delay amount adjusting means 14 has a capacitance load having a predetermined capacitance value, and this capacitance load is connected to the node of the logic gate on the output side so that the delay time generated by each of the delay elements can be set to a value larger than a predetermined value.

Preferably, further, in the semiconductor device according to the basic embodiment of the present invention, each of a plurality of delay elements constituting the first delay circuit portion 4 in the first clock phase adjusting circuit 1 includes at least one logic gate, and a channel length of the logic gate is elongated so that the delay time generated by each of these delay devices can be adjusted to a value larger than a predetermined value.

Preferably, further, in the semiconductor device according to the basic embodiment of the present invention, the number of stages of a plurality of delay devices inside the first clock phase adjusting circuit 1 is increased so that the delay time generated by each of these delay elements can be adjusted to a value larger than a predetermined value.

Preferably, further, in the semiconductor device according to the basic embodiment of the present invention, the second clock phase adjusting circuit 2 receives a reset signal Sr from the first clock phase adjusting circuit 1 and is reset when the first clock phase adjusting circuit 1 controls the delay time. The second clock phase adjusting circuit 2 can control the delay time when the phase of the external clock signal EXCLK, which is the object of the phase comparison by the first clock phase adjusting circuit 1, conforms with the phase of the internal clock signal INCLK.

Preferably, further, in the semiconductor device according to the basic embodiment of the present invention, each of the first and second clock phase adjusting circuits 1 and 2 includes a first route through which the external clock signal EXCLK passes and a second route for conducting the phase comparison with the first route, and the second route includes a dummy circuit portion 8 having the same delay time as the delay time when the second clock phase adjusting circuit 2 is reset.

Preferably, further, in the semiconductor device according to the basic embodiment of the present invention, the second clock phase adjusting circuit 2 can control the delay time within the range of ±td when accuracy determined by the delay time of each of a plurality of delay elements in the first clock phase adjusting circuit 1 is td, and when a result of the phase comparison by the first clock phase adjusting circuit 1 deviates from this range ±td, the first clock phase adjusting circuit 1 supplies the reset signal Sr to the second clock phase adjusting circuit 2 so as to set the delay time of the second clock phase adjusting circuit 2 to a predetermined value.

Preferably, further, in the semiconductor device according to the basic embodiment of the present invention, the second clock phase adjusting circuit 2 has a delay line comprising a plurality of delay elements described above, and the predetermined value set by these delay elements in the second clock phase adjusting circuit 2 corresponds to the center of the range that can be controlled by the delay line.

Preferably, further, in the semiconductor device according to the basic embodiment of the present invention, the second clock phase adjusting circuit 2 has first and second delay elements each having the delay time mutually different, the second delay element has a larger delay time than that of the first delay device, and the difference of the delay time between the first delay element and the second delay element is used as an accuracy of the second clock phase adjusting circuit 2.

Preferably, further, in the semiconductor device according to the basic embodiment of the present invention, the first clock phase adjusting circuit 1 conducts the phase comparison between the signal, which is obtained by delaying the first clock signal obtained from the external clock signal EXCLK by the third delay element, and the second clock signal obtained from the internal clock signal INCLK, further conducts the phase comparison between the signals obtained by delaying the first and second clock signals by the fourth delay element, and outputs a result of the phase comparison between the external clock signal and the internal clock signal.

Preferably, further, in the semiconductor device according to the basic embodiment of the present invention, the first clock phase adjusting circuit 1 includes first and second flip-flops. The first flip-flop inputs the signal delayed by the third delay element and the second clock signal to the set terminal and to the reset terminal, respectively, and the second flip-flop inputs the signal delayed by the fourth delay element, and the first clock signal, to the set terminal and to the reset terminal, respectively, so that the phase comparison result between the external clock signal EXCLK and the internal clock signal INCLK can be outputted by the combination of the first and second flip-flops.

Preferably, further, in the semiconductor device according to the basic embodiment of the present invention, each of the first and second flip-flops includes first and second NAND gates, the first input of the first NAND gate is the set terminal, the second input of the first NAND gate is connected to the output of the second NAND gate and functions as a non-inversion output, the first input of the second NAND gate is the reset terminal, and the second input of the second NAND gate is connected to the output of the first NAND gate and functions as an inversion output.

Preferably, further, in the semiconductor device according to the basic embodiment of the present invention, each of the first and second flip-flops includes the first and second NAND gates, the second input of the first NAND gate is the set terminal, the first input of the first NAND gate is connected to the output of the second NAND gate and functions as the non-inversion output, and the second input of the second NAND gate is the reset terminal, and the first input of the second NAND gate is connected to the output of the first NAND gate and functions as the inversion output.

Preferably, further, in the semiconductor device according to the basic embodiment of the present invention, the second clock phase adjusting circuit includes the third and fourth flip-flops and the fifth and sixth delay elements that are interposed between the third and fourth flip-flops. The third flip-flop inputs the first clock signal obtained from the external clock signal, and the second clock signal obtained from the internal clock signal, to the set terminal and to the reset terminal, respectively, and the fourth flip-flop inputs the signal obtained by delaying the second clock signal by the sixth delay element, and the signal obtained by delaying the first clock signal by the fifth delay element, to the set terminal and to the reset terminal, respectively, so that a result of the phase comparison between the external clock signal and the internal clock signal can be outputted by the combination of the third and fourth flip-flops.

Preferably, further, in the semiconductor device according to the basic embodiment of the present invention, the fifth delay element comprises the third NAND gate and the first inverter, the sixth delay element comprises the fourth NAND gate and the second inverter, the fifth NAND gate is disposed between the fifth and sixth delay elements, and the output of the second inverter inside the sixth delay element is connected to the input of the third NAND gate in the fifth delay element through the fifth NAND gate.

According to the basic embodiment of the present invention, the delay time of one stage of a plurality of delay elements can be set to a value larger than a value of the jitter of the internal clock signal resulting from the noise of the power source or the jitter of the external clock signal, by connecting the CR delay element or the capacitance load to the node on the output side of the logic gates constituting a plurality of delay elements contained in the DLL circuit, etc., for rough adjustment of the delay time. For this reason, a stable operation of the semiconductor device having the DLL circuits of the hierarchical structure can be ensured without being affected by the jitter of the internal clock signal.

Next, the construction of an SDRAM (synchronous DRAM) and the operation thereof, to which the embodiments of the present invention are applied, will be first explained with reference to FIGS. 5 and 6 in order to make the constructions and features of the preferred embodiments of the present invention more easily understood (FIGS. 7 to 32).

FIG. 5 is a block diagram showing the schematic construction of the SDRAM to which the semiconductor device of the present invention is applied, and FIG. 6 is a timing chart useful for explaining the operation of the SDRAM shown in FIG. 5.

A semiconductor chip comprising the SDRAM shown in FIG. 5 comprises 2,048 bits×2,048 bits DRAM cores 108a and 108b having a plurality of banks (for example, banks No. 0 and No. 1) for constituting the memory area inside the chip; control signal latches 105a and 105b for latching various control signals (a row address control signal RAS, a column address signal CAS and a write enable signal WE) to be supplied to these DRAM cores 108a and 108b; a mode register 106 for stipulating the operation mode of the SDRAM; and column address counters 107a and 107b for counting the column address and making access to data.

Further, the semiconductor chip shown in FIG. 5 includes a clock buffer 101 for latching the clock signal (that is, the external clock signal) as the reference for operating the synchronous DRAM on the basis of the clock enable signal CKE, and supplying this signal to other circuit portions; a command decoder 102 for decoding various command signals (a chip select signal /CS, a load address strobe signal /RAS, a column address strobe signal /CAS and a write enable signal /WE) and supplying these signals to the control signal latches 105a and 105b and to the mode register 106; an address buffer/register and bank selector 103 for latching memory address signals A0 to A10 including the row address and the column address and a bank address signal A11, and supplying these signals to the mode register 106, the column address counters 107a and 107b and the DRAM cores 108a and 108b; and an I/O data buffer/register 104 for latching various data DQ (DQ0 to DQ7 and DQM) and supplying the data to the I/O portion of the DRAM cores.

In FIG. 5, further, the command signals such as the chip select signal /CS, the row address strobe signal /RAS, the column address strobe signal /CAS, the write enable signal /WE, etc., input various commands depending on their combination and decide the operation mode. These various commands are decoded by the command decoder 102 and control each unit in the chip in accordance with the operation mode. On the other hand, the chip select signal /CS, the row address strobe signal /RAS, the column address strobe signal /CAS and the write enable signal /WE are inputted also to the control signal latches 105a and 105b, and the state of the present command signal is latched until the next command is inputted.

In FIG. 5, further, the memory address signals A0 to A10 and the bank address signal A11 are amplified by the address buffer/register and bank selector 103, are then used as the load address for each bank and are used as the initial values of the column address counters 107a and 107b. The signals read out from the DRAM cores 108a and 108b are amplified by the I/O data buffer/register 104 and are outputted in synchronism with the leading edge of the external clock signal CLK inputted from outside. The same operation is effected for the data input, too, and the data inputted to the I/O data buffer/register 104 is written into the DRAM cores 108a and 108b.

In the timing chart shown in FIG. 6, various control signals are inputted to the DRAM core (shown in portion (b) of FIG. 6) in synchronism with the leading edge of the external clock signal CLK of the portion (a) of FIG. 6, and the data inside this DRAM core is read out. In this case, the row address of the memory matrix inside the DRAM core is first selected, and after the passage of a predetermined delay time (corresponding to row address access time tRCD that will be described later), the column address is selected and the data read operation is started.

The explanation will be given in more detail. When the data is read out from the SDRAM, the active (ACT) command is inputted to the command terminal from the combination of various command signals described above, and the row address signal is inputted to the address terminal. When such command and row address are inputted, the SDRAM becomes active, and selects the word line corresponding to the row address. After the cell information on the selected word line is outputted to the bit line, it is amplified by the sense amplifier. On the other hand, after the passage of the operation time (row address access time tRCD) of the portion associated with the access of the row address, the read command (RAD) and the column address are inputted. After the data of the selected sense amplifier is outputted to the data bus line in accordance with this column address, it is amplified by the data bus amplifier and is further amplified by the output buffer, so that the data DQ is outputted to the output terminal (shown in portion (c) of FIG. 6).

A series of these processes are exactly the same as those in a versatile DRAM. In the case of the SDRAM, however, the circuits associated with the column address are arranged so as to conduct a pipeline operation, and the read data which is read out is continuously outputted in each cycle. Consequently, the cycle for data transfer is equal to the cycle of the external clock signal CLK.

Access time in SDRAM includes three types of access time, and each of the same is defined with the leading edge of the external clock signal CLK as the reference. In FIG. 6, tRAC represents a row address access time representing the operational time of the portion associated with the access of the row address, tCAC represents a column address access time representing the operational time of the portion associated with the access of the row address, and tAC represents a clock access time representing the time delay from the external clock signal CLK until the data output. When the SDRAM described above is used in a high-speed memory system, tRAC and tCAC representing the time from the input of the command until the acquisition of the first data are of course important, but in order to improve the data transfer rate, the clock access time tAC is important, as well.

Referring to FIG. 6, further, tOH represents an output data holding time necessary for holding output data for the previous cycle or the next cycle. Due to variance in the characteristics of the SDRAM, temperature dependence and power voltage dependence, tAC and tOH do not coincide with each other and there is inevitably a certain time between tAC and tOH. During a period corresponding to this time, the data which is to be outputted from the output terminal remains indeterminate. The time in which the data is indeterminate, that is, the data indeterminate time, represents a period of time in which it is not possible to know which data is outputted, and in which the memory system cannot be used.

The data indeterminate time tends to change, depending on variance in the SDRAM characteristics and on the changes of the temperature and the power source voltage. In order to output the data at the correct timing without error in such a case, too, the data must be outputted always with a predetermined phase with respect to the external clock signal. In other words, the clock access time tAC must be always constant. When the data output is desired to be made synchronous with the leading edge of the internal clock signal, typically, it is necessary to set the delay time of the delay circuit portion (see FIG. 4) of the clock phase adjusting circuit (see FIG. 4) so that the phase difference between the external clock signal CLK and the internal clock signal can be kept in a predetermined cycle, for example, 360 degrees.

Figure 7B:
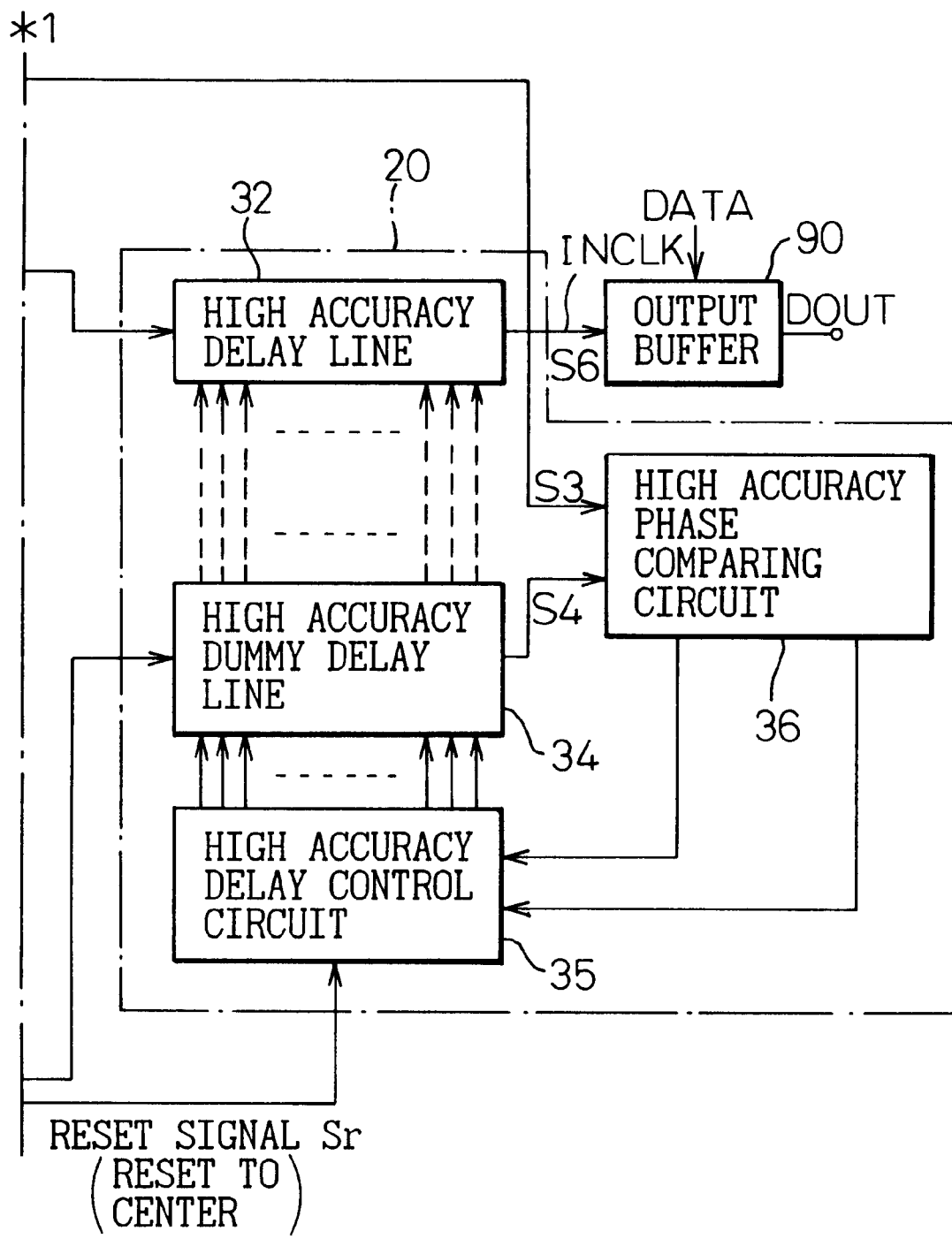

FIGS. 7A and 7B are block circuit diagrams Nos. 1 and 2 showing the construction of the preferred embodiment of the present invention. FIG. 8 is a timing chart useful for explaining the schematic operation of the embodiment shown in FIGS. 7A and 7B. Hereinafter, like reference numerals will be used to identify like constituent elements that have been already explained.

The semiconductor device according to the embodiment shown in FIGS. 7A and 7B includes a first DLL circuit 10 (see FIG. 7A) as the first clock phase adjusting circuit (see FIG. 4) of the present invention for roughly adjusting the delay time (phase) of the external clock signal EXCLK supplied from outside and generating a clock signal having a predetermined phase relationship with the external clock signal. Further, the semiconductor device includes a second DLL circuit 20 (see FIG. 7B) as the second clock phase adjusting circuit 2 (see FIG. 4) of the present invention for adjusting highly finely the delay time (phase) of the clock signal supplied from the first DLL circuit 10 and generating an internal clock signal INCLK having the phase which is correctly delayed by a predetermined phase cycle. In other words, the second DLL circuit 20 is disposed on the output side of the first DLL circuit 10 and has a higher accuracy than the first DLL circuit 10. Generally, the first DLL circuit 10 is called a "rough control DLL circuit" while the second DLL circuit is called a "fine control DLL circuit".

Here, the external clock signal EXCLK inputted from outside through the input buffer 80 shown in FIG. 7A is delayed by the first DLL circuit 10 and the signal (S5) outputted from this first DLL circuit 10 is further delayed with higher accuracy by the second DLL circuit 20 shown in FIG. 7B in order to generate an output clock signal (signal S6 having a predetermined phase relationship with the external clock signal, that is, the internal clock signal INCLK). In FIG. 7B, further, the internal clock signal from the second DLL circuit 20 is supplied to an output buffer 90 connected to a data bus, etc., through wiring for transmitting a clock signal. This output buffer 90 temporarily stores the data DATA on the data bus in synchronism with the internal clock signal from the second DLL circuit 20 and then outputs the data to the outside of the semiconductor device. In this case, the input buffer 80 disposed on the input side of the first DLL circuit 10 shown in FIG. 7A has substantially the same function as the conventional output buffer 900 (see FIG. 1).

Further, the semiconductor device shown in FIG. 7A includes a dummy input buffer 82, a dummy output buffer 92 and a dummy circuit 70. In this case, the dummy input buffer 82 is disposed so as to compensate for the phase delay of the external clock signal EXCLK due to the input buffer 80, and has the same delay time as the delay in the output buffer 90 (see FIG. 7B). Further, the dummy output buffer 92 is disposed so as to compensate for the phase delay of the internal clock INCLK due to the output buffer 90, etc., and has the same delay time as the delay time caused by wiring for the clock signal covering from the second DLL circuit 20 (see FIG. 7B) to the output buffer 90 and the delay inside the output buffer 90. Further, the dummy circuit 70 has the predetermined delay time that will be described later.

In the semiconductor device shown in FIGS. 7A and 7B, further, the first and second DLL circuits 10 and 20 operate (execute the phase comparison) mutually independently. In other words, each of these DLL circuits 10 and 20 executes the phase comparison of the clock signal obtained from the dummy output buffer 92 through the dummy input buffer 82, with the external clock signal EXCLK through the input buffer 80, independently of each other and controls the delay time so that the phase difference has a predetermined relationship. Here, the term "phase difference having a predetermined relationship" concretely means the state in which the clock signal on the dummy side is delayed by at least k cycles (where k is an arbitrary positive integer of 1 or more than 1) from the external clock signal. An apparent phase difference does not exist under this state between the clock signal on the dummy side and the external clock signal. In other words, the data outputted from the output buffer 90 shown in FIG. 7B is in synchronism with the external clock signal supplied from outside to the input terminal of the input buffer 80 shown in FIG. 7A.

The explanation will be given in further detail. The semiconductor device shown in FIGS. 7A and 7B execute mutually independently the phase comparison between the external clock signal EXCLK and the internal clock signal INCLK in the first and second DLL circuits 10 and 20, and makes the phase control operation of the internal clock signal in the second DLL circuit 20 subordinate to the operation of the first DLL circuit 10 in order to impart the delay time by a plurality of delay devices inside the first and second DLL circuits 10 and 20, in such a manner as to output the internal clock signal having the predetermined phase relationship with the external clock signal.

Here, in order to prevent the jitter of the internal clock signal generated by the noise of the power source or the jitter of the external clock signal from affecting the phase synchronization of the external clock signal with the data, the delay time generated by each of a plurality of delay elements inside the first DLL circuit 10 shown in FIG. 7A (that is, the delay time of one stage of the low accuracy delay line 40) is set to a value larger than a value of the jitter of the internal clock signal (power source jitter).

As will be explained in the paragraph of the description concerning FIGS. 14 to 18 that will be mentioned later, when each of a plurality of delay devices constituting the low accuracy delay line 40 inside the first DLL circuit 10 shown in FIG. 7A in this embodiment contains at least one logic gate, the delay time of one stage of the low accuracy delay line 40 is set to a value larger than a value of the power source jitter by connecting a CR delay circuit having a resistor and a capacitor to the nodes on the output side of the logic gate.

Alternatively, the delay time of one stage of the low accuracy delay line 40 shown in FIG. 7A is set to a value larger than a value of the power source jitter by connecting a capacitance load having a predetermined capacitance value such as an MOS capacitor to the node on the output side of the logic gate.

Alternatively, the delay time of one stage of the low accuracy delay line 40 shown in FIG. 7A is set to a value larger than a value of the power source jitter or a value of the DLL jitter by increasing the channel length of the logic gate or by reducing the channel width.

Alternatively, the delay time of one stage of the low accuracy delay line 40 can be set to a value larger than a value of the power source jitter or the DLL jitter by increasing the number of stages of a plurality of delay devices of the low accuracy delay line 40 shown in FIG. 7A.

It should be noted, however, that in the semiconductor device shown in FIGS. 7A and 7B, a control of the delay time of the second DLL circuit (see FIG. 7B) is subordinate to a control of the delay amount of the first DLL circuit 10 (see FIG. 7A). More concretely, while the first DLL circuit 10 controls the delay time, the second DLL circuit 20 receives the reset signal Sr (RESET TO CENTER) from the first DLL circuit 10 and is reset and, when the phase of the signal SO and the phase of the signal S3 inputted to the first DLL circuit 10 conforms with each other (that is, when the phase of the external clock signal EXCLK inputted to the input buffer 80 (see FIG. 7A) conforms with the phase of the data outputted from the output buffer 90 (see FIG. 7B) in terms of an accuracy of the first DLL circuit 10), the second DLL circuit 20 is in the state in which it can control the delay time. Therefore, when the large delay time is necessary (that is, when the delay time is changed greatly), the delay time is controlled only by the first DLL circuit 10 so as to make the phase of the signal S0 and the phase of the signal S3 conform with each other under an accuracy of the first DLL circuit 10 and in this state, the delay time is controlled more accurately by the second DLL circuit 20 so as to make the phase of the signal SO and the phase of the signal S1 conform under an accuracy of the second DLL circuit 20.

As described above, the disposition of the first and second DLL circuits 10 and 20 (see FIGS. 7A and 7B) having mutually different accuracy intends to make a control of the delay amount, that is, the phase control, hierarchical (there are two hierarchies in the case of the construction shown in FIGS. 7A and 7B). When these two hierarchies are replaced by two digits, the lower digit (the digit having higher accuracy) is controlled by the second DLL circuit 20 and the upper digit (the digit having lower accuracy) is controlled by the first DLL circuit 10. Therefore, the digit shift operation is necessary between the first DLL circuit 10 and the second DLL circuit 20. When an accuracy of the first DLL circuit 10 is td, for example, the second DLL circuit 20 can control the delay time within the range of itd. When a result of the phase comparison of the first DLL circuit 10 deviates from the range ±td, the first DLL circuit 10 outputs the reset signal Sr to the second DLL circuit 20 and set the delay time of the second DLL circuit 20 to a predetermined value. This deviation from the range ±td means that the delay control by the second DLL circuit 20 is not sufficient and in such a case, the delay time is controlled by the first DLL circuit 10 (that is, the delay time is made variable). Incidentally, the reset signal Sr is used when digit shift operation into a higher digit position or lower digit position is executed, too.

Incidentally, when a result of the phase comparison by the first DLL circuit 10 deviates from the range ±td, the delay time of the second DLL circuit 20 is set to a predetermined value. This predetermined value is, for example, ½ of the range of the delay time that can be varied by the second DLL circuit 20. In other words, when the second DLL circuit 20 is reset, the delay time corresponding to ½ of the range of the delay time (hereinafter called the "reference delay time") that can be varied by the second DLL circuit 20 is provided by the second DLL circuit 20. When the second DLL circuit 20 is in an operable state, the delay time is made variable by increasing or decreasing this reference delay time. Incidentally, the afore-mentioned dummy circuit 70 provides the same delay time as the reference delay time as will be described later.

Next, the block constructions of the first and second DLL circuits 10 and 20 will be explained and then each circuit block will be explained in detail.

In FIG. 7A, the first DLL circuit 10 includes a division circuit 30 for dividing a frequency of the external clock signal EXCLK until the frequency necessary for conducting the phase comparison between the external clock signal EXCLK and the internal clock signal INCLK is obtained; a low accuracy phase comparing circuit 60 functioning as a digital phase comparator for roughly adjusting the delay time; and a low accuracy dummy delay line 44. The division circuit 30 divides the frequency of the external clock signal (signal S1) which has passed through the input buffer 80 and outputs the signals S2 and S3 having the same frequency which have a lower frequency than that of the signal S1. The signal S2 is supplied to the low accuracy dummy delay line 44 and the signal S3 is supplied to the first input side of the low accuracy phase comparing circuit 60. The output signal of the low accuracy dummy delay line 44 is applied to the second input side of the low accuracy phase comparing circuit 60 through a dummy output buffer 92, a dummy input buffer 82 and a dummy circuit 70. Here, the signal outputted from the dummy circuit 70 is assumed to be SO. The low accuracy phase comparing circuit 60 conducts the phase comparison of the signals S0 and S3 and controls the low accuracy delay control circuit 50.

Figure 1:
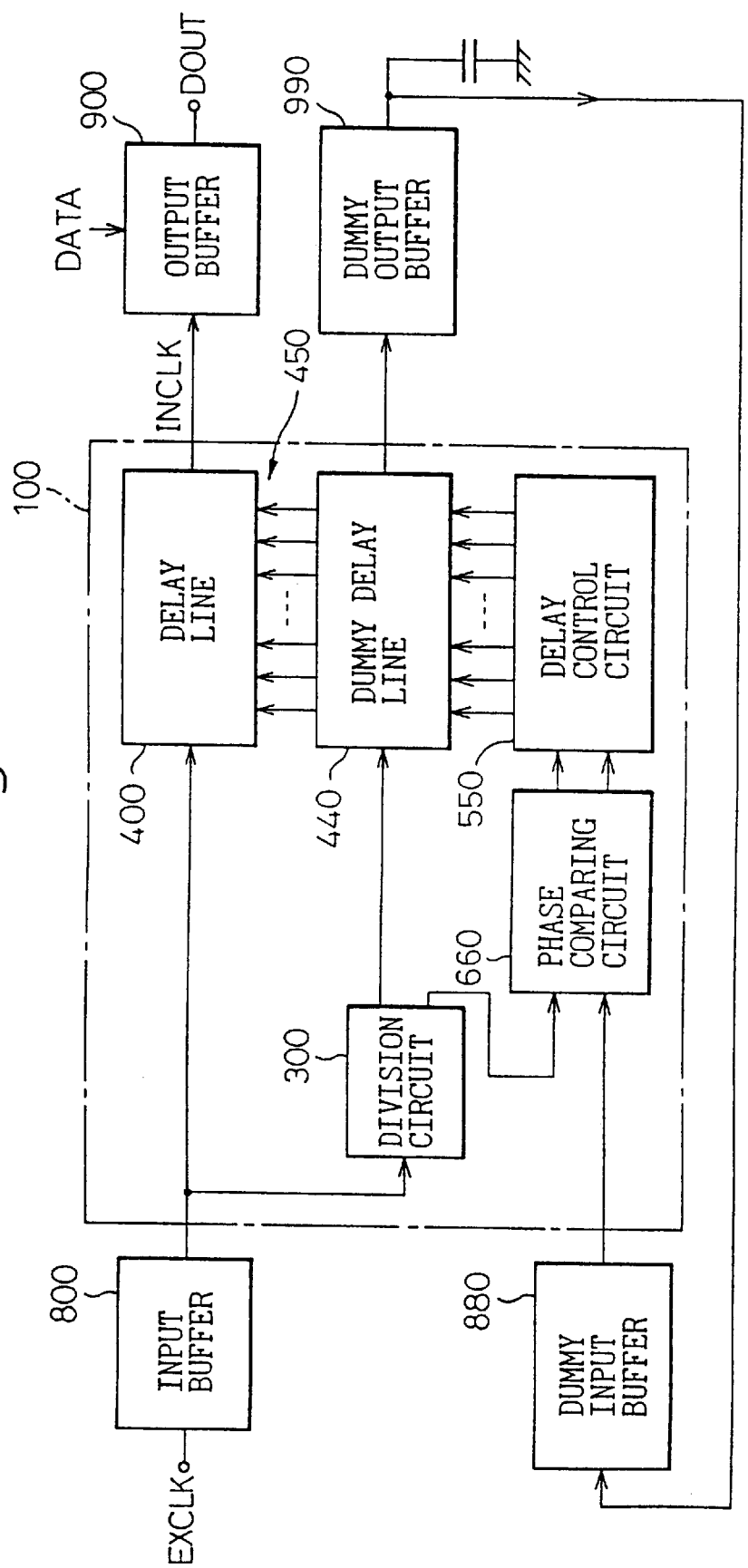
FIG. 1 is a block circuit diagram showing a construction of a semiconductor device having an ordinary clock phase adjusting circuit.

In this case, the division circuit portion 3 shown in FIG. 4 is accomplished by the division circuit 30 shown in FIG. 7A, and the first delay circuit portion 4 shown in FIG. 1 is accomplished by the low accuracy delay line 40 and the low accuracy dummy delay line 44. Further, the first delay control circuit portion 5 of FIG. 4 is accomplished by the low accuracy delay control circuit 50 of FIG. 7A, and the first phase comparing circuit portion 6 shown in FIG. 1 is accomplished by the first phase comparing circuit portion 60 of FIG. 7A.

More concretely, the low accuracy phase comparing circuit 60 shown in FIG. 7A judges whether or not the phase difference between the signals S0 and S3 falls within the range ±td. When the phase difference is judged to be out of the range ±td, the judgement is made that the delay time must be changed greatly, and the delay time of the low accuracy delay line 40 and the delay time of the low accuracy dummy delay line 44 are changed by one step (which is the minimum variable delay time and represents an accuracy of the first DLL circuit 10). Incidentally, the same delay time is set to the low accuracy delay line 40 and the low accuracy dummy delay line 44. In this case, further, the low accuracy phase comparing circuit 60 outputs the reset signal Sr to the second DLL circuit 20, and resets the high accuracy delay line 32 and high accuracy dummy delay line 34. When the high accuracy delay line 32 and the high accuracy delay line 34 that will be described later receive this reset signal Sr, the delay time of each of these delay lines is set to the delay time corresponding to ½ of the delay time of the variable range. Incidentally, the output signal of the low accuracy delay line 40 is supplied to the high accuracy delay line 32 of the second DLL circuit 20.

Further, the fixed delay amount adjusting means 14 (see FIG. 4) disposed inside the first delay circuit portion 4 shown in FIG. 4 is accomplished by a fixed delay amount adjusting unit 42 inside the low accuracy delay line 40 and a fixed dummy amount adjusting unit 46 inside the low accuracy dummy delay line 44. Each of these fixed delay amount adjusting unit 42 and fixed dummy delay amount adjusting unit 46 is constituted by a CR delay circuit having a resistor and a capacitor or a capacitance load having a predetermined capacitance value, such as a MOS capacitor. Each of a plurality of delay devices constituting the low accuracy delay line 40 inside the first DLL circuit 10 typically has a logic gate, such as a NAND gate, an inverter, or the like. When the CR delay circuit or the capacitance load is connected to the node on the output side of the logic gate, the delay time of each delay device of the low accuracy delay line 40 can be set to a value larger than the noise of the power source noise and the value of the jitter of the internal clock signal generated by the jitter of the external clock signal (power source jitter).

Referring to FIG. 7B, further, the second DLL circuit 20 includes a high accuracy phase comparing circuit 36 and a high accuracy delay control circuit 35 besides the high accuracy delay line 32 and the high accuracy dummy delay line 34. In this case, the high accuracy delay line 32 can control the delay time with higher accuracy than can the afore-mentioned low accuracy delay line 40 (see FIG. 7A). Similarly, the high accuracy dummy delay line 34 can control the delay time with higher accuracy than can the afore-mentioned low accuracy dummy delay line 44. A high accuracy phase comparing circuit 36 compares the phase of the signal S3 outputted by the division circuit 30 (see FIG. 7A), with the phase of the signal S4 outputted by the high accuracy dummy delay line 34, and controls the high accuracy delay control circuit 35 so that the same delay time can be set to the high accuracy delay line 32 and the high accuracy dummy delay line 34.

Assuming that accuracy of the high accuracy delay line 32 and the high accuracy dummy delay line 34 is td', the high accuracy phase comparing circuit 36 judges whether or not the phase difference exists within the range of 0 to td'. When the phase difference is judged to exist outside the range of 0 to td', the delay time of the high accuracy delay line 32 and the high accuracy dummy delay line 34 is increased or decreased by td'. On the other hand, receiving the reset signal Sr from the low accuracy phase comparing circuit 60, the high accuracy delay control circuit 35 resets the high accuracy delay line 32 and the high accuracy dummy delay line 34. Due to such a reset operation, the high accuracy delay line 32 and the high accuracy dummy delay line 34 are set to the reference delay time.

In this case, the afore-mentioned second delay circuit portion 24 shown in FIG. 4 is accomplished by the high accuracy delay line 32 and the high accuracy dummy delay line 34 shown in FIG. 7B. Further, the afore-mentioned second delay control circuit portion 25 shown in FIG. 4 is accomplished by the high accuracy dummy delay line 34 shown in FIG. 7B and the afore-mentioned second phase comparing circuit portion 26 is accomplished by the high accuracy phase comparing circuit 36 shown in FIG. 7B.

Next, the outline of the operation of the embodiment shown in FIGS. 7A and 7B, when the phase of the internal clock signal is coincident with the phase of the external clock, will be explained with reference to FIG. 8. The external clock signal EXCLK shown in the portion (a) of FIG. 8 is applied to the input terminal of the input buffer 80 shown in FIG. 7A and after the external clock signal is delayed by the delay time tin, it is applied as the signal S1 to the division circuit 30 (portion (b) in FIG. 8). The low accuracy phase comparing circuit 60 receives the signal S0 from the dummy circuit 70. This signal S0 has the delay time which is the sum of the delay time of the signal S1 delayed by the low accuracy delay line 40, the high accuracy delay line 32, the output buffer 90 and the input buffer 80 (with the proviso that the delay by the division circuit 30 is neglected hereby for the sake of convenience). Therefore, the signal S0 can be regarded as the signal S1 which is outputted through the low accuracy dummy delay line 44, the dummy output buffer 92, the dummy input buffer 82 and the dummy circuit 70. Assuming hereby that the delay amount of one stage of the low accuracy dummy delay line 44 is Rtd (which is equal to the delay time trd of one stage of the low accuracy delay line 40) and the delay time of the dummy output buffer 92, the dummy input buffer 82 and the dummy circuit 70 are tout, tin and th, respectively, and the signal S0 becomes the signal shown in the portion (c) of FIG. 8. In this case, the delay time th of the dummy circuit 70 is ½ of the maximum delay time of the high accuracy delay line 32 shown in FIG. 7B (this is also true concerning the high accuracy dummy delay line 34). Incidentally, the hatched area of the signal S0 in the portion (c) of FIG. 8 corresponds to the afore-mentioned range ±td.

Here, the signals inputted to the high accuracy phase comparing circuit 36 shown in FIG. 7B are the signal S3 from the division circuit 30 (see FIG. 7A) and the signal S4 outputted by the high accuracy dummy delay line 34 (see FIG. 7B). The signal S4 corresponds to the signal which is obtained after the signal S1 passes through the dummy output buffer 92 (see FIG. 7A), the dummy input buffer 82 (see FIG. 7A) and the high accuracy dummy delay line 34. The delay time of one stage of the high accuracy dummy delay line 34 is Ptd (which is equal to the delay time of one stage of the high accuracy delay line 32). Assuming that Ptd is equal to th, namely, Ptd=th, the signal S4 rises at the same timing as the signal S0. In this state, the output (signal S5) of the low accuracy delay line 40 (see FIG. 7A) is delayed by the delay time Rtd from the signal S1 as shown in the portion (d) in FIG. 8, and because it passes further through the high accuracy delay line 32 (see FIG. 7B), it is further delayed by the delay time Ptd. The output (signal S6) of the high accuracy delay line 32 is delayed by the delay time tout (inclusive of the delay of the clock signal line) of the output buffer 90 (see FIG. 7A) as shown in the portion (e) in FIG. 8. Therefore, the internal clock signal INCLK obtained finally is in synchronism with the external clock signal EXCLK.

In the construction shown in FIGS. 7A and 7B, the second DLL circuit 20 (see FIG. 7B) can control the delay time of the range including ±td when an accuracy of the first DLL circuit 10 (see FIG. 7A) is td. When the phase comparison result of the first DLL circuit 10 deviates from the range ±td, the first DLL circuit 10 outputs the reset signal Sr to the second DLL circuit 20 and set the delay time of the second DLL circuit 20 to the predetermined value. In other words, the operation for setting the delay time of the second DLL circuit 20 can be carried out smoothly by virtue of the operation of the first DLL circuit 10 which makes the delay time variable. Incidentally, this is also true concerning the case in which the digit shift operation is conducted.

When the operation described above is executed, the low accuracy delay line 40 (see FIG. 7A) is allowed to operate independently of the high accuracy delay line 32 (FIG. 7B), and when this low accuracy delay line 40 operates, the high accuracy delay line 32 is reset to the center (center portion) by using the reset signal (RESET TO CENTER), so that the high accuracy delay line 32 can automatically measure the delay time of one stage of the low accuracy delay line 40. Accordingly, even when a value, in which each of the low accuracy delay line 40 and the high accuracy delay line 32 changes, fluctuates with the changes of the temperature and the power source voltage, the operation for setting the delay amount of the hierarchical DLL circuits can be carried out smoothly.

Particularly when the phase adjustable range of the high accuracy delay line 32 is set to 200 psec or more than 200 psec which is the accuracy of the low accuracy delay line 40, the operation for setting the delay time can be carried out smoothly even when the change ratio of the delay time of the delay line of the first DLL circuit 10 and the delay time of the second DLL circuit 20 fluctuates due to the changes of the temperature and the power source voltage. As described already, however, the delay time of one stage of the low accuracy delay line 40 must be set to a value larger than the jitter of the internal clock signal in order to ensure the operation for smooth setting the delay time (inclusive of the digit shift operation) when the jitter of the internal clock signal generated by the noise of the power source or the jitter of the external clock signal is taken into account.

FIG. 9 is a jitter histogram showing the result of simulation conducted on the premise that the power source jitter exists within the range ±trd, and FIG. 10 is a jitter histogram showing the result of simulation conducted on the premise that the power source jitter does not exist within the range ±trd.

Figure 2:
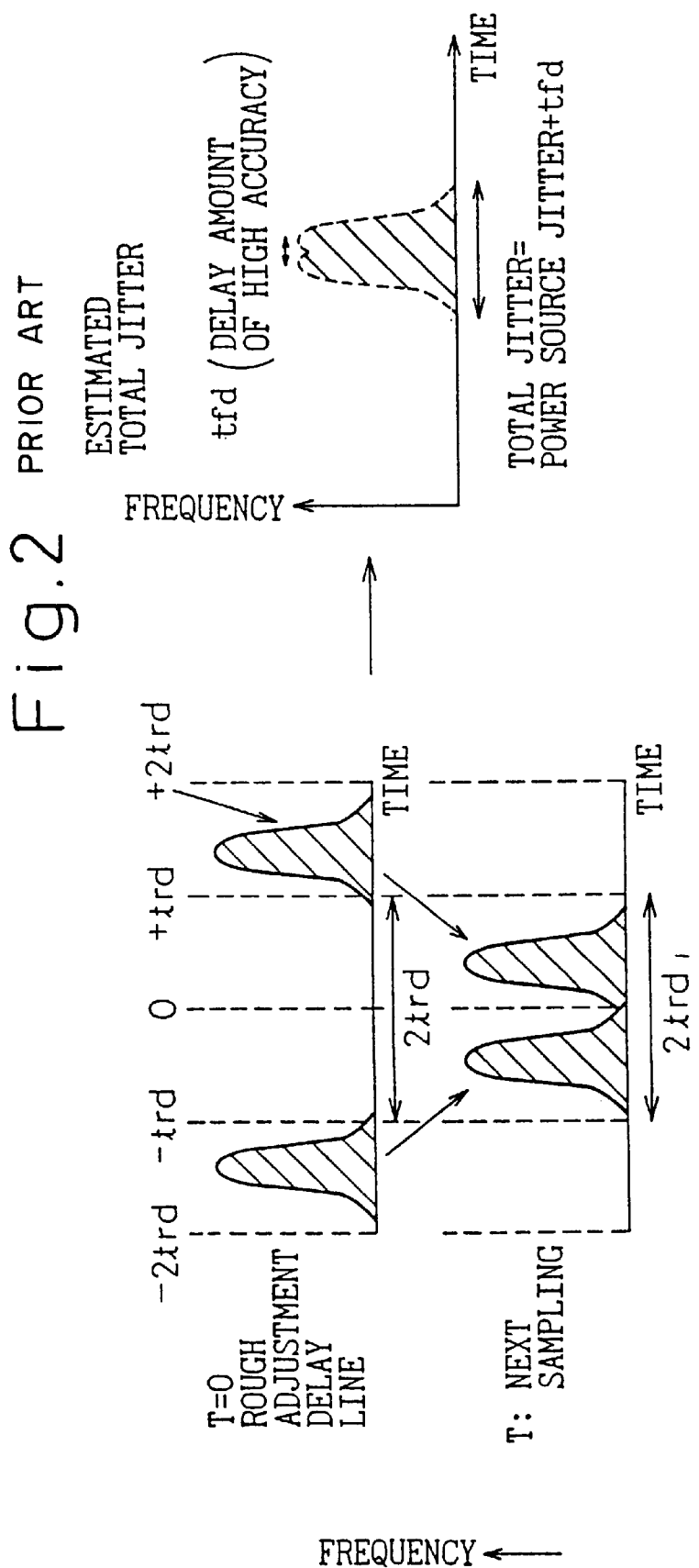
FIG. 2 is an explanatory view showing a method of effecting clock phase adjustment by conventional techniques when a power source jitter exists within the range of ±trd.
Figure 3:
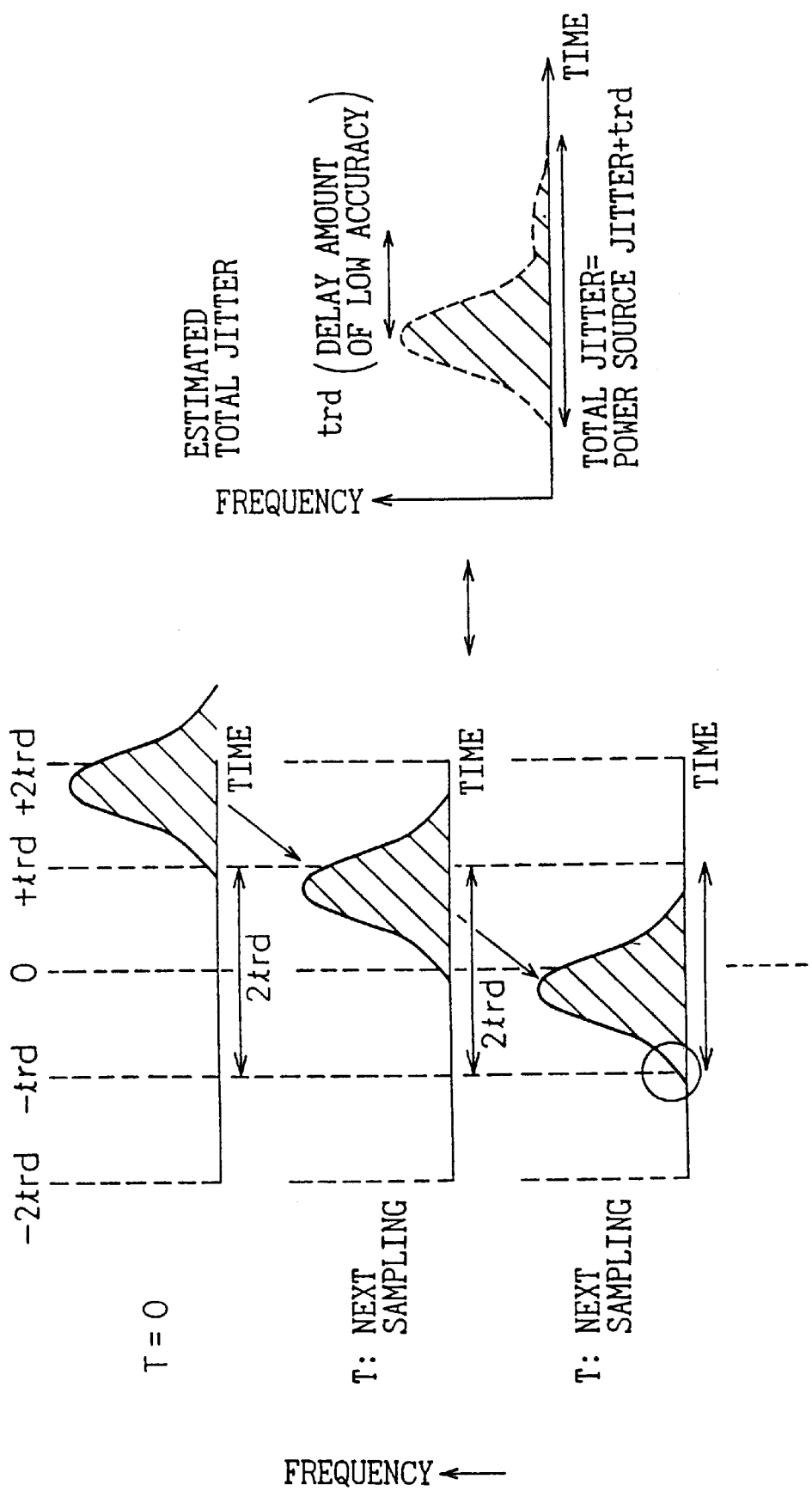
FIG. 3 is an explanatory view showing a method of effecting clock phase adjustment by conventional techniques when a power source jitter does not exist within the range of ±trd.

FIG. 9 shows the result calculated by simulation of the intensity distribution of the total jitter occurring in the hierarchical DLL circuits when the power source jitter is assumed as existing within the range ±trd (the case shown in FIG. 2), and FIG. 10 shows the result calculated by simulation of the intensity distribution of the total jitter occurring in the hierarchical DLL circuits when the power source jitter is assumed as deviating from the range ±trd (the case shown in FIG. 3). Such simulation results are expressed by the jitter histogram in which the clock access time tAC described already in FIG. 6 is plotted on the abscissa and the total jitter intensity is plotted on the ordinate. However, the cycle tCLK of the external clock signal EXCLK is set hereby to 6 nsec ($6 \times 10^{-9}$ sec).

As shown in FIG. 9, when the power source jitter exists within the range ±trd, variance of the total jitter falls within the range of one stage of delay time ±trd (for example, 200 psec) of the low accuracy delay line inside the rough control DLL circuit (first DLL circuit) with one peak (for example, tAC=170 psec) as the center. In this case, it is expected that the operation of the fine control DLL circuit (second DLL circuit) can be effected stably at any time after a lock-on of the DLL circuit is carried out.

On the other hand, when the power source jitter does not exist within the range ±trd as shown in FIG. 10, two peaks exist in the total jitter and the gap between these peaks is trd. Here, variance of the total jitter is out of the range of the delay time ±trd of one stage of the low accuracy delay line inside the rough control DLL circuit. In this case, the operation of the rough control DLL circuit can occur with a certain probability even after a lock-on of the DLL circuit is carried out. Therefore, it is difficult to ensure the operation for smoothly setting the delay time.

It can be understood clearly from the simulation results described above that in order to ensure the stable operation of the hierarchical DLL circuits, the value of the power source jitter must be kept within the range ±trd. Conversely, it is necessary to set the delay time trd of one stage of the low accuracy delay line inside the rough control DLL circuit to a value larger than a value of the power source jitter.

In the semiconductor device according to the preferred embodiment of the present invention, the delay time of one stage of the low accuracy delay line can be set to a value larger than a value of the power source jitter by connecting the CR delay device or the capacitance load to the node on the output side of the logic gate constituting each of a plurality of delay devices of the low accuracy delay line, or by increasing the channel length of the logic gate. Therefore, the stable operation of the semiconductor device having the hierarchical DLL circuits can be ensured without being affected by the jitter of the internal clock signal.

The description given above explains the basic construction of the preferred embodiment of the present invention and the operation thereof. Next, the detailed construction of the first DLL circuit 10 in FIG. 7A will be explained.

Figure 11:
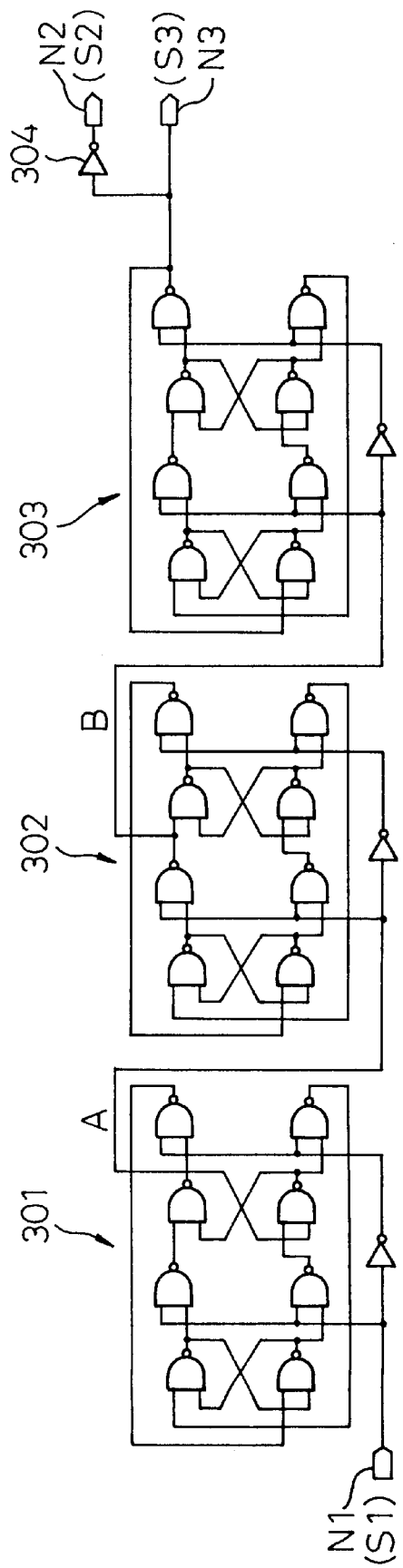
FIG. 11 is a circuit diagram showing an example of a construction of the division circuit shown in FIG. 7A.
Figure 12:
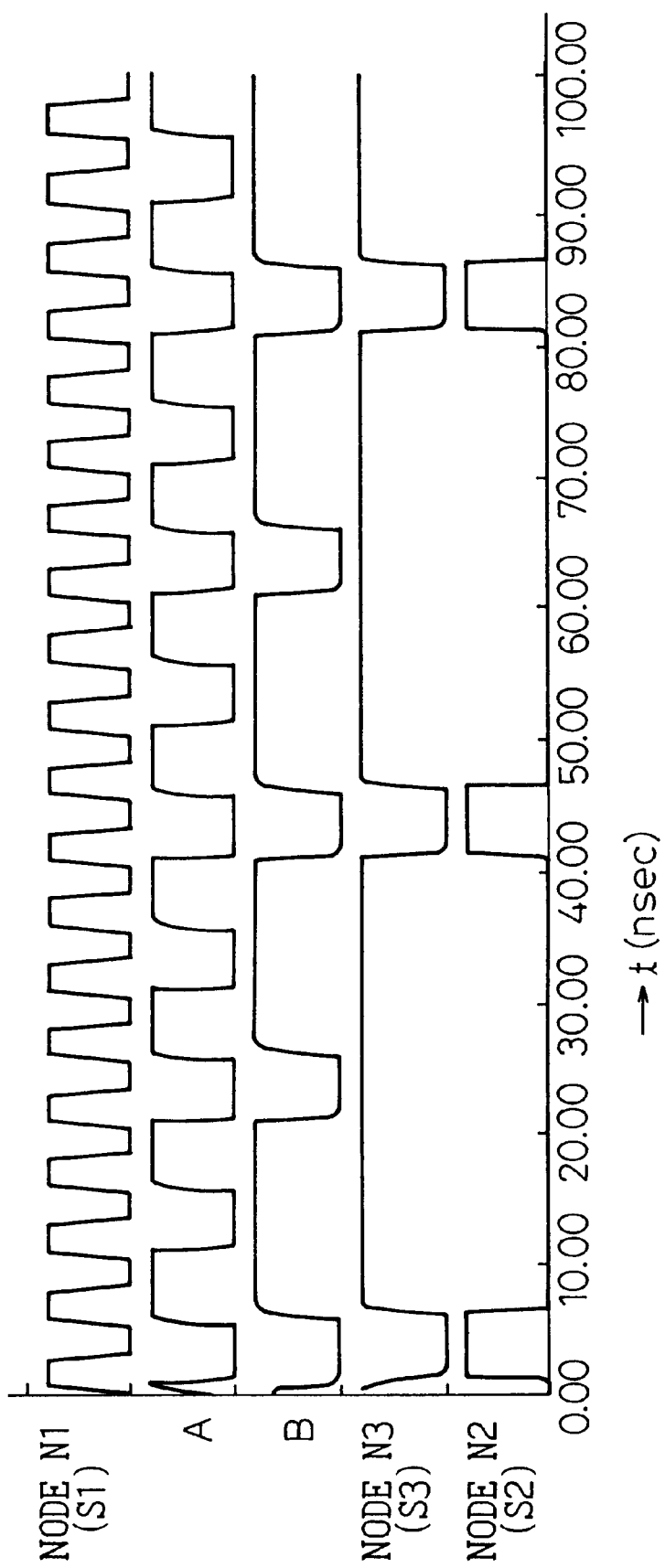
FIG. 12 is a timing chart showing a signal waveform of each node of the division circuit shown in FIG. 7A.

FIG. 11 is a circuit diagram showing a structural example of the division circuit shown in FIG. 7A, and FIG. 12 is a timing chart showing the signal waveform of each node of the division circuit shown in FIG. 7A.

As shown in FIG. 11, the division circuit 30 (see FIG. 7A) includes three stages of counters 301 to 303 each comprising a plurality each of NAND gates and inverters, and generates the signals S2 and S3 by dividing the frequency of the signal S1 (the external clock signal passing through the input buffer 80). Incidentally, reference symbol A in FIG. 11 represents the output signal of the counter 301 of the first stage and B represents the output signal of the counter 302 of the second stage. Each signal waveform is shown in FIG. 9. The division circuit 30 is not particularly limited to the three-stage type counters each having a plurality of NAND gates and inverters, but can be constituted as the combinations of various logic gates.

As shown in FIG. 12, the division circuit 30 divides the frequency of the signal S1 at the node N1 into eight parts having eight clock cycles and generates the signal S2 in which a period corresponding to one clock cycle of the external clock signal is at a high voltage level, that is, "H (High)" level (high voltage level) and a period corresponding to seven clock cycles is at a low voltage level, that is, "L (Low)" level (low voltage level) (node N2). On the other hand, the division circuit 30 generates the signal S3 having a complementary relationship with this signal S2 (node N3), that is, signal S3 having the polarity opposite to the polarity of the signal S2. In other words, whereas the signal S3 is outputted as such from the counter 303 of the third stage, the signal S2 is obtained by inverting the output signal of the counter 303 of the third stage by the inverter 304.

Figure 13:
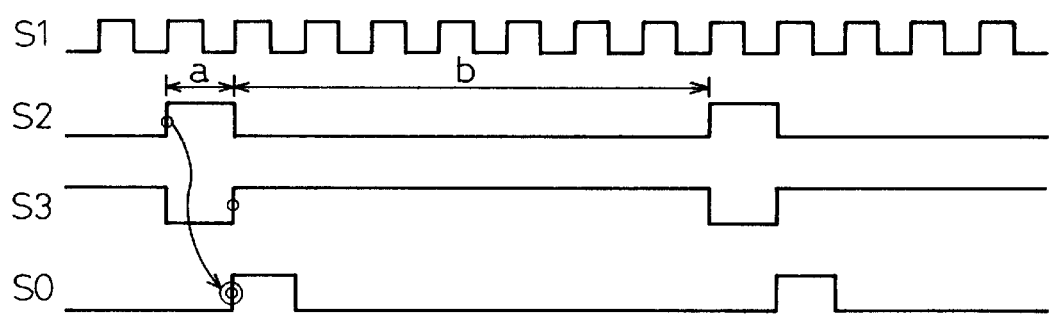
FIG. 13 is a timing chart useful for explaining the operation of a semiconductor device using the division circuit shown in FIG. 11.

FIG. 13 is a timing chart useful for explaining the operation of the semiconductor device using the division circuit shown in FIG. 11. Here, the drawing shows the phase relationship of the signals S0 and S3. As shown in the timing chart, the low accuracy phase comparing circuit 60 (see FIG. 7A) executes the phase comparison once per eight cycles (that is, eight clock cycles). The signal S0 is in synchronism with the signal S1 with the delay of one cycle. Therefore, the phase of the internal clock signal in the output buffer 90 (see FIG. 7B) is actually in synchronism with the phase of the external clock signal which is previous to the internal clock signal by one clock cycle.

Incidentally, it is possible to adjust the timing of the generation of the internal clock signal, on the basis of the external clock signal which is previous to the internal clock signal by given clock cycles, by changing the period "a" of the signal S2 of the division circuit 30. For example, the internal clock signal which is synchronized with the external clock signal which is previous to the internal signal by three clock cycles can be generated, by setting the period "a" of the signal S2 to the time length corresponding to three clock cycles. It is also possible to adjust the interval of given clock cycles with which the phase comparison is to be made, by changing the period "b" of the signal S2.

When the sum of the delay time of the input buffer 80 (see FIG. 7A), the minimum delay time of the low accuracy delay line 40 (see FIG. 7A), the minimum delay time of the high accuracy delay line 32 (see FIG. 7A), the delay time of wiring for the clock signals and the delay time of the output buffer 90 is shorter than the time corresponding to one clock of the external clock signal (that is, one clock cycle), the internal clock signal having the synchronized phase with the external clock signal can be generated, on the basis of the external clock signal which is previous to the internal clock signal by one clock cycle. In contrast, when the sum of the delay time described above exceeds one clock cycle of the external clock signal, a phase synchronization of the internal clock signal with the external clock signal must be established, on the basis of the external clock signal which is previous to the internal clock signal by at least two clock cycles. In this case, the period "a" is set to at least two clock cycles.

Figure 14:
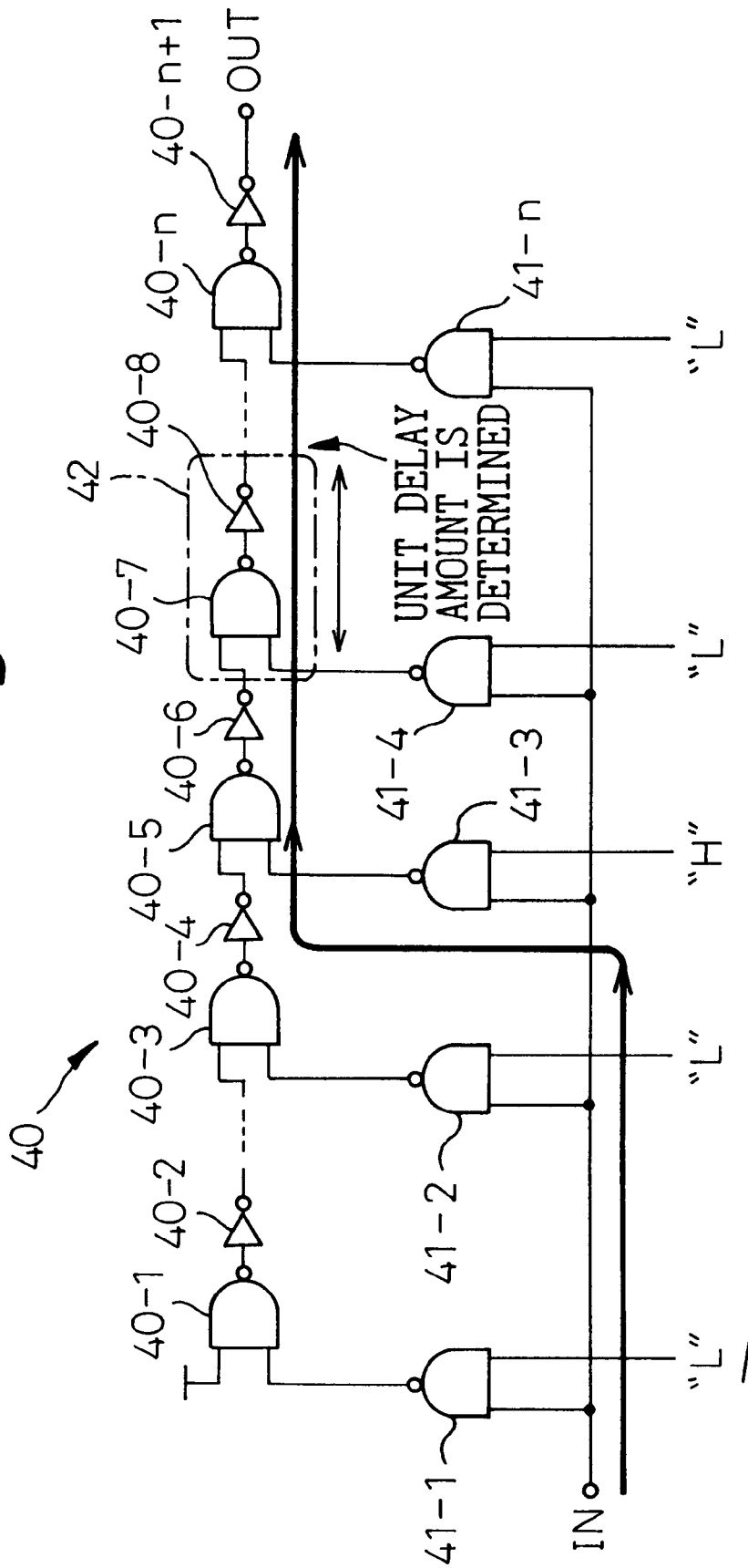
FIG. 14 is a circuit diagram showing an example of a schematic construction of a low accuracy delay line shown in FIG. 7A.
Figure 15A:
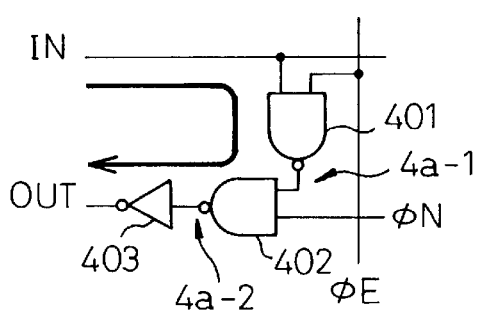
FIGS. 15A, 15B and 15C are diagrams showing more concrete constructions of the low accuracy delay line shown in FIG. 7A and an operational waveform of the low accuracy delay line.
Figure 15B:
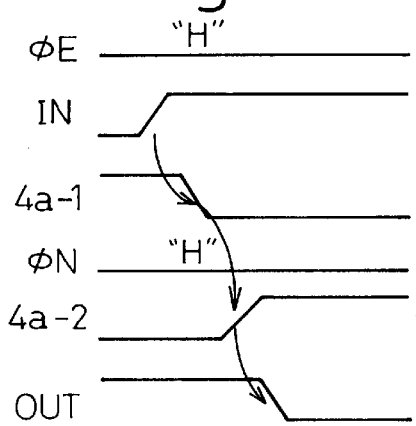
Figure 15C:
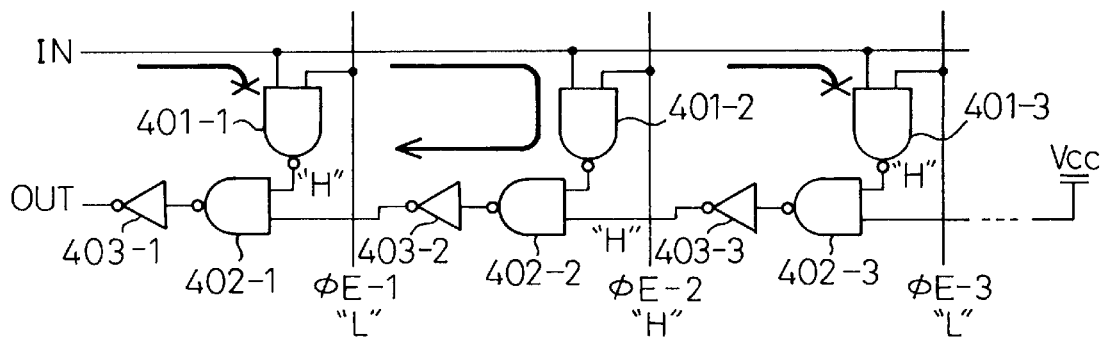

FIG. 14 is a circuit diagram showing a schematic structural example of the low accuracy delay line shown in FIG. 7A; and FIGS. 15A, 15B and 15C are diagrams showing more concrete constructions of the low accuracy delay line shown in FIG. 7A and an operational waveforms of the low accuracy delay line.

As shown in FIG. 14, the low accuracy delay line 40 (or low accuracy dummy delay line 44) of the preferred embodiment of the present invention includes n stages (where n is an arbitrary positive integer of 2 or more than 2) of delay elements which are formed by connecting in series with each other a plurality of NAND gates 40-1, 40-3, . . . and 40-n and a plurality of inverters 40-2, 40-4, . . . and 40-n+1. Each delay device has a logic gate including one NAND gate and one inverter, and decides the unit delay time. Each delay device also constitutes the fixed delay amount adjusting unit 42 having the feature of the present invention. Further, a plurality of NAND gates 41-1 to 41-n for receiving the selection signal Ss from the low accuracy delay control circuit 50 are connected on the input side of a plurality of NAND gates 40-1 to 40-n.

In the preferred embodiment of the present invention, the delay amount of one stage of the low accuracy delay line can be set to a value larger than a value of the power source jitter, by connecting the CR delay device or the capacitance load to the node on the output side of the NAND gate and the inverter constituting each delay device inside the low accuracy delay line 40, or by increasing the channel length of the NAND gate and the inverter.

FIG. 15A shows the construction of the delay circuit for one bit, including the delay devices of one stage inside the low accuracy delay line 40 shown in FIG. 14. FIG. 15B shows a timing chart useful for explaining the operation of the delay circuit for one bit, and FIG. 15C shows a more concrete circuit construction of the low accuracy delay line when a plurality of stages of the delay circuits for one bit are connected with each other.

As shown in FIG. 15A, the delay circuit for one bit comprises two NAND gates 401 and 402 and an inverter 403. This delay circuit for one bit corresponds to the circuit of FIG. 14 which includes the delay element for one stage having one NAND gate and one inverter, and another NAND gate connected to the input side of the former NAND gate. The operation for one bit will be explained with reference to FIG. 15B. The input signal φE corresponding to one select signal Ss is an activation signal, and the delay circuit operates at the "H" level (here, the level of the power source voltage Vcc). FIG. 15B shows the state in which the input signal φE attains the "H" level and a reception of the signal becomes possible. A signal IN represents another input signal to the delay circuit for one bit, φN represents a signal from the delay circuit of the adjacent right side among a plurality of delay circuits connected in a plurality of stages, OUT represents an output signal of the delay circuit for one bit, and 4a-1 and 4a-2 represent the operational waveform of corresponding internal terminals in the delay circuit shown in FIG. 15A. Therefore, the output signal OUT becomes the signal φN which is to be input to the delay circuit of the adjacent left side.

When the signal φN is at the "L" level, the output signal OUT remains always at the "L" level. When the signal φN is at the "H" level and the input signal φE is at the "L" level, the output signal OUT is always at the "H" level. When the signal φN is at the "H" level and the input signal φE is at the "HH" level, the output signal OUT reaches the "H" level if the input signal IN is at the "L" level, and falls to the "L" level if the input signal IN is at the "H" level. FIG. 15B shows the mode in which the input signal IN is transferred as the output signal OUT to the output side while the input signal IN is inverted by the NAND gates 401 and 403 and by the inverter 403 under the state of φE="H" and φN="H".

FIG. 15C shows an example in which the delay circuits for one bit shown in FIG. 15A are cascaded in a plurality of stages, and this construction corresponds to the variable delay circuit comprising the practical delay lines. Though the drawing shows only three stages, a plurality of delay circuits are cascaded in a large number of stages in fact. A plurality of signal lines of other input signals (that is, activation signals) φE are provided so as to correspond to the circuit elements, such as φE-1, φE-2 and φE-3, and these activation signals are controlled by the low accuracy delay control circuit 50 (see FIG. 7A).

In FIG. 15C, the delay circuit for one bit at the center is shown activated, and the activation signal φE-2 is in the "H" level. In this case, when the input signal IN changes from the "L" level to the "H" level, the input signal IN is interrupted by the NAND gates 401-1 and 401-3 as indicated by the thick line, because both of the activation signals φE-1 and φE-3 of the delay circuits for one bit on the left and right sides are at the "L" level. On the other hand, because the activation signal φE-2 of the activated delay circuit for one bit at the center is at the "H" level, the input signal IN passes through the NAND gate 401-2. Because the output signal OUT of the delay circuit for one bit on the right side is at the "H" level, the input signal IN passes also through the NAND gate 402-2 and is transferred as the "L" level output signal OUT to the output side. In this way, the output signal OUT on the left side is always at the "L" level when the activation signal ON is at the "L" level. Therefore, this "L" level signal is serially transmitted to the NAND gates and the inverter of the delay circuit for one bit on the left side, and is taken out as the final output signal OUT.

In the way described above, the input signal IN is transmitted in such a manner as to be folded back through the activated delay circuits for one bit and becomes the final output signal OUT. In other words, the delay time can be controlled depending on the portion of the activation signal φE (i.e., either one of φE-1, φE-2 and φE-3) which is set to the "H" level. The delay time for one bit is determined by the total signal propagation time of the NAND gates and the inverter, and this propagation time is the unit time of the delay time of the DLL circuit, that is, the unit delay time. The total delay time corresponding to the overall delay time is the product obtained by multiplying the delay time for one bit by the number of stages of the delay circuits through which the signal passes.

Figure 16:
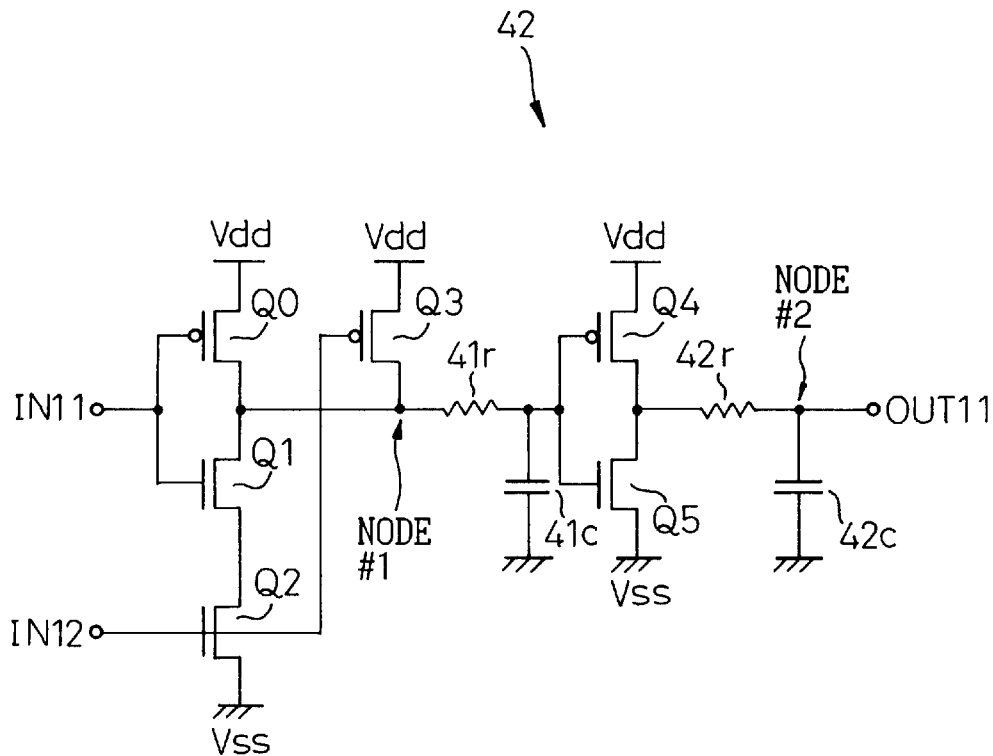
FIG. 16 is a circuit diagram showing a first concrete structural example for setting the delay amount of delay device of one stage shown in FIG. 14 to a value larger than a predetermined value.

FIG. 16 is a circuit diagram showing the first concrete structural example for setting the delay time of the delay device for one stage shown in FIG. 14 to a value larger than the predetermined value. The explanation will be given hereby on the case in which the delay element for one stage that functions as the fixed delay amount adjusting unit 42 (or the dummy delay amount adjusting unit 46) and constitutes the characterizing feature of the present invention comprises a logic gate including one NAND gate and one inverter.

Referring to FIG. 16, the NAND gate inside the delay device for one stage includes a P channel transistor Q0 and an N channel transistor Q1 that are connected in series with each other, an N channel transistor Q2 connected to the source of this N channel transistor Q1 and a P channel transistor Q3 connected to the node #1 on the output side of the N channel transistor Q1. The sources of the P channel transistors Q0 and Q3 are connected to the first power source (power source on the high voltage side) Vdd, and the source of the N channel transistor Q2 is connected to the second power source (power source on the low voltage side) Vss. One of the input signals IN11 of the NAND gate is inputted simultaneously to the gates of the P channel transistor Q0 and the N channel transistor Q1. The other input signal IN12 of the NAND gate is inputted to the gate of the N channel transistor Q2.

Referring further to FIG. 16, the inverter in the delay element for one stage comprises a P channel transistor Q4 and an N channel transistor Q5 that are connected in series with each other, and is connected to the node #1 on the output side of the NAND gate. The source of the P channel transistor Q4 is connected to the first power source Vdd and the source of the N channel transistor Q5 is connected to the second power source Vss. The signal outputted from the NAND gate is supplied simultaneously to the gates of the P channel transistor Q4 and the N channel transistor Q5, and is outputted as an output signal OUT11 from the node #2 on the outside of the P channel transistor Q4 and the N channel transistor Q5.

In the first concrete structural example shown in FIG. 16, a CR delay circuit having a resistor 41r and a capacitor 41c having a suitable resistance value and a suitable capacitance value, respectively, is connected to the node #1 on the output side of the NAND gate; and another CR delay circuit having a resistor 42r and a capacitor 42c having a suitable resistance value and a suitable capacitance value, respectively, is connected to the node #2 on the output side of the inverter. According to such a construction, the delay time of the delay element for one stage can be extended by utilizing the signal delay by the CR delay circuits and consequently, the delay time of the delay element can be set to a value larger than the jitter of the internal clock signal (power source jitter) resulting from the power source jitter and the jitter of the external clock signal.

Figure 17:
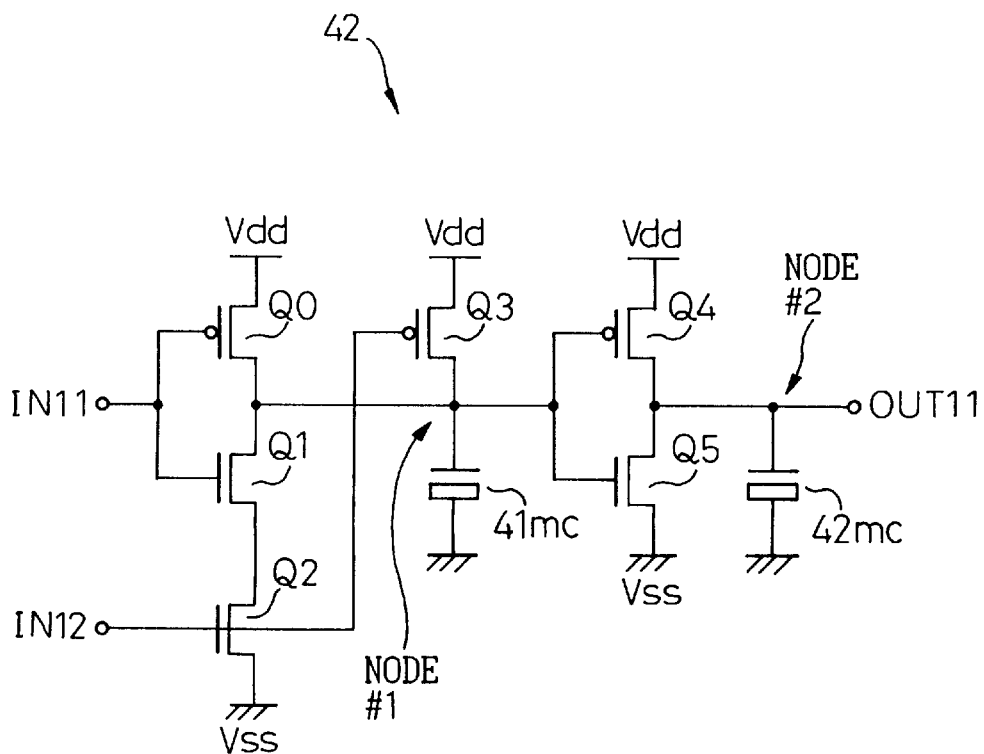
FIG. 17 is a circuit diagram showing a second concrete structural example for setting the delay time of delay element of one stage shown in FIG. 14 to a value larger than a predetermined value.

FIG. 17 is a circuit diagram showing the second concrete structural example for setting the delay time of the delay element for one stage to a value larger than a predetermined value. In this case, too, the explanation will be given in the case in which the delay element for one stage, that functions as the fixed delay amount adjusting unit 42, comprises a logic gate including one NAND gate and one inverter.

Since the constructions of the NAND gate and the inverter in the delay element for one stage shown in FIG. 17 are the same as in the case of FIG. 16, the detailed explanation of the NAND gate and the inverter will be omitted.

In the concrete structural example shown in FIG. 17, a capacitance load 41mc having a suitable capacitance value such as an MOS capacitor is connected to the node #1 on the output side of the NAND gate, and a capacitance load 42mc having a suitable capacitance value such as a MOS capacitor is connected to the node #2 on the output side of the inverter. Since such a construction can increase the capacitance amount of the delay element for one stage, the delay time of the delay element can be set to a value larger than a value of the jitter of the internal clock signal resulting from the noise of the power source or the jitter of the external clock signal.

Figure 18:
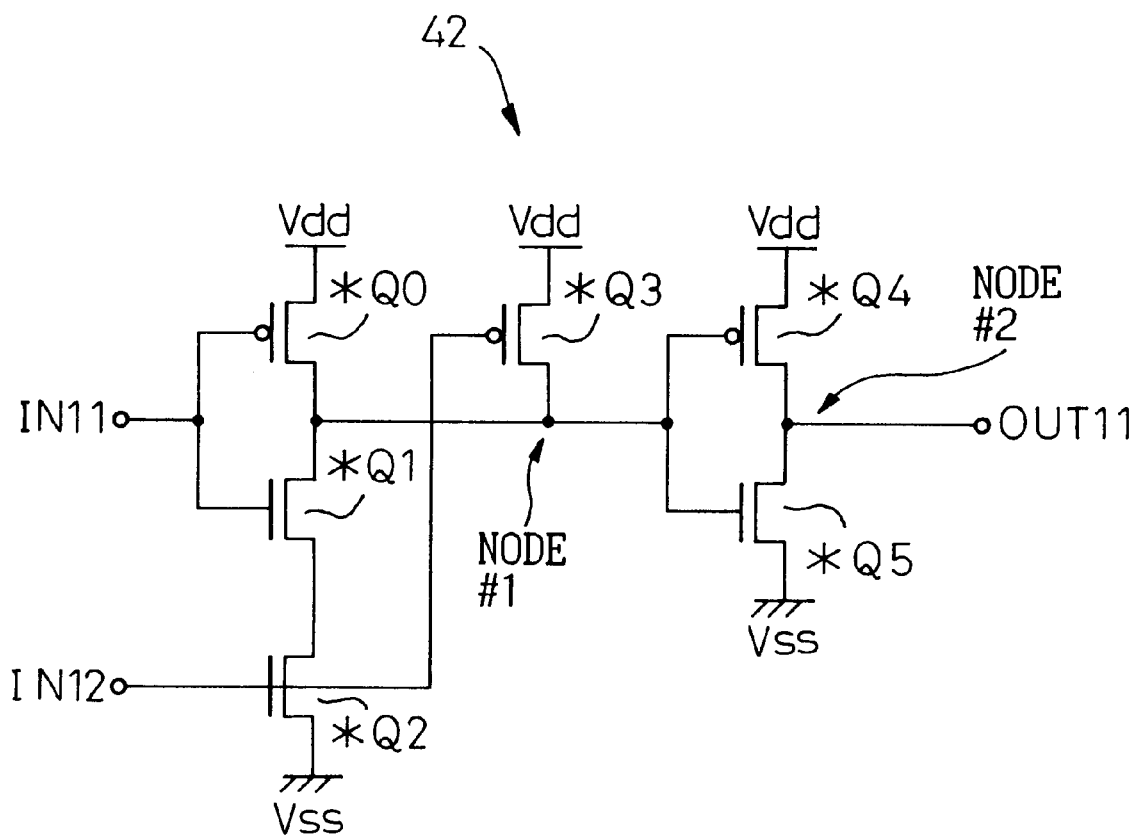
FIG. 18 is a circuit diagram showing a third concrete structural example for setting the delay time of delay element of one stage shown in FIG. 14 to a value larger than a predetermined value.

FIG. 18 is a circuit diagram showing the third concrete structural example for setting the delay amount of the delay element for one stage to a value larger than a predetermined value. In this case, too, the explanation will be given in the case in which the delay element for one stage that functions as the fixed delay amount adjusting unit 42 comprises a logic gate including one NAND gate and one inverter.

In the third concrete structural example shown in FIG. 18, however, the NAND gate and the inverter are constituted by using P channel transistors and N channel transistors each having a channel length longer than the standard value (that is, transistors having a longer channel length *Q0 to *Q6). To simplify the explanation, these transistors having longer channel length *Q0 to *Q6 will be called simply the P channel transistors or the N channel transistors.

The explanation will be given in more detail. In FIG. 18, the NAND gate inside the delay device for one stage includes a P channel transistor *Q0 and an N channel transistor *Q1 that are connected in series with each other, an N channel transistor *Q2 connected to the source of the N channel transistor *Q1 and a P channel transistor *Q3 connected to the node #1 on the output side of the P channel transistor *Q0 and the N channel transistor *Q1. The source of each of the P channel transistors *Q0 and *Q3 is connected to the first power source Vdd and the source of the N channel transistor *Q2 is connected to the second power source Vss. One of the input signals IN11 of the NAND gate is inputted simultaneously to the gates of the P channel transistor *Q0 and the N channel transistor *Q1. On the other hand, the other input signal IN12 of the NAND gate is inputted to the gate of the N channel transistor *Q2.

In FIG. 18, further, the inverter inside the delay device for one stage comprises a P channel transistor *Q4 and an N channel transistor *Q5 that are connected in series with each other, and is connected to the node #1 on the output side of the NAND gate. The source of the P channel transistor *Q4 is connected to the first power source Vdd, and the source of the N channel transistor *Q5 is connected to the second power source Vss. The signal outputted from the NAND gate is supplied simultaneously to the gates of the P channel transistor *Q4 and the N channel transistor *Q5, and is outputted as the output signal OUT11 from the node #2 on the output side of the P channel transistor *Q4 and the N channel transistor *Q5.

As shown in FIG. 18, the third concrete structural example can increase the delay time of the delay element for one stage, by increasing the channel length of the transistors constituting the NAND gate and the inverter, and can therefore set the delay time of the delay element to a value larger than a value of the jitter of the internal clock signal resulting from the noise of the power source and the jitter of the external clock signal, in the same way as in the first and second concrete structural examples described above. Alternatively, the delay time of the delay element can be set to a value larger than a value of the jitter of the internal clock signal by decreasing the channel width of the transistor. With regard to another method of setting the delay time of the delay device of the low accuracy delay line 40 to a value larger than a value of the power source jitter, it is mentioned to increase the number of stages of the overall delay elements in the low accuracy delay line. In this case, since the delay time can be increased by increasing the number of stages of selectable delay devices, too, the delay time of the delay elements inside the low accuracy delay line can be set to a value larger than a value of the power source jitter.

Figure 19:
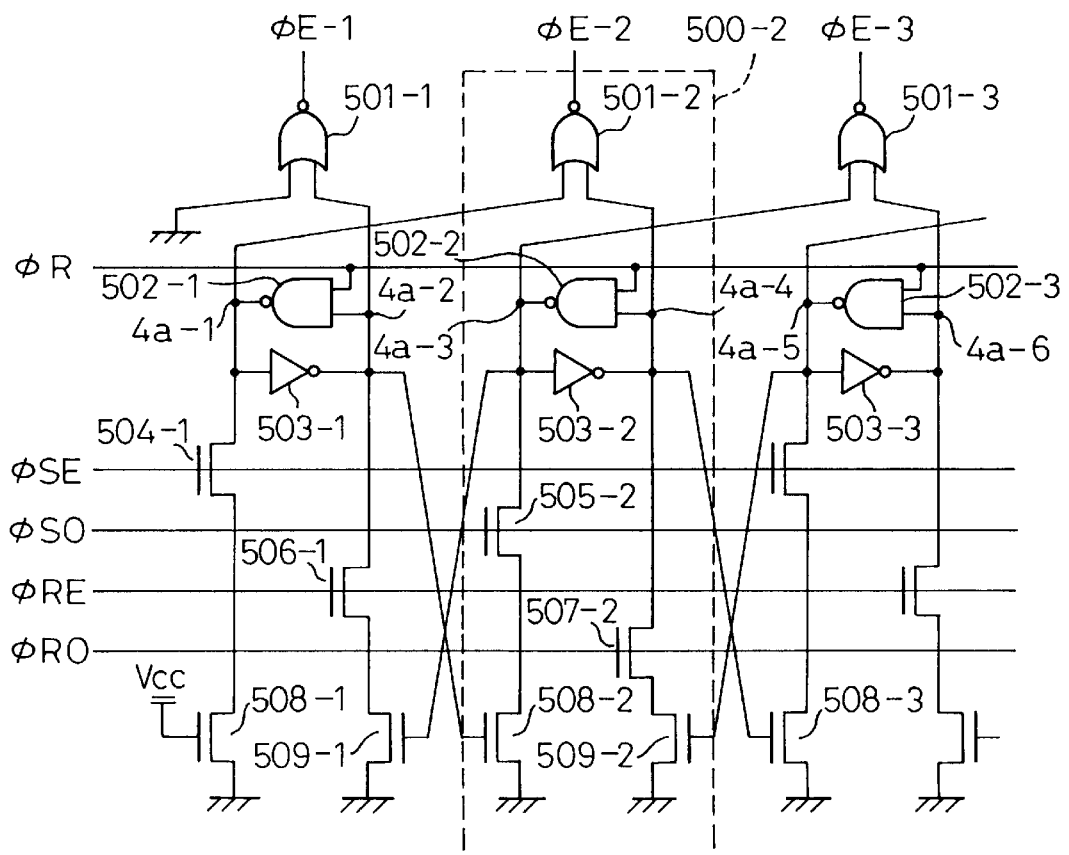
FIG. 19 is a circuit diagram showing a structural example of the low accuracy delay control circuit shown in FIG. 7A.
Figure 20:
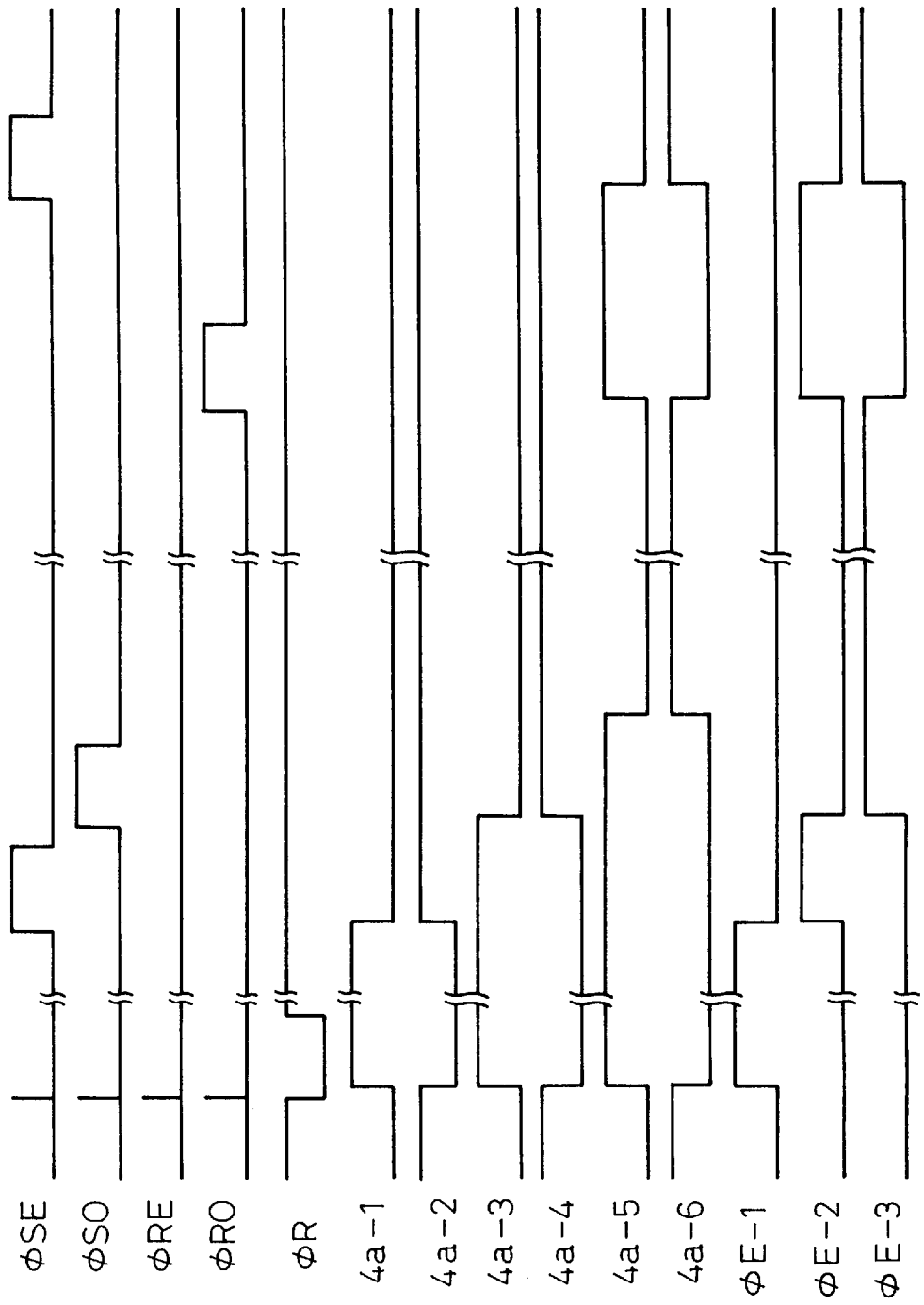
FIG. 20 is a timing chart useful for explaining the operation of the low accuracy delay control circuit shown in FIG. 19.

FIG. 19 is a diagram showing a structural example of the low accuracy delay control circuit shown in FIG. 7, and FIG. 20 is a timing chart useful for explaining the operation of the low accuracy delay control circuit shown in FIG. 19.

As shown in FIG. 19, the low accuracy delay control circuit 50, too, is formed by connecting a plurality of the low accuracy delay control circuits (500-2) for one bit, encompassed by dash lines, with each other and in the number corresponding to the number of stages of the delay circuits inside the low accuracy delay line, and the output of each stage becomes the activation signal φE (for example, φE-1 to φE-3) of each stage of the low accuracy delay line.

The low accuracy delay control circuit 500-2 for one bit includes a NAND gate 502-2, transistors 505-2 and 508-2, and 507-2 and 509-2 that are connected in series to both ends of a flip-flop comprising an inverter 503-2, respectively, and a NOR gate 501-2. The gate of the transistor 508-2 is connected to the terminal 4a-2 of the previous stage while the gate of the transistor 509-2 is connected to the terminal 4a-5 of the succeeding stage in such a manner as to receive the signals of the previous and succeeding stages. Set signals φSE and φSO for a count-up operation and reset signals φRE and φRO for a count-down operation are alternately connected to the other transistors connected in series. As shown in this drawing, in the low accuracy delay control circuit 500-2 for one bit at the center, the transistor 505-2 is connected to the set signal φSO while the transistor 507-2 is connected to the reset signal φRO. In the circuits on both sides of the low accuracy delay control circuit 500-2, the corresponding transistors are connected to other set signals φSE and reset signal φRE, respectively. The signals of the terminals 4a-1 and 4a-2 of the NAND gate 502-1 on the left side are inputted to the NOR gate 501-2. Incidentally, the reset signal φR is the one that resets the low accuracy delay control circuit, and this signal falls temporarily to the "L" level after starting up a power source and is thereafter fixed at the "H" level.

In the timing chart shown in FIG. 20, the reset signal φR first falls temporarily to the "L" level and the terminals 4a-1, 4a-3 and 4a-5 are reset to the "H" level while the terminals 4a-2, 4a-4 and 4a-6 are reset to the "L" level. When the count-up operation is carried out, the reset signal φSE and the set signal φSO as the count-up signal alternately repeat the "H" level and the "L" level. When the set signal φSE changes from the "L" level to the "H" level, the terminal 4a-1 is grounded and changes to the "L" level and the terminal 4a-2 changes to the "H" level. As the terminal 4a-2 changes to the "H" level, the activation signal φE-1 changes from the "H" level to the "L" level. Because this state is latched by the flip-flop, the activation signal φE-1 remains in the "L" level even when the set signal φSE returns to the "L" level.

As the terminal 4a-1 changes to the "L" level, the activation signal φE-2 changes from the "L" level to the "H" level. Because the terminal 4a-2 changes to the "H" level, the transistor 508-2 is turned ON (becomes active). When the set signal φSO changes from the "L" level to the "H" level, the terminal 4a-3 is grounded and changes to the "L" level whereas the terminal 4a-4 changes to the "H" level. As the terminal 4a-4 changes to the "H" level, the activation signal φE-2 changes from the "H" level to the "L" level. Since this state is latched by the flip-flop, the activation signal φE-2 remains at the "L" level even if the set signal φSO returns to the "L" level.

As the terminal 4a-3 changes to the "L" level, the activation signal φE-3 changes from the "L" level to the "H" level. In FIG. 20, only one pulse each of the set signal φSE and φSO is outputted, but if the low accuracy delay control circuits are connected in a plurality of stages and the set signals φSE and φSO alternately repeat the "H" level and the "L" level, the position of the stage in which the activation signal φE rises to the "H" level sequentially shifts to the right side. Therefore, when it is necessary to increase the delay amount of the phase comparison circuit of the low accuracy phase comparing circuit 60 (see FIG. 7A), the pulses of the set signals φSE and φSO may be inputted alternately.

If the state in which the set signals φSE and φSO at the time of the count-up operation and the reset signals φRE and φRO at the time of the count-down operation are not outputted, that is, the state in which the "L" state, is maintained, the position of the stage in which the activation signal φE of the output rises to the "H" level is fixed. Therefore, when the delay time must be maintained depending on a result of the phase comparison of the low accuracy phase comparing circuit 60, the pulses of the set signals φSE and φSO and the reset signals φRE and φRO are prevented from being inputted.

When the count-down operation is effected, the pulses of the reset signals φRE and φRO are alternately inputted. Then, the position of the stage at which the activation signal φE attains the "H" level sequentially shifts to the left side, contrary to the case of the count-up operation.

As explained above, the low accuracy delay control circuit shown in FIG. 19 can move one by one the position of the stage in which the activation signal φE of the output attains the "H" level, by inputting the pulses, and when the low accuracy delay line shown in FIG. 15C is controlled by these activation signals φE, the delay amount can be controlled so as to increase or decrease by one unit.

Here, the low accuracy delay line and the low accuracy delay control circuit will be explained in further detail. In the afore-mentioned embodiment, the circuit such as the one shown in FIG. 15C is used for the low accuracy delay line, and control is made by using the low accuracy delay control circuit shown in FIG. 19. To accomplish a circuit which is capable of changing step-wise the delay time by the unit delay time, it is ordinary to use a delay line having a plurality of signal routes which are connected in series with each other and are capable of selecting the delay time by selectively outputting the signal from a part of these signal routes. In such a delay line, the state in which none of the signal routes are selected even under the transient state in which the signals are outputted from the adjacent signal routes to change the delay time must be avoided. For this reason, the low accuracy delay control circuit described above for controlling the delay line must always output the signal for selecting any one of the signal routes even under the transient state.

In the low accuracy delay control circuit shown in FIG. 19, each stage outputs two complementary signals. In other words, the output of the NAND gate and the output of the inverter are the complementary signals. The complementary signal of one state is outputted up to a certain stage and after this stage, the inverted complementary signal is outputted, and the stage which first outputs this inverted complementary signal is shifted. In other words, the low accuracy delay control circuit has the same function as a shift register. In the low accuracy delay control circuit shown in FIG. 19, the NOR gate executes the negate logical sum (NOT-OR) operation of the different complementary signals of the two adjacent stages for each stage, and connects this output to the selection signal line of each stage shown in FIG. 15C. In the MOS transistors such as the P channel transistors and N channel transistors used in the embodiments of the present invention, the speed of the change or fall speed for changing from the logic value of the "H" level to the logic value of the "L" level is generally higher than the speed of the change or rise speed for changing from the logic value of the "L" level to the logic value of the "H" level. In the low accuracy delay control circuit shown in FIG. 19, the output of the NOR gate whose inputs are both in the logic value of the "L" level designates the selection position of the delay line. The speed of the change of one of the inputs of this NOR gate to the logic value of the "H" level is slow, and the input of the NOR gate which is in the "H" level and designates next the selection position of the delay line changes to the "L" level at a higher speed. Therefore, the output of the NOR gate, which is to designate next the selection position, designates the selection position, before the output of the NOR gate which has previously designated the selection position stops the designation of the selection position. Therefore, it becomes possible to avoid the state in which none of the NOR gates designate the selection position.

Figure 21:
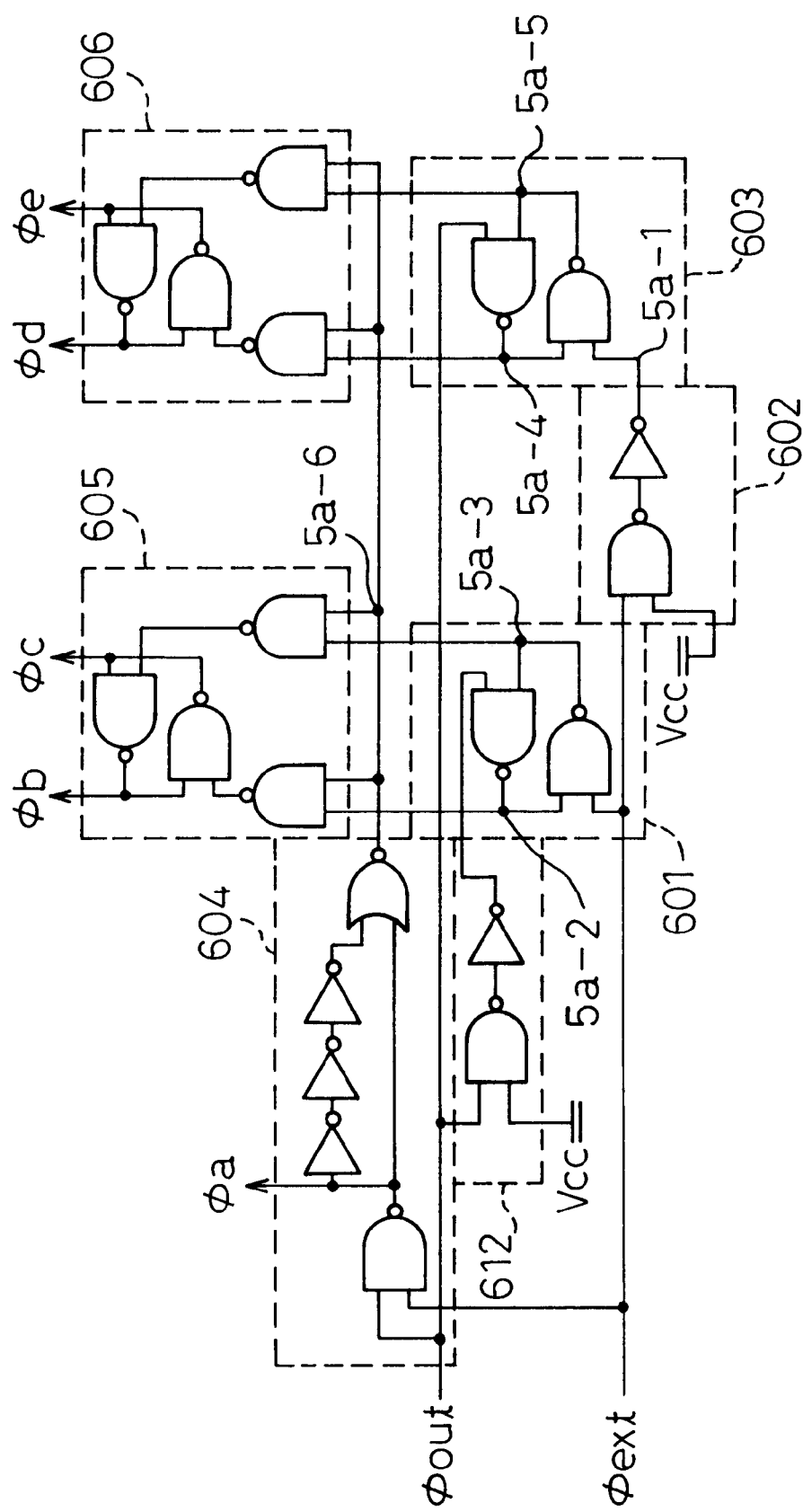
FIG. 21 is a circuit diagram showing a structural example of the low accuracy phase comparing circuit (phase comparing unit) shown in FIG. 7A.
Figure 22A:
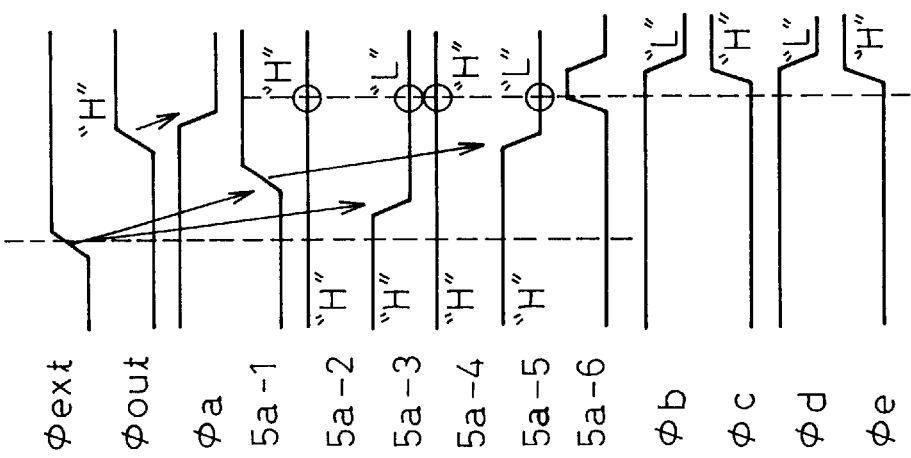
FIGS. 22A, 22B and 22C are timing charts each useful for explaining the operation of the low accuracy phase comparing circuit (phase comparing unit) shown in FIG. 21.
Figure 22B:
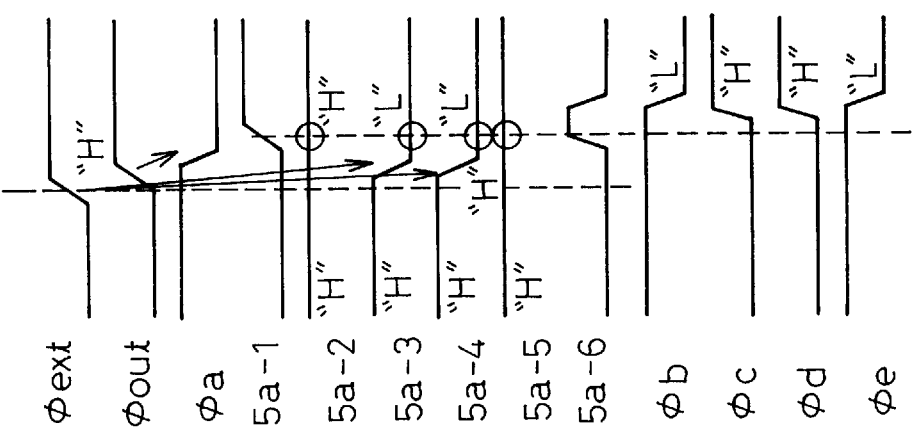
Figure 22C:
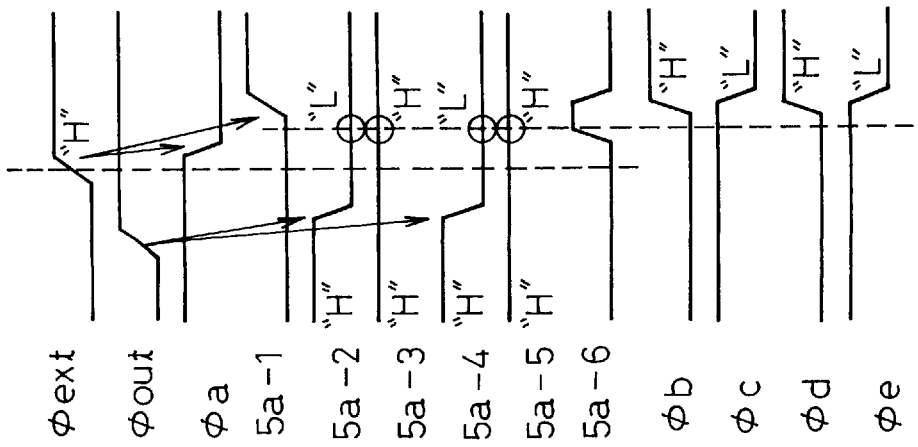
Figure 23:
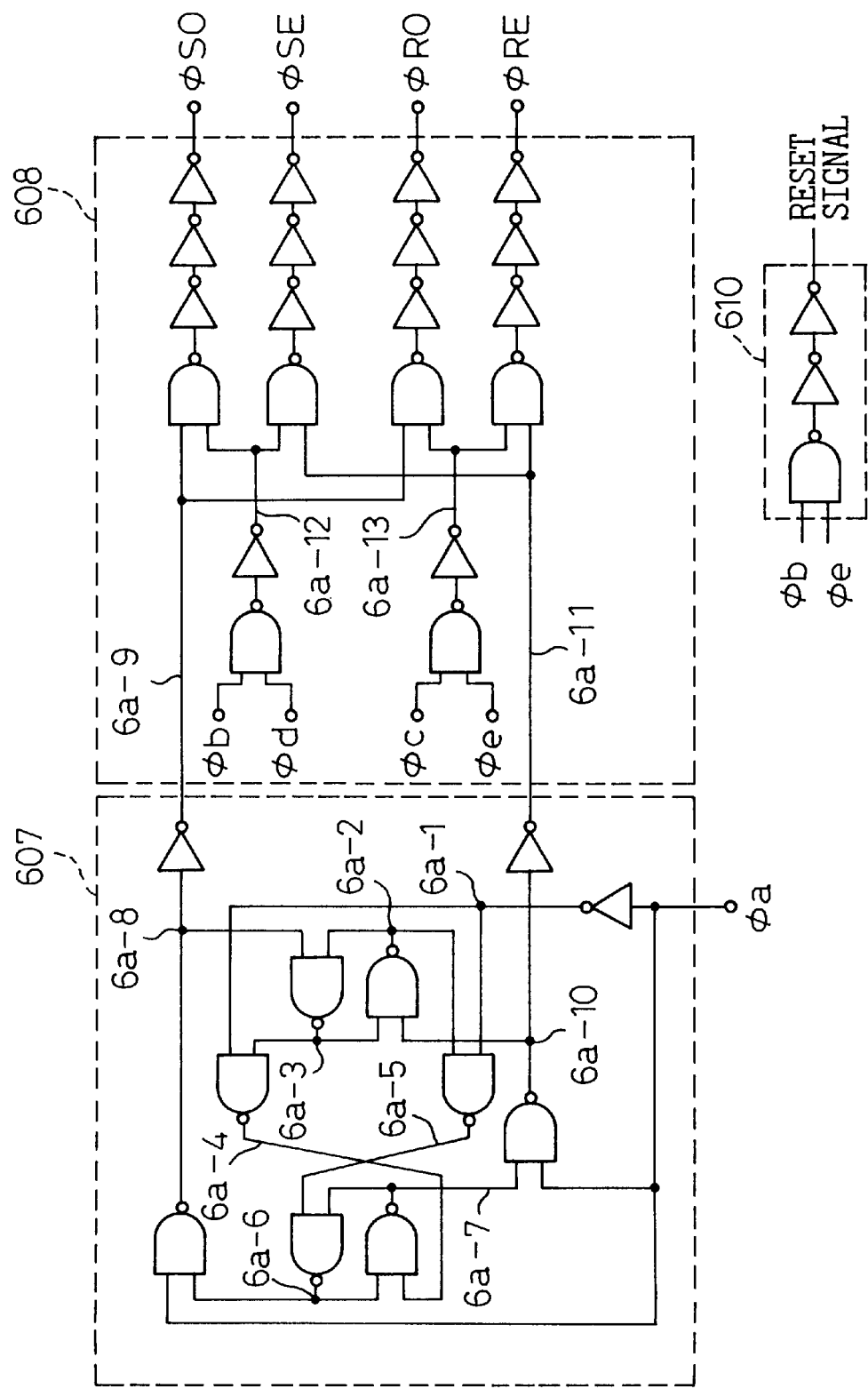
FIG. 23 is a circuit diagram showing a structural example of the low accuracy phase comparing circuit (amplification circuit unit) shown in FIG. 7A.
Figure 24:
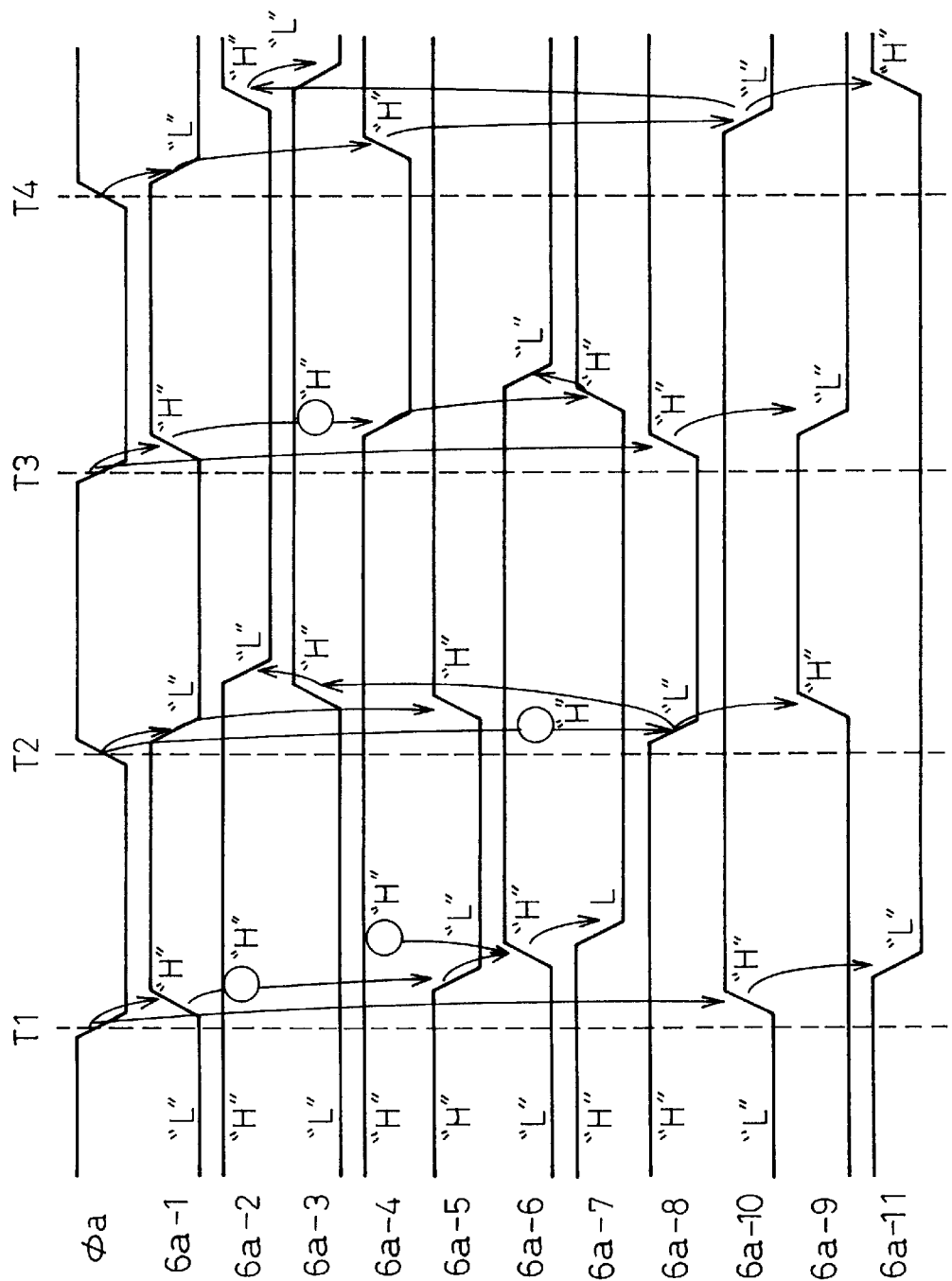
FIG. 24 is a timing chart useful for explaining the operation of the low accuracy phase comparing circuit (JK flip-flop) shown in FIG. 23.
Figure 25:
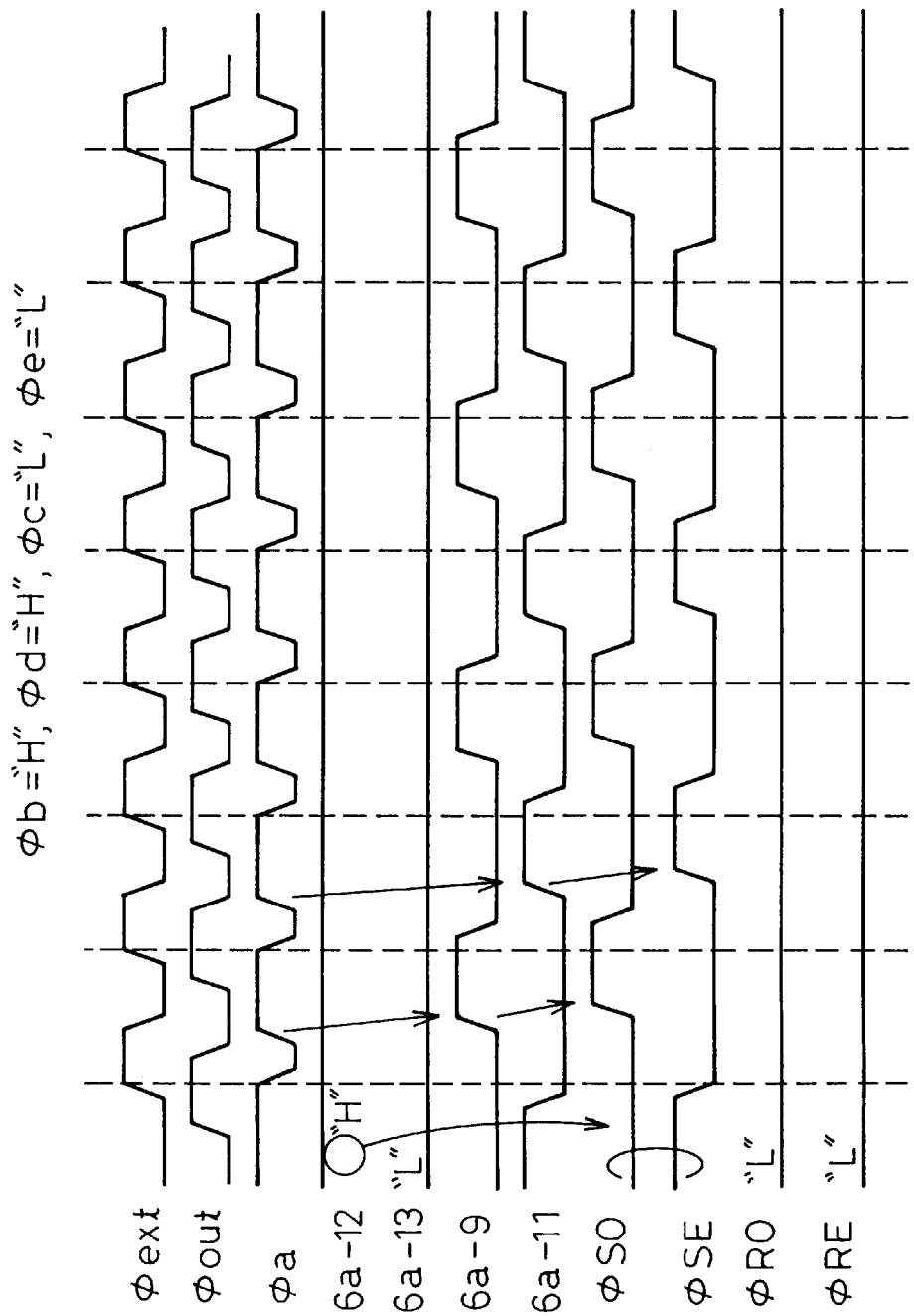
FIG. 25 is a timing chart useful for explaining a count-up operation of the low accuracy phase comparing circuit (amplification unit) shown in FIG. 23.
Figure 26:
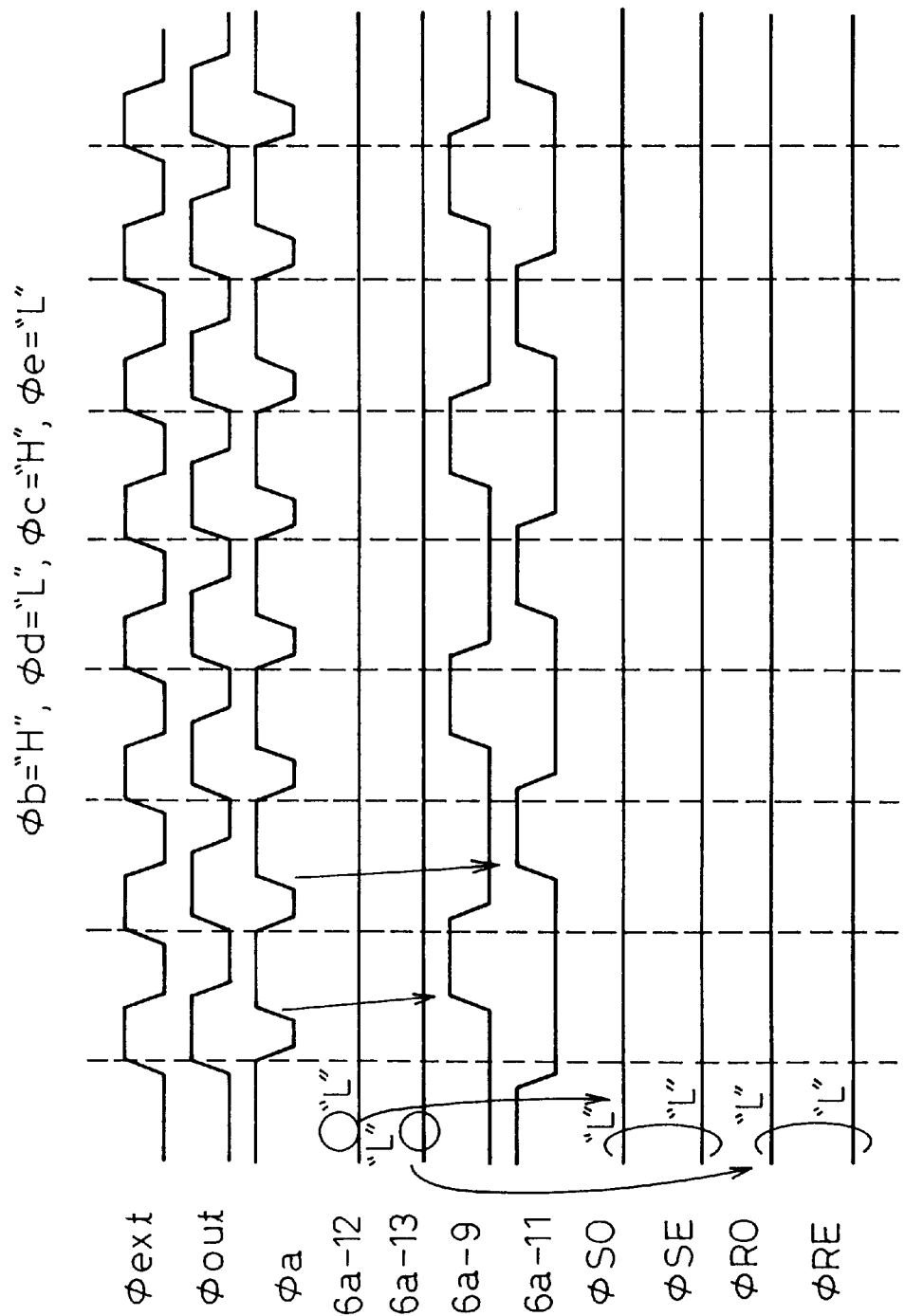
FIG. 26 is a timing chart useful for explaining a count retaining operation of the low accuracy phase comparing circuit (amplification unit) shown in FIG. 23.
Figure 27:
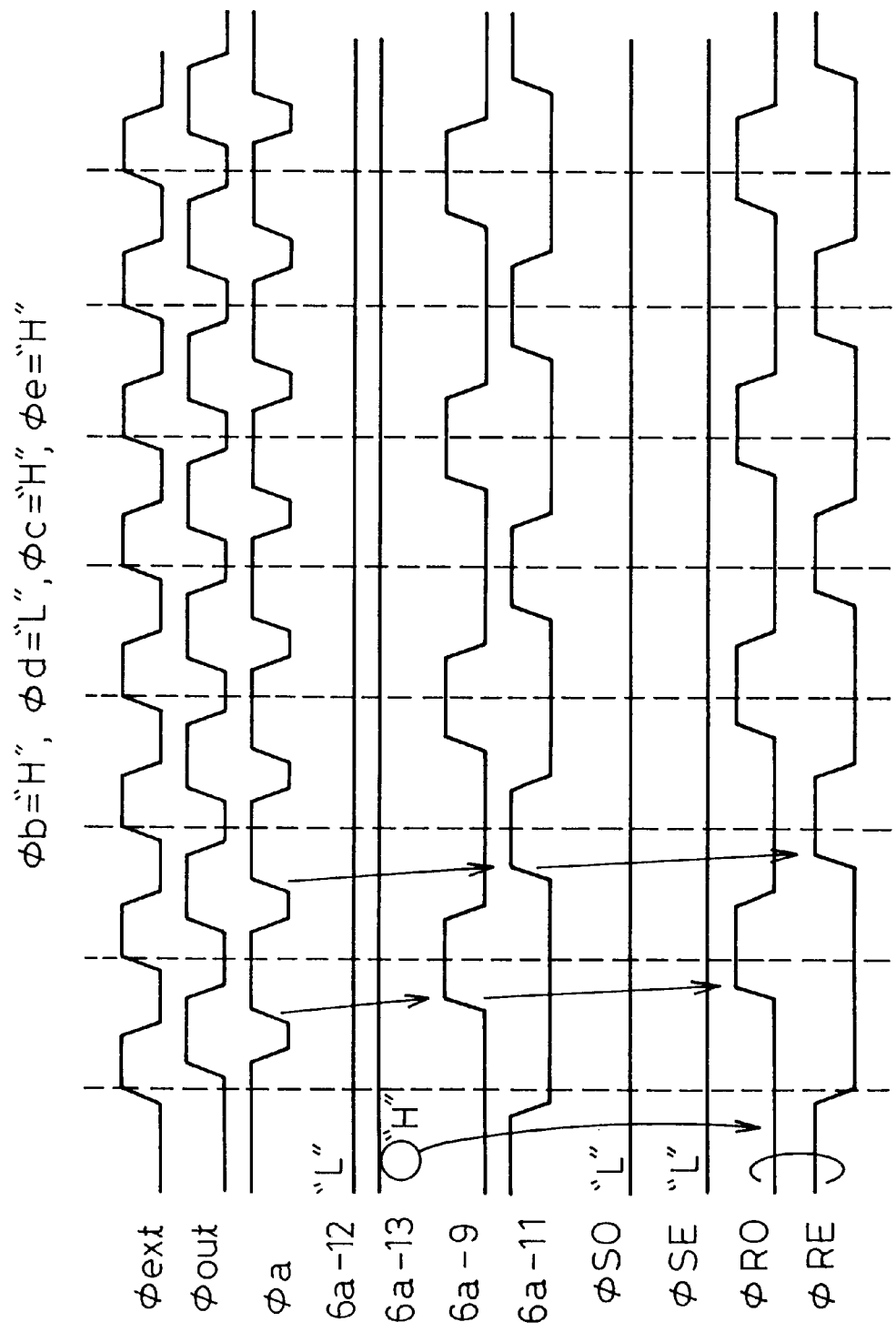
FIG. 27 is a timing chart useful for explaining a count-down operation of the low accuracy phase comparing circuit shown in FIG. 23.

Next, the concrete construction of the low accuracy phase comparing circuit 60 shown in FIG. 7A and the operation thereof will be explained with reference to FIGS. 21 to 27. The low accuracy phase comparing circuit 60 comprises two circuit units, that is, a phase comparing unit and an amplifier unit. More particularly, FIG. 21 is a circuit diagram showing a structural example of the phase comparing unit of the low accuracy phase comparing unit of the low accuracy phase comparing circuit shown in FIG. 7A; FIGS. 22A, 22B and 22C are timing charts useful for explaining the operation of the phase comparing unit of the low accuracy phase comparing circuit shown in FIG. 21; FIG. 23 is a circuit diagram showing a structural example of the amplifier unit of the low accuracy phase comparing unit shown in FIG. 7A; and FIG. 24 is a timing chart useful for explaining the operation of the amplifier unit of the low accuracy phase comparing circuit shown in FIG. 23. Further, FIG. 25 is a timing chart useful for explaining the count-up operation of the amplifier unit of the low accuracy phase comparing circuit shown in FIG. 23; FIG. 26 is a timing chart useful for explaining the count retaining operation of the amplifier unit; and FIG. 27 is a timing chart useful for explaining the count-down operation of the amplifier unit.

In order to explain the general construction of the low accuracy phase comparing circuit and the operation thereof, FIG. 21 expresses the two signals, that are to be compared by the low accuracy phase comparing circuit 60 (FIG. 7A), as the output signal φout (which corresponds to the signal S0 corresponding to the afore-mentioned internal clock signal INCLK) and the clock signal φext (which corresponds to the signal S3 corresponding to the afore-mentioned external clock signal EXCLK).

Here, the phase of the output signal φout is judged with the clock signal φext as the reference, and φa to φe represent the output signals connected to the amplifier unit described above. As shown in FIG. 21, the phase comparing unit inside the low accuracy phase comparing circuit includes flip-flop circuits 601 and 603 each comprising two NAND gates; latch circuits 605 and 606 for latching the state of the NAND gates; a circuit 604 for generating the activation signals of these latch circuits; a delay circuit (which is also called the "delay device") 602 having the delay time of one unit for obtaining the tolerance value concerning the phase of the clock signal φext; and a delay circuit (which is also called the "delay device") 612 for delaying the output signal φout by the delay time of one unit.

Among FIGS. 22A to 22C, FIG. 22A shows the case where the output signal φout as the comparison object signal has the phase which is ahead of the clock signal φext as the reference of comparison, and the output signal φout rises from the "L" level to the "H" level prior to the clock signal φext (at the time of the count-up operation). When both of the output signal φout and the clock signal φext are in the "L" level, the terminals 5a-2, 5a-3, 5a-4 and 5a-5 of the flip-flop circuits 601 and 603 are in the "H" level. When the output signal φout changes from the "L" level to the "H" level, both of the terminals 5a-2 and 5a-4 change from the "H" level to the "L" level. Thereafter, the clock signal φext changes from the "L" level to the "H" level, and the terminal 5a-1 changes from the "L" level to the "H" level, belatedly, by a delay time of one unit. However, since the potentials at both ends of the flip-flop have already been determined, no change occurs.

After this, the terminal 5a-2 keeps the "L" level, the terminal 5a-3 keeps the "H" level, the terminal 5a-4 keeps the "L" level and the terminal 5a-5 keeps the "H" level. On the other hand, the output signal φa of the circuit 604 changes from the "L" level to the "H" level in response to the change of the clock signal φext from the "L" level to the "H" level, and a pulse which temporarily attains the "H" level is applied to the terminal 5a-6. Since the signal of this terminal 5a-6 is inputted to the NAND gates of the latch circuits 605 and 606, these NAND gate circuits are temporarily activated and take the potential state at both ends of the flip-flop circuits 601 and 603 into the latch circuits 605 and 606. Eventually, the output signal φb changes to the "H" level, the output signal φc changes to the "L" level, the output signal φd changes to the "H" level and the output signal φe changes to the "L" level.

FIG. 22B shows the state in which the output signal φout as the comparison object signal and the clock signal φext as the reference of comparison have substantially the same phase and the output signal φout changes from the "L" level to the "H" level substantially simultaneously with the clock signal next (at the time of the count retaining operation). In other words, this time chart shows the case in which the output signal φout changes from the "L" level to the "H" level within the time difference between the timing of the leading edge of the output signal φout and the timing of the leading edge of at the terminal 5a-1. In this case, the clock signal φext changes first from the "L" level to the "H" level and consequently, the terminal 5a-3 of the flip-flop circuit 601 changes from the "L" level to the "H" level but the terminal 3a-1 in the flip-flop circuit 603 remains in the "L" level. Therefore, the terminal 5a-4 changes from the "H" level to the "L" level, on the contrary. Thereafter, the terminal 5a-1 changes from the "H" level to the "L" level but, because the state of the flip-flop circuit 503 has already been determined, no change occurs. Thereafter, since the terminal 5a-6 changes temporarily to the "H" level, the latch circuit stores this state. After all, the output signal φb changes to the "L" level, the output signal φc changes to the "H" level, the output signal φd changes to the "H" level and the output signal φe changes to the "L" level.

Further, FIG. 22C shows the case in which the phase of the output signal φout as the comparison object signal is behind of the phase of the clock signal φext as the comparison reference, and the output signal φout changes from the "L" level to the "H" level after the clock signal φext (at the time of the count-down operation). In this case, the change occurs in the two flip-flop circuits 601 and 603 due to this clock signal φext, and the terminals 5a-3 and 5a-5 change from the "H" level to the "L" level. Finally, the output signal φb changes to the "L" level, the output signal φc changes to the "H" level, the output signal φd changes to the "L" level and the output signal φe changes to the "H" level.

In this way, it becomes possible to detect whether the output signal φout changes to the "H" level before the timing of the leading edge of the clock signal φext, or substantially simultaneously with this timing, or after this timing, in the case in which the timing of the leading edge of the clock signal φext is defined to be the reference timing. The above detection result is latched as the values of the output signals φb, φc, φd and φe, and whether the low accuracy delay control circuit is caused to carry out the count-up operation or the count-down operation is determined on the basis of these values.

FIG. 23 shows the circuit construction of the amplifier unit of the low accuracy phase comparing circuit 60 (see FIG. 7A). Here, the amplifier unit comprises two circuit portions, that is, a JK flip-flop 607 and an amplification portion 608 comprising NAND gates and inverters. The output signal φa is inputted to the JK flip-flop 607 from the phase comparing unit shown in FIG. 21, and the potentials at the terminals 6a-9 and 6a-11 repeat alternately the "L" level and the "H" level depending on whether this output signal φa is in the "L" level or the "H" level. The amplifier unit 608 receives the output signal of the JK flip-flop 607 and the output signals φb to φd of the phase comparing unit, amplifies them and thereafter outputs them.

Further, a logic circuit 610 for generating the reset signal from the output signals φb and φd, comprising one NAND gate and two inverters, is shown at the lower right portion of FIG. 23. When the output signal φout exceeds the range ±td with respect to the clock signal φext as the reference for comparison, the reset signal is in the "H" level, and when the output signal φout falls within the range ±td, the reset signal is in the "L" level.

First, the operation of the JK flip-flop 607 will be explained with reference to the timing chart of FIG. 24. When the output signal φa changes from the "H" level to the "L" level at the time T1, the terminals 6a-1 and 6a-10 change from the "L" level to the "H" level. On the other hand, the change of the stage occurs in the terminals 6a-5, 6a-6 and 6a-7 in response to the change of this terminal 6a-1, but because the output signal φa is in the "L" level, no change occurs at the terminal 6a-8. After all, the output level of the terminal 6a-9 does not change, and only the terminal 6a-11 changes from the "L" level to the "H" level.

Next, when the output signal φa changes from the "L" level to the "H" level at the time T2, the terminal 6a-8 changes from the "H" level to the "L" level, contrary to the operation at the time T1, but the terminal 6a-10 does not change because the terminal 6a-7 does not change. The output 6a-9 changes from the "L" level to the "H" level but the terminal 6a-11 does not change. In this way, after the time T2, too, the terminal 6a-9 and the terminal 6a-11 alternately repeat the "H" level and the "L" level in the JK flip-flop circuit 607 in accordance with the operation of the output signal φa.

Next, the operation of the amplifier unit 608 will be explained with reference to FIGS. 25 to 27. FIG. 25 shows the case in which the output signal φout which is the object of a comparison first changes from the "L" level to the "H" level before the timing of the leading edge of the clock signal φext as the reference for comparison. In this case, the output signal φb supplied from the phase comparing unit is in the "H" level, the output signal φc is in the "L" level, the output signal φd is in the "H" level and the output signal φe is in the "L" level.

After all, the terminal 6a-12 is fixed to the "H" level and the terminal 6a-1 is fixed to the "L" level, and the set signals φSO and φSE change in accordance with the state of the JK flip-flop, but the reset signals φRO and φRE do not change because the terminal 6a-13 is at the "L" level.

FIG. 26 shows the case in which the output signal φout as the comparison object signal changes from the "L" level to the "H" level substantially simultaneously with the clock signal φext as the reference for comparison. In this case, the output signal φb supplied from the phase comparing circuit is at the "L" level, the output signal φc is at the "H" level, and the output signal φe is at the "L" level. After this, the terminals 6a-12 and 6a-13 are fixed to the "L" level, the set signals φSO and φSE are not affected by the amplifier unit, and the output of the JK flip-flop and the set signals φSO and φSE and the reset signals φRO and φRE remain fixed at the "L" level.

FIG. 27 shows the case in which the output signal φout which is the object of a comparison changes from the "L" level to the "H" level before the timing of the rise of the clock signal φext as the reference for comparison. In this case, the output signal φb supplied from the phase comparing unit is at the "L" level, the output signal φc is at the "H" level, the output signal φd is at the "L" level and the output signal φe is at the "H" level. After this, the terminal 6a-12 is fixed to the "L" level, the terminal 6a-13 is fixed to the "H" level and the reset signals φRO and φRE change in accordance with the state of the JK flip-flop but the set signals φSO and φSE do not change because the terminal 6a-13 is in the "L" level.

The description given above has been directed to the case in which the clock phase adjusting circuit of the present invention (particularly, the first clock phase adjusting circuit for rough control) comprises the DLL circuit applied to the high speed memory system such as the SDRAM, etc. However, the present invention is not particularly limited to such a specific circuit construction but can, of course, be applied to semiconductor devices in general.

Figure 28:
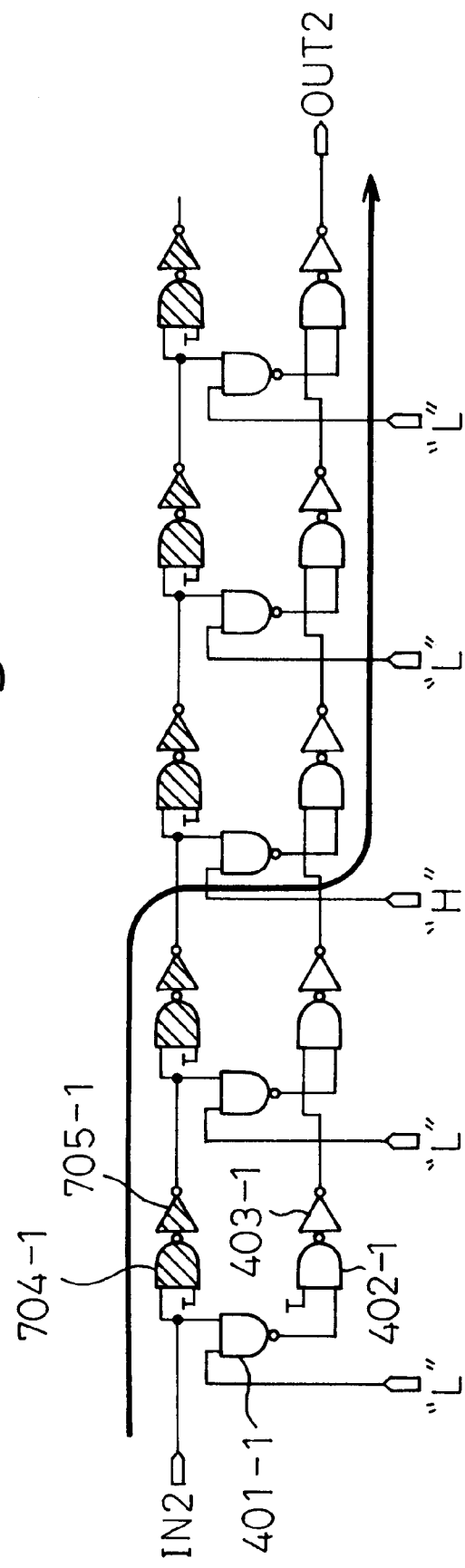
FIG. 28 is a circuit diagram showing a structural example of the high accuracy delay line shown in FIG. 7B.

FIG. 28 is a circuit diagram showing a structural example of the high accuracy delay line. In the high accuracy delay line 32 (or the high accuracy dummy delay line 34), a NAND gate 704-1 and an inverter 705-1 are provided to each stage in addition to the NAND gates 401-1 and 402-1 and the inverter 403-1 shown in FIG. 15C in such a manner as to form two delay lines for each stage. As the logic circuit of the hatched portion, that is, the NAND gate 704-1 and the inverter 705-1, is added, the delay time below the unit delay time of the unit delay element (for example, 200 psec) having the NAND 402-1 and the inverter 403-1 can be controlled. The difference of the delay time between the two unit delay elements disposed for each stage corresponds to the difference between the delay time of the NAND gate 402-1 and the inverter 403-1 and the delay time of the NAND gate 704-1 and the inverter 705-1, and the value corresponding to this difference becomes an accuracy of the high accuracy delay line 32.

In the case of the example shown in the drawing, the input signal IN2 passes through the unit delay elements of the two hatched portions and also passes through the three unit delay elements, and the output signal OUT2 can e obtained. In the case in which only the NAND gate 401 at the extreme right is open, for example, the input signal IN2 passes through the unit delay elements of the three hatched portions and also passes through the two unit delay elements. The difference of the delay time of the output signals in the above two cases corresponds to the difference of the delay time of the two unit delay elements. For example, when the unit delay element comprising the NAND gate 402-1 and the inverter 403-1 has a delay time of 200 psec while the unit delay element comprising the NAND gate 704-1 and the inverter 705-1 has a delay time of 260 psec, the difference of the delay time of 60 psec is an accuracy of the high accuracy delay line 32. Therefore, the delay time can be set to 60 psec, 120 psec, 180 psec and 240 psec by controlling the NAND gate 401 (for example, NAND gate 401-1). Incidentally, since the signal never fails to pass through any one of NAND gates 401 whichever route the signal may take, the delay time caused by the NAND gate 401 is always contained in the signal. In other words, the difference of the delay time is not affected by the delay time of the NAND gate 401.

Various methods may be used to obtain different delay amounts. For example, the NAND gates and the inverter may be constituted by transistors having different characteristics. On the other hand, power source voltages applied to the transistors may be made different from each other although the transistors having different characteristics are used. Further, even when the transistors having the same characteristics and the same power source voltage are used, different delay time can be obtained depending on the difference of fan-out. When the same logic devices in FIG. 28 all have the same characteristics, the fan-out of the inverter 705-1 is 2 but fan-out of the inverter 403-1 is 1. This difference of fan-out provides the difference of the delay time of 60 to 70 psec even when the same logic devices shown in FIG. 28 all have the same characteristics. Incidentally, the high accuracy dummy delay line 34, too, has the same construction as the high accuracy delay line 32.

Figure 29:
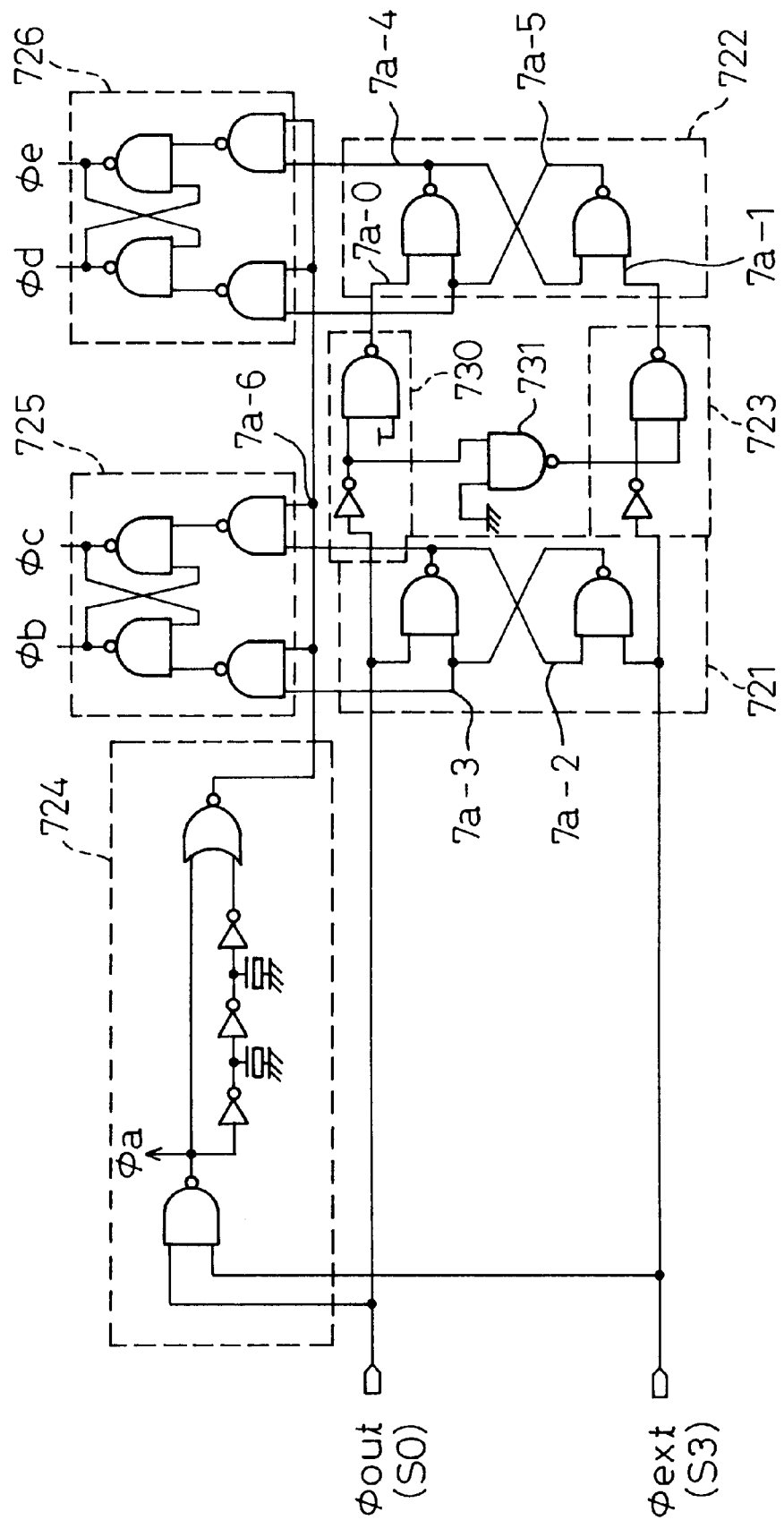
FIG. 29 is a circuit diagram showing a structural example of the high accuracy phase comparing circuit (phase comparing unit) shown in FIG. 7B.

FIG. 29 is a circuit diagram showing a structural example of the phase comparing unit of the high accuracy phase comparing circuit shown in FIG. 7.

The high accuracy phase comparing circuit 36 in the second DLL circuit 20 has the same construction as that of the low accuracy phase comparing circuit 60 shown in FIGS. 20 and 21, with the exception of the following point. The difference of the high accuracy phase comparing circuit 36 from the low accuracy phase comparing circuit 60 is shown in FIG. 29. This drawing shows particularly the phase comparing unit of the high accuracy phase comparing circuit 14. In the construction shown in FIG. 29, the delay circuit (which is called also the "delay device") 730 is interposed between the flip-flop circuits 721 and 722. The NAND gate 731 is interposed between the delay circuits 730 and 723, and the output of the inverter of the delay circuit 730 is inputted to the NAND gate of the delay circuit (which is called also the "delay element") 723, through the NAND gate 731.

Each of the delay circuits 723 and 730 has the same construction as that of the unit delay device of the high accuracy delay line 32. In the construction shown in this drawing, each of the delay circuits 723 and 730 comprises a NAND gate and an inverter. Incidentally, fan-out of the inverter of the delay circuit 723 is 1 whereas fan-out of the inverter of the delay circuit 730 is 2. Because such delay circuits 723 and 730 are interposed between the flip-flop circuits 721 and 722, it becomes possible to judge whether or not the signal S0 (output signal ϕout) and the signal S3 (clock signal ϕext) are within the range of 0 to td'. Since the rest of the constructions inclusive of the phase amplifier circuits, etc., are the same as the constructions shown in FIGS. 21 and 23, a detailed explanation will be omitted.

Figure 30A:
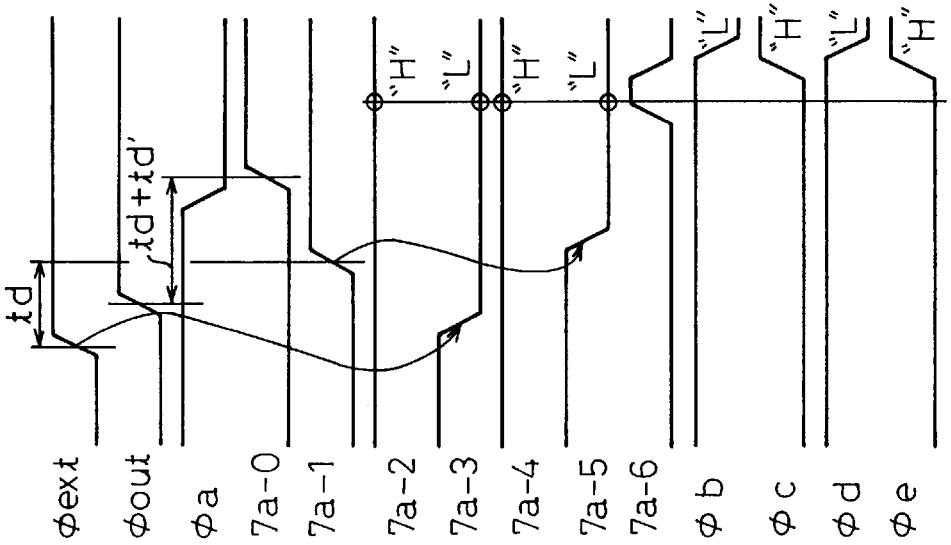
FIGS. 30A, 30B and 30C are timing charts each useful for explaining the operation of the high accuracy phase comparing circuit (phase comparing unit) shown in FIG. 29.
Figure 30B:
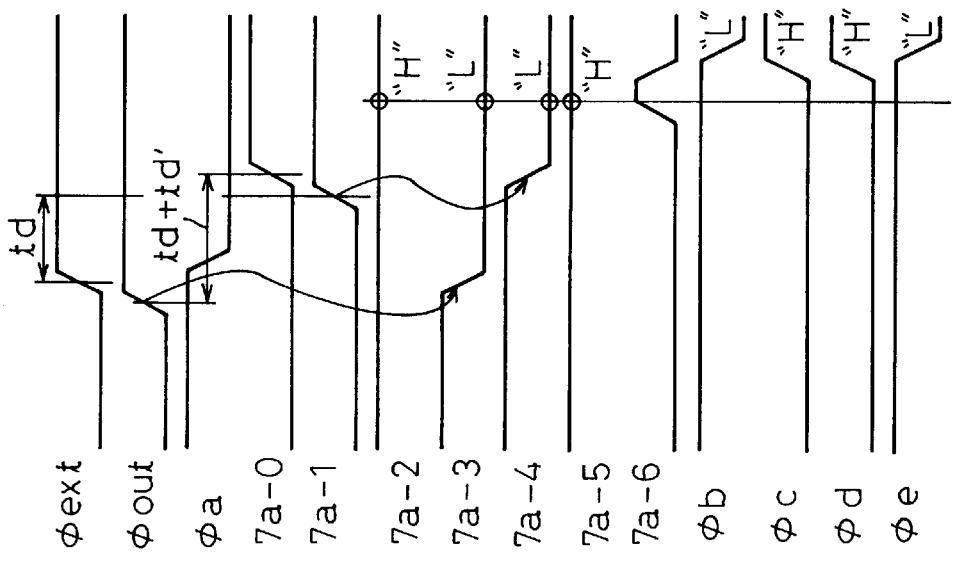
Figure 30C:
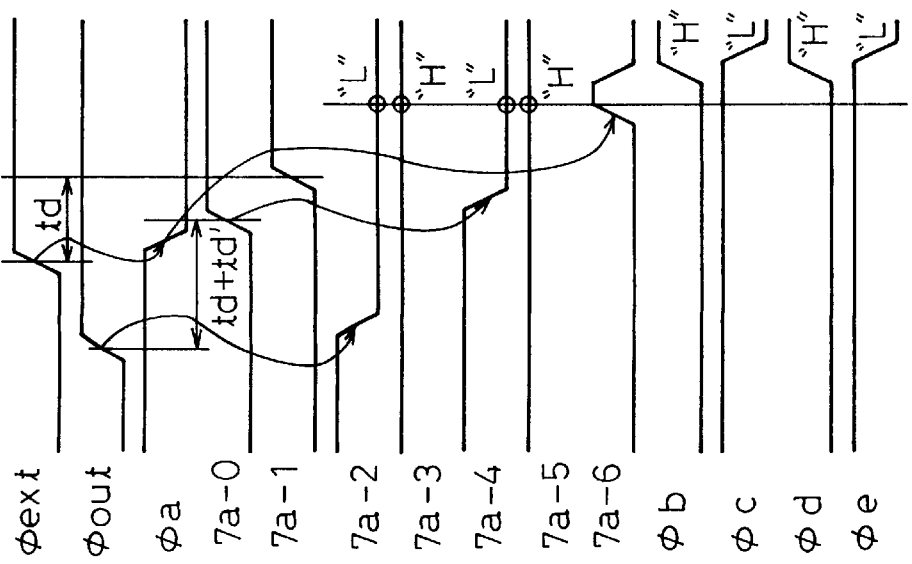

FIGS. 30A, 30B and 30C are timing charts each useful for explaining the operation of the phase comparing unit of the high accuracy phase comparing circuit shown in FIG. 29. FIG. 30A shows the operation at the time of the count-up operation. When the output signal ϕout rises from the "L" level to the "H" level, the terminal 7a-2 changes to the "L" level. The terminal 7a-0 changes to the "H" level belatedly by td+td' from the change of the output signal ϕout due to the operation of the delay circuit 430. Thereafter, the clock signal ϕext changes to the "H" level, and the terminal 7a-1 changes to the "H" level belatedly by the delay time td from the change of the clock signal next due to the operation of the delay circuit 723. Incidentally, the terminals 7a-3 and 7a-5 remain at the "H" level and do not change. Accordingly, ϕb="H", ϕc="L", ϕd="H" and ϕe="L" in response to the potential change of the terminal 7a-6.

FIG. 30B shows the operation at the time of the count retaining operation. As shown in the drawing, when the output signal ϕout and the clock signal ϕext are within the range of 0 to td', ϕb="L", ϕc="H", ϕd="H" and ϕe="L". On the other hand, FIG. 30C shows the operation at the time of the count-down operation. As shown in the drawing, ϕb="L", ϕc="H", ϕd="L" and ϕe="H".

Figure 31:
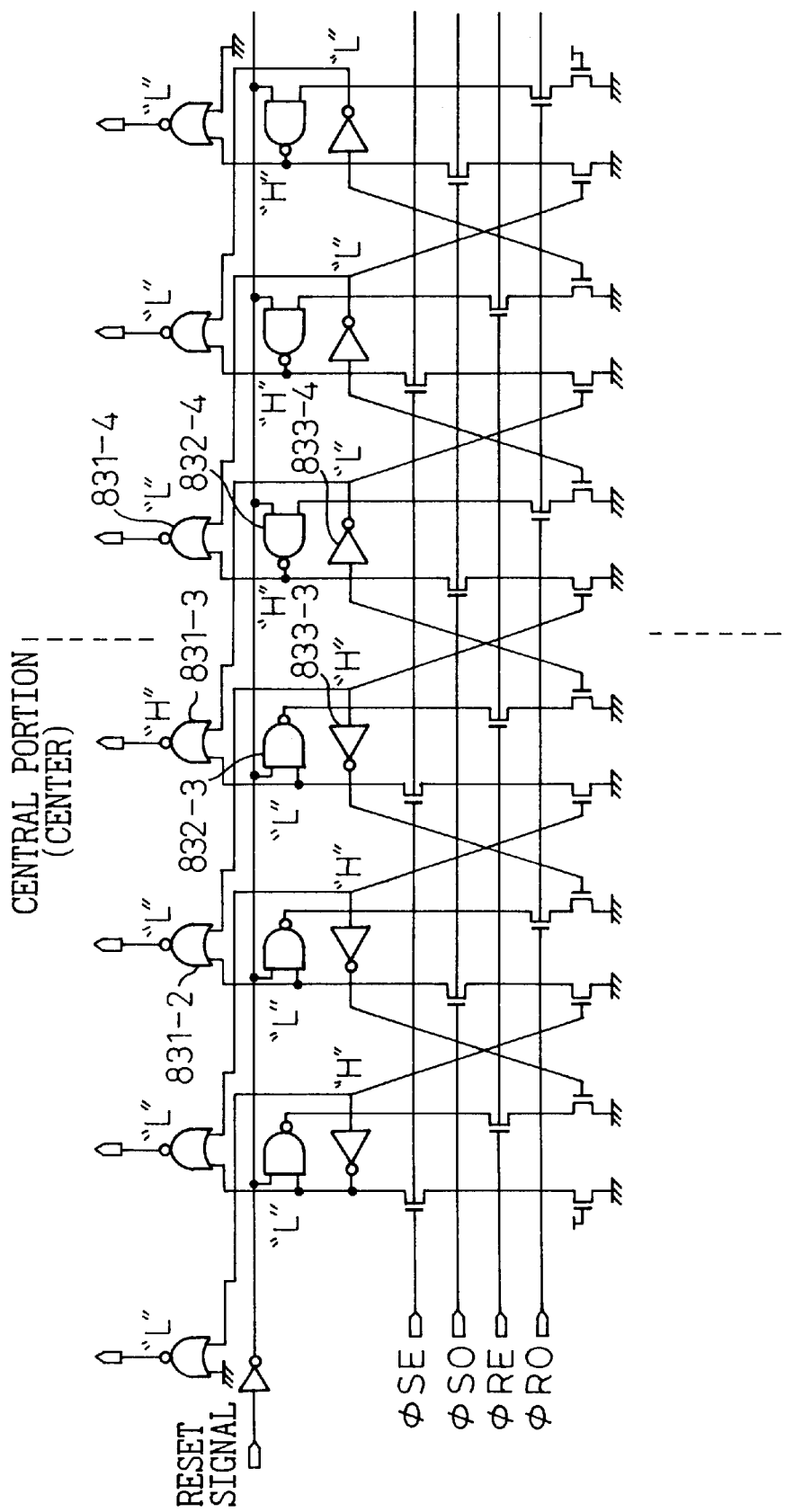
FIG. 31 is a circuit diagram showing a structural example of the high accuracy delay control circuit shown in FIG. 7B.

FIG. 31 is a circuit diagram showing a structural example of the high accuracy delay control circuit shown in FIG. 7B. The left-hand portion from the dash line at the center is substantially the same as the construction of the low accuracy delay control circuit shown in FIG. 19. The right-hand portion from the dash line is somewhat different from the left-hand portion. This is to output the signal of the "H" level to only the corresponding NOR gate so as to reset the high accuracy delay line 32 and the high accuracy dummy delay line 34 when the reset signal is received from the low accuracy phase comparing circuit 60. The output signal of the NAND gate 832-3 on the left side and adjacent to the dash line is inputted to the NOR gate 831-2 of the preceding stage, and the output signal of the inverter 833-3 is inputted to the NOR gate 831-3. The output signal of the NAND gate 832-4 on the right side and adjacent to the dash line is inputted to the NOR gate 831-4, and the output signal of the inverter 833-4 is inputted to the NOR gate 831-3. When the reset signal (RESET TO CENTER) becomes active ("H" level), the level of each terminal is as shown in FIG. 28, and only the NOR gate 831-3 corresponding to the central portion of the high accuracy delay line 32 and the high accuracy dummy delay line 34 outputs the signal of the "H" level while all the other NOR gates output the signals of the "L" level. Incidentally, the shift operation is the same as the shift operation explained with reference to FIGS. 19 and 20.

Figure 32:
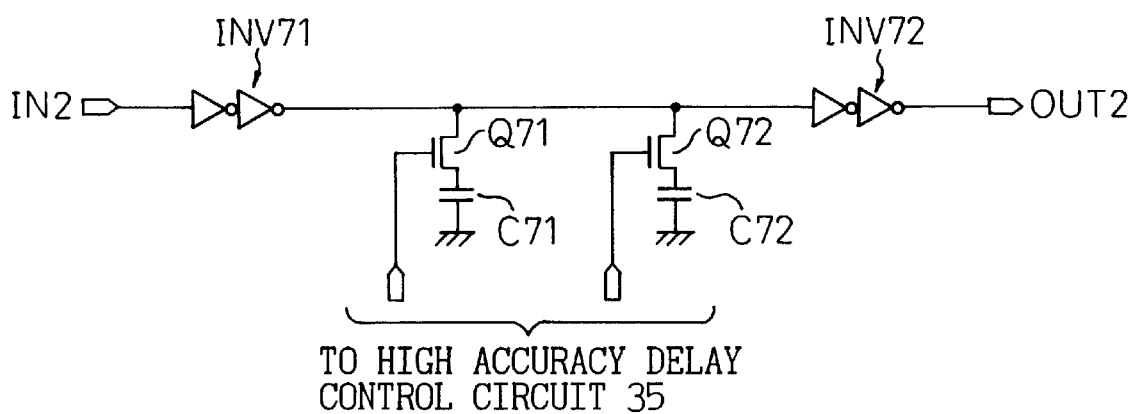
FIG. 32 is a circuit diagram showing another structural example of the high accuracy delay line shown in FIG. 7B.

FIG. 32 is a circuit diagram showing another structural example of the high accuracy delay line shown in FIG. 7. The circuit shown in this drawing has a construction of two stages, and capacitors C71 and C72 are provided as the delay element to these stages, respectively. These capacitors C71 and C72 are selectively connected to the delay line through transistors Q71 and Q72, respectively. The high accuracy delay control circuit 35 controls these transistors Q71 and Q72. For example, a capacitor having a capacitance value of 25 fF ($25 \times 10^{-15}$ Farad) generates the delay time of 50 psec and a capacitor having a capacitance value of 50 fF ($50 \times 10^{-15}$ Farad) generates the delay time of 100 ps. The high accuracy delay line 32 having higher accuracy than the low accuracy delay line 40 can be accomplished by using such capacitors.

As another construction of the high accuracy delay line, the delay time can be made variable, by connecting a plurality of resistors in series with each other, providing a switch for short-circuiting both ends of each resistor and changing the number of the resistors connected in series with each other between the input side and output side. Further, a delay circuit may comprise the combination of such a resistor with the capacitor described above. Incidentally, the final delay time includes the delay time of the inverters INV71 and INV72 shown in FIG. 32.

As described above, the semiconductor device according to the typical embodiments of the present invention provides the following effects. First, in the construction wherein the phase comparisons by the first clock phase adjusting circuit for rough control and the second clock phase adjusting circuit for fine control are carried out mutually independently and the phase control operation of the second clock phase adjusting circuit is subordinate to the operation of the first clock phase adjusting circuit, the delay time generated by each of a plurality of delay elements in the first clock phase adjusting circuit is set to a value larger than a predetermined delay time. Therefore, the operation of a lock-on of the DLL circuits, etc., having a hierarchical structure can be carried out stably.

Second, in the semiconductor device according to the typical embodiments of the present invention, the delay amount generated by each of a plurality of delay elements in the first clock phase adjusting circuit is set to a value larger than a value of the power source jitter resulting from a noise of the power source and the jitter of the external clock signal. Therefore, the stable operation after a lock-on of the DLL circuits, etc., having a hierarchical structure can be ensured without being affected by such power source jitter.

In the third place, in the semiconductor device according to the typical embodiments of the present invention, the delay time of each of a plurality of delay elements is set to a value larger than a predetermined value, by connecting the CR delay circuit having the resistor and the capacitor to the node on the output side of the logic gate constituting each delay element in the first clock phase adjusting circuit. Therefore, the operation after a lock-on of the DLL circuits, etc., having a hierarchical structure can be carried out stably by a simple circuit construction.

In the fourth place, in the semiconductor device according to the typical embodiments of the present invention, the delay time of each of a plurality of delay elements can be set to a value larger than a predetermined value, by connecting the capacitance load to the node on the output side of the logic gate constituting each delay element inside the first clock phase adjusting circuit. Accordingly, the operation after a lock-on of the DLL circuits, etc., having a hierarchical structure can be carried out stably.

In the fifth place, in the semiconductor device according to the typical embodiments of the present invention, the delay time of each of a plurality of delay devices is set to a value larger than a predetermined value, by increasing the channel length of the logic gate constituting each of a plurality of delay elements in the first clock phase adjusting circuit. Therefore, the operation after a lock-on the DLL circuits, etc., having a hierarchical structure can be carried out stably without adding excessive circuit elements.

In the sixth place, in the semiconductor device according to the typical embodiments of the present invention, the delay time of each of a plurality of delay elements is set to a value larger than a predetermined value, by increasing the number of stages of a plurality of delay elements in the first clock phase adjusting circuit. Therefore, the operation after a lock-on of the DLL circuits, etc., having a hierarchical structure can be carried out stably without making the circuit construction complicated.

In the seventh place, in the semiconductor device according to the typical embodiments of the present invention, the second clock phase adjusting circuit receives the reset signal from the first clock phase adjusting circuit and is reset when the first clock phase adjusting circuit controls the delay time, and controls the delay time when the phase of the external clock signal conforms with the phase of the internal clock signal. Therefore, the operation after a lock-on of the DLL circuits, etc., having a hierarchical structure can be carried out stably by utilizing the reset signal described above.

In the eighth place, in the semiconductor device according to the typical embodiments of the present invention, there is provided the dummy circuit portion having the same delay time as the delay time when the second clock phase adjusting circuit is reset, and the signal delay inside the second clock phase adjusting circuit is compensated for by this dummy circuit portion. Therefore, a delay time control by the DLL circuit, etc., having a hierarchical structure can be carried out with relatively high accuracy.

In the ninth place, in the semiconductor device according to the typical embodiments of the present invention, when the second clock phase adjusting circuit controls the delay time within the predetermined range, the first clock phase adjusting circuit supplies to the second clock phase adjusting circuit when a result of the phase comparison by the first clock phase adjusting circuit deviates from this range. Therefore, a digit shift operation of the DLL circuits, etc., having a hierarchical structure can be carried out smoothly.

In the tenth place, in the semiconductor device according to the typical embodiments of the present invention, a value set by a plurality of delay elements inside the second clock phase adjusting circuit is set to the center of the range of the delay time that can be controlled by the delay line comprising these delay elements. Therefore, the stable operation of the DLL circuit for high accuracy delay control can be ensured after a lock-on of the DLL circuits, etc., having a hierarchical structure.

In the eleventh place, in the semiconductor device according to the typical embodiments of the present invention, the difference of the delay time between the first and second delay devices having mutually different delay time is used as an accuracy of the second clock phase adjusting circuit. Therefore, the DLL circuit for relatively high accuracy delay control can be accomplished by a simple circuit construction.

In the twelfth place, in the semiconductor device according to the typical embodiments of the present invention, the first clock phase adjusting circuit for rough delay time control executes the phase comparison between the external clock signal and the internal clock signal, and the first clock phase adjusting circuit having high accuracy, too, executes the phase comparison between the external clock signal and the internal clock signal. Therefore, the DLL circuit for controlling the delay time with relatively high accuracy can be accomplished by using the above two kinds of phase comparisons.

In the thirteenth place, in the semiconductor device according to the preferred embodiments of the present invention, the first clock phase adjusting circuit executes the phase comparison by the combination of two flip-flops. Therefore, the delay time control of the external clock signal can be carried out stably by a simple circuit construction.

More preferably, in the fourteenth place, in the semiconductor device according to the preferred embodiments of the present invention, each of the two flip-flops for phase comparison inside the first clock phase adjusting circuit has two NAND gates, and outputs a result of the phase comparison by utilizing the non-inversion output and the inversion output of these NAND gates. Therefore, the phase difference between the external clock signal and the internal clock signal can be correctly detected by a simple circuit construction.

What is claimed is:

1. A semiconductor device comprising:
    a first clock phase adjusting circuit for adjusting the phase of an external clock signal, and generating an internal clock signal delayed by a predetermined phase from said external clock signal; and
    a second clock phase adjusting circuit for controlling the phase of said internal clock signal with higher accuracy than said first clock phase adjusting circuit;
    wherein said first clock phase adjusting circuit includes a plurality of delay elements; and
    wherein a delay time generated by each of a plurality of said delay elements in said first clock phase adjusting circuit is set to a value larger than a value of jitter of said internal clock signal.

2. A semiconductor device according to claim 1, wherein said first clock phase adjusting circuit includes delay amount adjusting means for setting the delay time generated by each of a plurality of said delay elements in said first clock phase adjusting circuit to a value larger than a value of jitter of said internal clock signal generated by at least one of a noise of a power source and jitter of said external clock signal.

3. A semiconductor device according to claim 2, wherein each of a plurality of said delay elements in said first clock phase adjusting circuit includes at least one logic gate, said delay amount adjusting means in said first clock phase adjusting circuit includes a CR delay circuit having a resistor and a capacitor, and said CR delay circuit is connected to a node on the output side of said logic gate so that the delay time generated by each of a plurality of said delay elements can be set to a value larger than a value of jitter of said internal clock signal.

4. A semiconductor device according to claim 2, wherein each of a plurality of said delay devices inside said first clock phase adjusting circuit includes at least one logic gate, said delay amount adjusting means inside said first clock phase adjusting circuit has a capacitance load having a predetermined capacitance value, and said capacitance load is connected to a node on the output side of said logic gate so that the delay time generated by each of a plurality of said delay elements can be set to a value larger than a value of jitter of said internal clock signal.

5. A semiconductor device according to claim 2, wherein said second clock phase adjusting circuit receives a reset signal from said first clock phase adjusting circuit and is reset when said first clock phase adjusting circuit controls said delay time, and said second clock phase adjusting circuit can control said delay time when the phase of said external clock signal, which is as an object of a phase comparison in said first clock phase adjusting circuit, conforms with the phase of said internal clock signal.

6. A semiconductor device according to claim 5, wherein each of said first and second clock phase adjusting circuits includes a first route through which said external clock signal passes and a second route for executing a phase comparison with said first route, and said second route includes a dummy circuit portion having the same delay time as the delay time generated when said second clock phase adjusting circuit is reset.

7. A semiconductor device according to claim 2, wherein, when an accuracy determined by the delay time of each of a plurality of said delay elements inside said first clock phase adjusting circuit is td, said second clock phase adjusting circuit can control a delay time within the range of ±td, and when a result of a phase comparison result by said first clock phase adjusting circuit deviates from the range of ±td, said first clock phase adjusting circuit supplies the reset signal to said second clock phase adjusting circuit and set the delay time of said second clock phase adjusting circuit to a predetermined value.

8. A semiconductor device according to claim 7, wherein each of said first and second clock phase adjusting circuits includes a first route through which said external clock signal passes and a second route for executing a phase comparison with said first route, and said second route includes a dummy circuit portion having the same delay time as the delay time generated when said second clock phase adjusting circuit is reset.

9. A semiconductor device according to claim 7, wherein said second clock phase adjusting circuit includes a delay line comprising a plurality of said delay elements, and a predetermined value set by a plurality of said delay elements in said second clock phase adjusting circuit corresponds to the center of the range of the delay time that can be controlled by said delay line.

10. A semiconductor device according to claim 2, wherein said second clock phase adjusting circuit includes first and second delay elements having the delay time mutually different, said second delay element has the delay time larger than said first delay element, and the difference of the delay time between said first delay element and second delay element is used as an accuracy of said second clock phase adjusting circuit.

11. A semiconductor device according to claim 2, wherein said first clock phase adjusting circuit compares the phase of the signal obtained by delaying the first clock signal obtained from said external clock signal by a first delay element with the phase of the second clock signal obtained from said internal clock signal, and further compares the phase of said first clock signal with the phase of the signal obtained by delaying said second clock signal by a second delay element, and outputs a result of a phase comparison between said external clock signal and said internal clock signal.

12. A semiconductor device according to claim 11, wherein said first clock phase adjusting circuit includes first and second flip-flops; said first flip-flop inputs the signal obtained by delaying said first clock signal by said first delay element, and said second clock signal, to a set terminal and to a reset terminal, respectively; said second flip-flop inputs the signal obtained by delaying said second clock signal by said second delay element, and said first clock signal, to a set terminal and to a reset terminal, respectively; and a result of a phase comparison between said external clock signal and said internal clock signal is outputted by the combination of said first and second flip-flops.

13. A semiconductor device according to claim 11, wherein each of said first and second flip-flops includes first and second NAND gates, the first input of said NAND gate is a set terminal, the second input of said first NAND gate is a reset terminal, and the second input of said second NAND gate is connected to the output of said 0 first NAND gate and becomes an inversion output.

14. A semiconductor device according to claim 11, wherein each of said first and second flip-flops includes first and second NAND gates; the second input of said first NAND gate is a set terminal; the first input of said first NAND gate is connected to the output of said second NAND gate and becomes a non-inversion output; the second input of said second NAND gate is a reset terminal; and the first input of said second NAND gate is connected to the output of said first NAND gate and becomes an inversion output.

15. A semiconductor device according to claim 2, wherein said second clock phase adjusting circuit includes first and second flip-flops; first and second delay elements are interposed between said first and second flip-flops; said first flip-flop inputs the first clock signal obtained from said external clock signal, and the second clock signal obtained from said internal clock signal, to a set terminal and to a reset terminal, respectively; said second flip-flop inputs the signal obtained by delaying said second clock signal by said second delay element, and the signal obtained by delaying said first clock signal by said first delay element, to a set terminal and to a reset terminal, respectively; and a result of a phase comparison between said external clock signal and said internal clock signal is outputted by the combination of said first and second flip-flops.

16. A semiconductor device according to claim 15, wherein said fifth delay element comprises a third NAND gate and a first inverter; said sixth delay element comprises a fourth NAND gate and a second inverter; a fifth NAND gate is interposed between said fifth and sixth delay elements; and the output of said second inverter in said sixth delay element is connected to the input of said third NAND gate in said fifth delay element, through said fifth NAND gate.

17. A semiconductor device according to claim 1, wherein each of a plurality of said delay elements in said first clock phase adjusting circuit includes at least one logic gate, and a CR delay circuit having a resistor and a capacitor is connected to a node on the output side of said logic gate so that the delay time generated by each of a plurality of said delay elements can be adjusted to a value larger than a predetermined value.

18. A semiconductor device according to claim 17, wherein said second clock phase adjusting circuit receives a reset signal from said first clock phase adjusting circuit and is reset when said first clock phase adjusting circuit controls said delay time, and said second clock phase adjusting circuit can control said delay time when the phase of said external clock signal, which is an object of a phase comparison in said first clock phase adjusting circuit, conforms with the phase of said internal clock signal.

19. A semiconductor device according to claim 18, wherein each of said first and second clock phase adjusting circuits includes a first route through which said external clock signal passes and a second route for executing a phase comparison with said first route, and said second route includes a dummy circuit portion having the same delay time as the delay time generated when said second clock phase adjusting circuit is reset.

20. A semiconductor device according to claim 17, wherein, when an accuracy of the delay time determined by each of a plurality of said delay elements inside said first clock phase adjusting circuit is td, said second clock phase adjusting circuit can control the delay time within the range ±td, and said first clock phase adjusting circuit supplies a reset signal to said second clock phase adjusting circuit when a result of a phase comparison by said first clock phase adjusting circuit deviates from the range ±td and set the delay time of said second clock phase adjusting circuit to a predetermined value.

21. A semiconductor device according to claim 20, wherein each of said first and second clock phase adjusting circuit includes a first route through which said external clock signal passes and a second route for executing a phase comparison with said first route, and said second route includes a dummy circuit portion having the same delay time as the delay time generated when said second clock phase adjusting circuit is reset.

22. A semiconductor device according to claim 20, wherein said second clock phase adjusting circuit includes a delay line comprising a plurality of delay elements, and a predetermined value set by a plurality of said delay elements in said second clock phase adjusting circuit corresponds to the center of the range of the delay time that can be controlled by said delay line.

23. A semiconductor device according to claim 17, wherein said second clock phase adjusting circuit includes first and second delay elements having the delay time mutually different, said second delay element has the delay time larger than said first delay device, and the difference of the delay time between said first delay element and said second delay element is used as an accuracy of said second clock phase adjusting circuit.

24. A semiconductor device according to claim 17, wherein said first clock phase adjusting circuit compares the phase of the signal obtained by delaying the first clock signal obtained from said external clock signal by a first delay element with the phase of the second clock signal obtained from said internal clock signal, and further compares the phase of said first clock signal with the phase of the signal obtained by delaying said second clock signal by a second delay element, and outputs a result of a phase comparison between said external clock signal and said internal clock signal.

25. A semiconductor device according to claim 24, wherein said first clock phase adjusting circuit includes first and second flip-flops; said first flip-flops inputs the signal obtained by delaying said first clock signal by said of delay element, and said second clock signal, to a set terminal and to a reset terminal, respectively; said second flip-flop inputs the signal obtained by delaying said second clock signal by said second delay element, and said first clock signal, to a set terminal and to a reset terminal, respectively; and a result of a phase comparison between said external clock signal and said internal clock signal is outputted by the combination of said first and second flip-flops.

26. A semiconductor device according to claim 24, wherein each of said first and second flip-flops includes first and second NAND gates; the first input of said first NAND gate is a set terminal; the second input of said first NAND gate is connected to the output of said second NAND gate and becomes a non-inversion output; the first input of said second NAND gate is a reset terminal; and the second input of said second NAND gate is connected to the output of said first NAND gate and becomes an inversion output.

27. A semiconductor device according to claim 24, wherein each of said first and second flip-flops includes first and second NAND gates; the second input of said first NAND gate is a set terminal; the first input of said first NAND gate is connected to the output of said second NAND gate and becomes a non-inversion output; the second input of said second NAND gate is a reset terminal; and the first input of said second NAND gate is connected to the output of said first NAND gate and becomes a non-inversion output.

28. A semiconductor device according to claim 17, wherein said second clock phase adjusting circuit includes first and second flip-flops; first and second delay elements are interposed between said first and second flip-flops; said first flip-flop inputs the first clock signal obtained from said external clock signal, and the second clock signal obtained from said internal clock signal, to a set terminal and to a reset terminal, respectively; said second flip-flop inputs the signal obtained by delaying said second clock signal by said second delay element, and the signal obtained by delaying said first clock signal by said first delay element, to a set terminal and to a reset terminal, respectively; and a result of a phase comparison between said external clock signal and said internal clock signal is outputted by the combination of said third and fourth flip-flops.

29. A semiconductor device according to claim 28, wherein said first delay element comprises a first NAND gate and a first inverter, said second delay element comprises a second NAND gate and a second inverter, a third NAND gate is interposed between said first and second delay elements, and the output of said second inverter in said second delay element is connected to the input of said first NAND gate in said first delay element, through said third NAND gate.

30. A semiconductor device according to claim 1, wherein each of a plurality of said delay elements in said first clock phase adjusting circuit includes at least one logic gate, and a capacitance load having a predetermined capacitance value is connected to a node on the output side of said logic gate so that the delay time generated by each of a plurality of said delay elements can be adjusted to a value larger than a predetermined value.

31. A semiconductor device according to claim 30, wherein said second clock phase adjusting circuit receives a reset signal from said first clock phase adjusting circuit and is reset when said first clock phase adjusting signal controls said delay time, and said second clock phase adjusting circuit can control said delay time when the phase of said external clock signal, which is an object of a phase comparison in said first clock phase adjusting circuit, conforms with the phase of said internal clock signal.

32. A semiconductor device according to claim 30, wherein, when an accuracy determined by the delay time of each of a plurality of said delay elements in said first clock phase adjusting circuit is td, said second clock phase adjusting circuit can control the delay time within the range ±td, and when a result of a phase comparison by said clock phase adjusting circuit deviates from the range ±td, said first clock phase adjusting circuit supplies the reset signal to said second clock phase adjusting circuit and set the delay time of said second clock phase adjusting circuit to a predetermined value.

33. A semiconductor device according to claim 30, wherein said second clock phase adjusting circuit includes first and second delay elements each having the delay time mutually different, said second delay device has a delay time larger than said first delay element, and the difference of the delay time between said first delay element and second delay element is used as an accuracy of said second clock phase adjusting circuit.

34. A semiconductor device according to claim 30, wherein said first clock phase adjusting circuit compares the phase of the signal obtained by delaying the first clock signal obtained from said external clock signal by a first delay element with the phase of the second clock signal obtained from said internal clock signal, and further compares the phase of said first clock signal with the phase of the signal obtained by delaying said second clock signal by a second delay element, and outputs a result of a phase comparison between said external clock signal and said internal clock signal.

35. A semiconductor device according to claim 30, wherein said second clock phase adjusting circuit includes first and second flip-flops; first and second delay elements are interposed between said first and second flip-flops; said first flip-flop inputs the first clock signal obtained from said external clock signal, and the second clock signal obtained from said internal clock signal, to a set terminal and to a reset terminal, respectively; said second flip-flop inputs the signal obtained by delaying said second clock signal by said second delay element, and the signal obtained by delaying said first clock signal by said first delay element, to a set terminal and to a reset terminal, respectively; and a result of a phase comparison between said external clock signal and said internal clock signal is outputted by the combination of said first and second flip-flops.

36. A semiconductor device according to claim 1, wherein each of a plurality of said delay elements in said first clock phase adjusting circuit includes at least one logic gate, and the delay time generated by each of a plurality of said delay elements is adjusted to a value larger than a predetermined value by increasing a channel length of said logic gate.

37. A semiconductor device according to claim 36, wherein said second clock phase adjusting circuit receives a reset signal from said first clock phase adjusting circuit and is reset when said first clock phase adjusting circuit controls said delay time, and said second clock phase adjusting circuit can control said delay time when the phase of said external clock signal, which is an object of a phase comparison in said first clock phase adjusting circuit, conforms with the phase of said internal clock signal.

38. A semiconductor device according to claim 36, wherein, when an accuracy determined by the delay time of each of a plurality of delay elements inside said first clock phase adjusting circuit is td, said second clock phase adjusting circuit can control the delay time within the range ±td, and when a result of a phase comparison by said first clock phase adjusting circuit deviates from the range ±td, said first clock phase adjusting circuit supplies the reset signal to said second clock phase adjusting circuit and set the delay time of said second clock phase adjusting circuit to a predetermined value.

39. A semiconductor device according to claim 36, wherein said second clock phase adjusting circuit includes first and second delay elements having the delay time mutually different, said second delay element has the delay time larger than said first delay time, and the difference of the delay time between said first delay device and said second delay elements is used as an accuracy of said second clock phase adjusting circuit.

40. A semiconductor device according to claim 36, wherein said first clock phase adjusting circuit compares the phase of the signal obtained by delaying the first clock signal obtained from said external clock signal by a first delay element with the phase of the second clock signal obtained from said internal clock signal, and further compares the phase of said first clock signal with the phase of the signal obtained by delaying said second clock signal by a second delay element, and outputs a result of a phase comparison between said external clock signal and said internal clock signal.

41. A semiconductor device according to claim 36, wherein said second clock phase adjusting circuit includes first and second flip-flops; first and second delay elements are interposed between said first and second flip-flops; said first flip-flop inputs the first clock signal obtained from said external clock signal, and the second clock signal obtained from said internal clock signal to a set terminal and to a reset terminal, respectively; said second flip-flop inputs the signal obtained by delaying said second clock signal by said second delay element, and the signal obtained by delaying said first clock signal by said first delay element, to a set terminal and to a reset terminal, respectively; and a result of a phase comparison between said external clock signal and said internal clock signal is outputted by the combination of said first and second flip-flops.

42. A semiconductor device according to claim 1, wherein the delay time generated by each of a plurality of said delay elements is adjusted to a value larger than a predetermined value by increasing the number of stages of a plurality of said delay elements in said first clock phase adjusting circuit.

43. A semiconductor device according to claim 42, wherein said second clock phase adjusting circuit receives the reset signal from said first clock phase adjusting circuit and is reset when said first clock phase adjusting circuit controls said delay time, and said second clock phase adjusting circuit can control said delay time when the phase of said external clock signal, which is an object of a phase comparison in said first clock phase adjusting circuit, conforms with the phase of said internal clock signal.

44. A semiconductor device according to claim 43, wherein each of said first and second clock phase adjusting circuits includes a first route through which said external clock signal passes and a second route for executing a phase comparison with said first route, and said second route includes a dummy circuit portion having the same delay time as the delay time generated when said second clock phase adjusting circuit is reset.

45. A semiconductor device according to claim 42, wherein, when an accuracy determined by the delay time of each of a plurality of said delay devices inside said first clock phase adjusting circuit is td, said second clock phase adjusting circuit can control the delay time within the range ±td, and when a result of a phase comparison by said first clock phase adjusting circuit deviates from the range ±td, said first clock phase adjusting circuit supplies the reset signal to said second clock phase adjusting circuit and set the delay time of said second clock phase adjusting circuit to a predetermined value.

46. A semiconductor device according to claim 45, wherein each of said first and second clock phase adjusting circuits includes a first route through which said external clock signal passes and a second route for executing a phase comparison with said first route, and said second route includes a dummy circuit having the same delay time as the delay time generated when said second clock phase adjusting circuit is reset.

47. A semiconductor device according to claim 45, wherein said second clock phase adjusting circuit includes a delay line comprising a plurality of said delay elements, and a predetermine value set by a plurality of said delay elements in said second clock phase adjusting circuit corresponds to the center of the range of the delay time that can be controlled by said delay line.

48. A semiconductor device according to claim 42, wherein said second clock phase adjusting circuit includes first and second delay elements each having the delay time mutually different, said second delay element has the delay time larger than said first delay element, and the difference of the delay time between said first delay element and second delay element is used as an accuracy of said second clock phase adjusting circuit.

49. A semiconductor device according to claim 42, wherein said first clock phase adjusting circuit compares the phase of the signal obtained by delaying the first clock signal obtained from said external clock signal by a first delay element with the phase of the second clock signal obtained from said internal clock signal, and further compares the phase of said first clock signal with the phase of the signal obtained by delaying said second clock signal by a second delay element, and outputs a result of a phase comparison between said external clock signal and said internal clock signal.

50. A semiconductor device according to claim 49, wherein said first clock phase adjusting Circuit includes first and second flip-flops; said first flip-flop inputs the signal obtained by delaying said first clock signal by said third delay element, and said second clock signal, to a set terminal and to a reset terminal, respectively; said second flip-flop inputs the signal obtained by delaying said second clock signal by said fourth delay element, and said first-clock signal, to a set terminal and to a reset terminal, respectively; and a result of a phase comparison between said external clock signal and said internal clock signal is outputted by the combination of said first and second flip-flops.

51. A semiconductor device according to claim 49, wherein each of said first and second flip-flops includes first and second NAND gates, the first input of said first NAND gate is a set terminal, the second input of said first NAND gate is connected to the output of said second NAND gate and becomes a non-inversion output, the first input of said second NAND gate is a reset terminal, and the second input of said second NAND gate is connected to the output of said first NAND gate and becomes an inversion output.

52. A semiconductor device according to claim 49, wherein each of said first and second flip-flops includes first and second NAND gates, the second input of said first NAND gate is a set terminal, the first input of said first NAND gate is connected to the output of said second NAND gate and becomes a non-inversion output, the second input of said second NAND gate is a reset terminal, and the first input of said second NAND gate is connected to the output of said first NAND gate and becomes an inversion output.

53. A semiconductor device according to claim 42, wherein said second clock phase adjusting circuit includes first and second flip-flops; first and second delay elements are interposed between said first and second flip-flops; said first flip-flop inputs the first clock signal obtained from said external clock signal, and the second clock signal obtained from said internal clock signal, to a set terminal and to a reset terminal, respectively; said second flip-flop inputs the signal obtained by delaying said second clock signal by said second delay element, and the signal obtained by delaying said first clock signal by said first delay element, to a set terminal and to a reset terminal, respectively; and a result of a phase comparison between said external clock signal and said internal clock signal is outputted by the combination of said external clock signal and said internal clock signal.

54. A semiconductor device according to claim 53, wherein said first delay element comprises a first NAND gate and a first inverter, said second delay element comprises a second NAND gate and a second inverter, a third NAND gate is interposed between said first and second delay elements, and the output of said second inverter in said second delay element is connected to the input of said first NAND gate in said first delay element, through said third NAND gate.

55. A semiconductor device according to claim 1, wherein said second clock phase adjusting circuit receives a reset signal and is reset when said first clock phase adjusting circuit controls said delay time, and said second clock phase adjusting circuit can control said delay time when the phase of said external clock signal, which is an object of a phase comparison in said first clock phase adjusting circuit, conforms with the phase of said internal clock signal.

56. A semiconductor device according to claim 55, wherein each of said first and second clock phase adjusting circuit includes a first route through which said external clock signal passes and a second route for executing a phase comparison with said first route, and said second route includes a dummy circuit portion having the same delay time as the delay time generated when said second clock phase adjusting circuit is reset.

57. A semiconductor device according to claim 1, wherein, when an accuracy determined by each of a plurality of said delay elements in said first clock phase adjusting circuit is td, said second clock phase adjusting circuit can control the delay time within the range ±td, and when a result of a phase comparison by said first clock phase adjusting circuit deviates from the range ±td, said first clock phase adjusting circuit supplies a reset signal to said second clock phase adjusting circuit and set the delay time of said second clock phase adjusting circuit to a predetermined value.

58. A semiconductor device according to claim 57, wherein each of said first and second clock phase adjusting circuit includes a first route through which said external clock signal passes and a second route for executing a phase comparison with said first route, and said second route has the same delay time as the delay time generated when said second clock phase adjusting circuit is reset.

59. A semiconductor device according to claim 57, wherein said second clock phase adjusting circuit includes a delay line comprising a plurality of said delay elements, and a predetermined value set by a plurality of said delay elements in said second clock phase adjusting circuit corresponds to the center of the range of the delay time that can be controlled by said delay line.

60. A semiconductor device according to claim 1, wherein said second clock phase adjusting circuit includes first and second delay elements each having the delay time mutually different, said second delay time has a delay time larger than said first delay element, and the difference of the delay time between said first delay element and said second delay element is used as an accuracy of said second clock phase adjusting circuit.

61. A semiconductor device according to claim 1, wherein said first clock phase adjusting circuit compares the phase of the signal obtained by delaying the first clock signal obtained from said external clock signal by a first delay element with the phase of a second clock signal obtained from said internal clock signal and further compares the phase of said first clock signal with the phase of the signal obtained by delaying said second clock signal by a second delay element so that a result of a phase comparison between said external clock signal and said internal clock signal can be outputted.

62. A semiconductor device according to claim 61, wherein said first clock phase adjusting circuit includes first and second flip-flops; said first flip-flop inputs the signal obtained by delaying said first clock signal by said third delay element, and said second clock signal, to a set terminal and to a reset terminal, respectively; said second flip-flop inputs the signal obtained by delaying said second clock signal by said fourth delay element, and said first clock signal, to a set terminal and to a reset terminal, respectively; and a result of a phase comparison between said external clock signal and said internal clock signal is outputted by the combination of said first flip-flop and said second flip-flop.

63. A semiconductor device according to claim 61, wherein each of said first and second flip-flops includes first and second NAND gates, the first input of said first NAND gate is a set terminal, the second input of said first NAND gate is connected to the output of said second NAND gate and becomes a non-inversion output, the first input of said second NAND gate is a reset terminal, and the second input of said second NAND gate is connected to the output of said first NAND gate and becomes an inversion output.

64. A semiconductor device according to claim 61, wherein each of said first and second flip-flops includes first and second NAND gates, the second input of said first NAND gate is a set terminal, the first input of said first NAND gate is connected to the output of said second NAND gate and becomes a non-inversion output, the second input of said second NAND gate is a reset terminal, and the first input of said second NAND gate is connected to the output of said first NAND gate and becomes an inversion output.

65. A semiconductor device according to claim 1, wherein said second clock phase adjusting circuit includes first and second flip-flops; first and second delay elements are interposed between said first and second flip-flops; said first flip-flop inputs the first clock signal obtained from said external clock signal, and the second clock signal obtained from said internal clock signal, to a set terminal and to a reset terminal, respectively; said second flip-flop inputs the signal obtained by delaying said second clock signal by said second delay element and the signal obtained by delaying said first clock signal by said first delay element, to a set terminal and to a reset terminal, respectively; and the combination of said first and second flip-flops outputs a result of a phase comparison of said external clock signal and said internal clock signal.

66. A semiconductor device according to claim 65, wherein said first delay element comprises a first NAND gate and a first inverter, said second delay element comprises a second NAND gate and a second inverter, a third NAND gate is interposed between said first and second delay elements, and the output of said second inverter inside said second delay element is connected to the input of said first NAND gate, through said third NAND gate.

* * * * *